United States Patent
Ganier et al.

(10) Patent No.: US 12,161,044 B2
(45) Date of Patent: *Dec. 3, 2024

(54) ELECTRON TRANSPORT LAYER COMPRISING A MATRIX COMPOUND MIXTURE FOR AN ORGANIC LIGHT-EMITTING DIODE (OLED)

(71) Applicant: NOVALED GMBH, Dresden (DE)

(72) Inventors: Jerome Ganier, Dresden (DE); Carsten Rothe, Dresden (DE); Volodymyr Senkovskyy, Dresden (DE)

(73) Assignee: Novaled GmbH, Dresden (DE)

( * ) Notice: Subject to any disclaimer, the term of this patent is extended or adjusted under 35 U.S.C. 154(b) by 731 days.

This patent is subject to a terminal disclaimer.

(21) Appl. No.: 17/398,835

(22) Filed: Aug. 10, 2021

(65) Prior Publication Data
US 2021/0376259 A1 Dec. 2, 2021

Related U.S. Application Data

(62) Division of application No. 15/999,648, filed as application No. PCT/EP2017/053501 on Feb. 16, 2017, now Pat. No. 11,139,446.

(30) Foreign Application Priority Data
Feb. 19, 2016 (EP) .................................. 16156578

(51) Int. Cl.
*H10K 85/30* (2023.01)
*H10K 50/16* (2023.01)
(Continued)

(52) U.S. Cl.
CPC ........... *H10K 85/30* (2023.02); *H10K 50/165* (2023.02); *H10K 50/166* (2023.02);
(Continued)

(58) Field of Classification Search
None
See application file for complete search history.

(56) References Cited

U.S. PATENT DOCUMENTS 11,139,446 B2 * 10/2021 Ganier ................... H10K 71/00
2007/0003789 A1 1/2007 Kwong et al.
(Continued)

FOREIGN PATENT DOCUMENTS

KR 20140054330 A 5/2014
WO 2016/001283 A1 1/2016

OTHER PUBLICATIONS

Lee, Jiun-Haw, et al. "High efficiency and long lifetime OLED based on a metal-doped electron transport layer." Chemical physics letters 416.4-6 (2005): 234-237. (Year: 2005).*
(Continued)

*Primary Examiner* — Dawn L Garrett
(74) *Attorney, Agent, or Firm* — Eversheds Sutherland (US) LLP

(57) ABSTRACT

The present invention is directed to an organic light emitting diode (100) comprising:
- at least one anode electrode (120);
- at least one emission layer (150), wherein the emission layer comprises at least one emitter dopant that emits visible light at operation of the OLED (100);
- an electron transport layer stack (160) of at least two electron transport layers (161/162), and wherein
  a) the first electron transport layer (161) comprises i) a first organic aromatic matrix compound having a MW of about ≥400 to about ≤1000 and a dipole moment of about ≥0 Debye and about ≤2.5 Debye, wherein the first electron transport layer (161) is free of a polar organic aromatic phosphine compound; and (Continued)

b) the second electron transport layer (162) comprises two organic aromatic matrix compounds, which are a mixture of:
  i) the first organic aromatic matrix compound; and
  ii) a polar organic aromatic phosphine compound having a MW of about $\geq 400$ to about $\leq 1000$, and a dipole moment of about $>2.5$ Debye and about $\leq 10$ Debye; and at least one cathode electrode layer (190); wherein the electron transport layer stack (160) is arranged between the emission layer (150) and the cathode electrode layer (190), the first electron transport layer (161) is in direct contact with the second electron transport layer (162), and wherein the first electron transport layer (161) is arranged nearer to the emission layer (150) and the second electron transport layer (162) is arranged nearer to the cathode electrode layer (190).

20 Claims, 4 Drawing Sheets

(51) Int. Cl.
  *H10K 50/165* (2023.01)
  *H10K 50/17* (2023.01)
  *H10K 71/00* (2023.01)
  *H10K 71/12* (2023.01)
  *H10K 71/16* (2023.01)
  *H10K 85/60* (2023.01)
  *H10K 102/00* (2023.01)

(52) U.S. Cl.
  CPC .......... *H10K 50/171* (2023.02); *H10K 71/00* (2023.02); *H10K 71/12* (2023.02); *H10K 71/164* (2023.02); *H10K 85/322* (2023.02); *H10K 85/622* (2023.02); *H10K 85/626* (2023.02); *H10K 85/6572* (2023.02); *H10K 85/6574* (2023.02); *H10K 85/657* (2023.02); *H10K 2102/00* (2023.02)

(56) References Cited

U.S. PATENT DOCUMENTS

| | | |
|---|---|---|
| 2011/0278558 A1 | 11/2011 | Hamada |
| 2014/0197401 A1 | 7/2014 | Kroeber et al. |
| 2018/0175302 A1 | 6/2018 | Jang et al. |

OTHER PUBLICATIONS

PCT International Search Report and Written Opinion for PCT Application No. PCT/EP2017/053501 mailed Mar. 21, 2017 (8 pages).

\* cited by examiner

ELECTRON TRANSPORT LAYER COMPRISING A MATRIX COMPOUND MIXTURE FOR AN ORGANIC LIGHT-EMITTING DIODE (OLED)

CROSS REFERENCE TO RELATED APPLICATION

This application is a divisional of U.S. application Ser. No. 15/999,648, filed Aug. 20, 2018, which is a U.S. national stage application of PCT/EP2017/053501, filed Feb. 16, 2017, which claims priority to European Application No. 16156578.3, filed Feb. 19, 2016. The contents of these applications are hereby incorporated by reference.

DESCRIPTION

The present invention relates to an organic light-emitting diode (OLED) comprising an electron transport layer stack having an electron transport layer containing a matrix compound mixture, and a method of manufacturing the organic light-emitting diode (OLED) comprising the electron transport layer stack.

DESCRIPTION OF THE RELATED ART

Organic light-emitting diodes (OLEDs), which are self-emitting devices, have a wide viewing angle, excellent contrast, quick response, high brightness, excellent driving voltage characteristics, and color reproduction. A typical OLED includes an anode electrode a hole injection layer (HIL), a hole transport layer (HTL), an emission layer (EML), an electron transport layer (ETL), and a cathode electrode, which are sequentially stacked on a substrate. In this regard, the HIL, the HTL, the EML, and the ETL are thin films formed from organic compounds.

When a voltage is applied to the anode electrode and the cathode electrode, holes injected from the anode electrode move to the EML, via the HIL and HTL, and electrons injected from the cathode electrode move to the EML, via the ETL. The holes and electrons recombine in the EML to generate excitons.

WO 2016/001283 A1 refers to an organic light-emitting diode (OLED) comprising an emission layer and an electron transport layer stack of at least two electron transport layers, wherein a first electron transport layer and a second electron transport layer comprises at least one matrix compound and in addition, the first electron transport layer comprises a first lithium halide or a first lithium organic complex; and the second electron transport layer comprises a second lithium halide or a second lithium organic complex, wherein the first lithium organic complex is not the same as the second lithium organic complex, and wherein the first lithium halide is not the same as the second lithium halide.

KR 2015 0115688 A refers to an organic light-emitting diode (OLED) comprising a first electron transport layer provided between the cathode and the light-emitting layer; and a second electron transport layer provided between the cathode and the first electron transport layer, wherein the second electron transport layer comprises a host material, and one or more n-type dopants selected from alkali metals and alkaline earth metals.

It is still desired to improve the external quantum efficiency (EQE), to reduce operating voltage, improving lifetime of the OLED and/or to increase the takt time of the OLED manufacturing process.

SUMMARY

One aspect of the present invention is to provide OLEDs with improved external quantum efficiency (EQE) and/or lower operating voltage and/or improved lifetime and/or increased takt time, for top and/or bottom emission organic light-emitting diodes (OLED).

The invention relates to an organic light emitting diode comprising:
at least one anode electrode;
at least one emission layer, wherein the emission layer comprises at least one emitter dopant that emits visible light at operation of the OLED;
an electron transport layer stack of at least two electron transport layers, and wherein
a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of a polar organic aromatic phosphine compound; and
b) the second electron transport layer comprises two organic aromatic matrix compounds, which are a mixture of:
i) the first organic aromatic matrix compound; and
ii) a polar organic aromatic phosphine compound having a MW of about ≥400 to about ≤1000, and a dipole moment of about >2.5 Debye and about ≤10 Debye, preferably of about ≥3 and ≤5 Debye; and
at least one cathode electrode layer; wherein
the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer.

The invention relates further to an organic light-emitting diode (OLED) comprising a substrate, an anode electrode, a hole injection layer, a hole transport layer, optional an electron blocking layer, an emission layer, optional a hole blocking layer, an electron transport layer stack comprising a first electron transport layer and a second electron transport layer, optional an electron injection layer, and a cathode electrode layer, wherein the layers are arranged in that order.

The invention relates further to a method of manufacturing the OLED.

Definitions

The term "OLED", "organic light emitting diode" and "organic light-emitting diode" are simultaneously used and have the same meaning.

The term "electron transport layer stack", also named ETL-stack, means at least two electron transport layers (ETL) which arranged in direct contact, for example of first and second electrode layer arranged in direct contact. The "electron transport layer stack" may comprise at least two electron transport layers, at least three electron transport layers or at least four electron transport layers.

The term "the first organic aromatic matrix compound" is synonymously used for "i) a first organic aromatic matrix compound having a MW of about ≥400 to about ≤1000 and a dipole moment of about ≥0 Debye and about ≤2.5 Debye".

The term "the polar organic aromatic phosphine compound" is synonymously used for "ii) a polar organic aromatic phosphine compound having a MW of about ≥400 to about ≤1000, and a dipole moment of about >2.5 Debye and about ≤10 Debye".

As used herein, "emitter dopant" means a compound which emits visible light at operation of the OLED. In the context of the present invention "visible light" means light with a wavelength of about ≥380 nm to about ≤780 nm.

In the context of the present specification the term "non-emitter dopant" as used in connection with an electron transport layer (ETL) or electron transport layer stack means a dopant, which does not contribute to the emission spectrum of the device at operation of the OLED. In other words, the non-emitter dopant is essentially non-emissive in the visible region of the electromagnetic spectrum, which are wavelengths of about ≥380 nm to about ≤780 nm.

In the context of the present specification the term "essentially non-emissive" means that the contribution of the non-emitter dopant to the emission spectrum at operation of the OLED is less than 10%, preferably less than 5% relative to the emission spectrum.

In the context of the present specification the term "at operation of the OLED" means that a voltage of 2 to 10 V is applied. The OLED that can be used is an OLED according to the invention, for example an OLED according to the invention of Table 7.

As used herein, "weight percent", "wt.-%", "percent by weight", "% by weight", and variations thereof refer to a composition, component, substance or agent as the weight of that composition, component, substance or agent of the respective electron transport layer divided by the total weight of the composition thereof and multiplied by 100. It is understood that the total weight percent amount of all components, substances or agents of the respective electron transport layer are selected such that it does not exceed 100 wt.-%.

As used herein, "volume percent", "vol.-%", "percent by volume", "% by volume", and variations thereof refer to an elemental metal, a composition, component, substance or agent as the volume of that elemental metal, component, substance or agent of the respective electron transport layer divided by the total volume of the respective electron transport layer thereof and multiplied by 100. It is understood that the total volume percent amount of all elemental metal, components, substances or agents of the respective cathode electrode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not, modified by the term "about", the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities which may be present in the compounds prior to deposition or in the layers after deposition. Impurities have no technical effect with respect to the object achieved by the present invention.

The term "phosphine compound" or "polar organic aromatic phosphine compound" means and includes compounds selected from the group of organic phosphine oxide compound, organic thioxophosphine compound or organic selenoxophosphine compound.

The term "phosphine compound" as used in the specification and claims comprises compounds according to formula Ia including phosphole and phosphepine.

The term "alkyl" refers to straight-chain, branched or cyclic alkyl groups.

The alkyl groups can be selected from the group comprising methyl, ethyl and the isomers of propyl, butyl or pentyl, such as isopropyl, isobutyl, tert.-butyl, sec.-butyl, isopentyl and/or cyclo-hexyl.

The term "alkane-di-yl" as used herein refers to a straight-chain, branched or cyclic alkane-di-yl group. The alkane-di-yl group is a saturated group which is bonded to two phosphorus atoms.

The term "alkene-di-yl" as used herein refers to a group comprising single and double carbon-carbon bonds. Preferably, double bonds and single bonds alternate to form a five, six or seven membered ring with a phosphorus atom.

The term "aryl" refers to aromatic groups. The term "aryl" as used herewith shall encompass phenyl (C6-aryl), fused aromatics, such as naphthalene, anthracene, phenanthrene, tetracene etc. Further encompassed are bi-phenyl and oligo- or polyphenyls, such as terphenyl etc. Further encompassed shall be any further aromatic hydrocarbon substituents, such as fluorenyl etc.

The term "arylene" refers to aromatic groups. The term "arylene" as used herewith shall encompass phenylene (C6-arylene), fused aromatics, such as naphthalene-di-yl, anthracene-di-yl, phenanthrene-di-yl, tetracene-di-yl, binaphthyl-ene-di-yl etc. Further encompassed are bi-phenylene and oligo- or polyphenylenes, such as terphenylene etc. Further encompassed shall be any further aromatic groups, such as fluorene-di-yl etc.

The term "heteroarylene" refers to aromatic heterocycles. The term "heteroarylene" as used herewith shall encompass pyridine-di-yl, quinolone-di-yl, carbazol-di-yl, xanthene-di-yl, phenoxazine-di-yl etc.

Herein, when a first element is referred to as being formed or disposed "on" a second element, the first element can be disposed directly on the second element or one or more other elements may be disposed there between. When a first element is referred to as being formed or disposed "directly on" a second element, no other elements are disposed there between.

The term "contacting sandwiched" refers to an arrangement of three layers whereby the layer in the middle is in direct contact with the two adjacent layers.

The anode electrode may be described as anode electrode or anode electrode layer.

The cathode electrode may be described as cathode electrode or cathode electrode layer.

The composition and/or components of the electron injection layers differ from the electron transport layer stack.

The electron transport layer stack is not a cathode electrode, as they differ in their composition.

The cathode electrode of the OLED according to the invention may not comprise a polar organic aromatic phosphine compound or organic aromatic matrix compound.

The cathode electrode of the OLED according to the invention may not comprise or consist of an organic compound.

In a preferred embodiment, the cathode electrode layer may be free of organic compounds, organic metal complexes and metal halides.

The electron transport layer stack, the electron injection layer/s and cathode electrode layer/s may differ each in their composition.

The electron injection layer/s and cathode electrode layer/s may differ each in their composition.

The operating voltage, also named U, is measured in Volt (V) at 10 milliAmpere per square centimetre (mA/cm$^2$) in bottom emission devices and at 15 mA/cm$^2$ in top emission devices.

The external quantum efficiency, also named EQE, is measured in percent (%).

The color space is described by coordinates CIE-x and CIE-y (International Commission on Illumination 1931). For blue emission the CIE-y is of particular importance. A smaller CIE-y denotes a deeper blue color.

The highest occupied molecular orbital, also named HOMO, and lowest unoccupied molecular orbital, also named LUMO, are measured in electron volt (eV). The HOMO and LUMO are measured with cyclic voltammetry in solution.

The dipole moment is determined through quantum-chemical calculations and measured in Debye (D).

The triplet level $T_1$ is determined through quantum-chemical calculations and measured in electron volt (eV).

The term "MW" means molar mass and is measured in gramm per mol (g/mol).

If not other way stated the Relative humidity (abbreviated RH) is 40% and the temperature is 23° C.

Other Embodiments

According to an aspect of the present invention, there is provided an organic light emitting diode (OLED) comprising:
at least one anode electrode;
at least one emission layer, wherein the emission layer comprises at least one emitter dopant that emits visible light at operation of the OLED;
an electron transport layer stack of at least two electron transport layers, and wherein
  a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of a polar organic aromatic phosphine compound; and
  b) the second electron transport layer comprises two organic aromatic matrix compounds, which are a mixture of:
    i) the first organic aromatic matrix compound; and
    ii) a polar organic aromatic phosphine compound having a MW of about ≥400 to about ≤1000, and a dipole moment of about >2.5 Debye and about ≤10 Debye; and
at least one cathode electrode layer; wherein
  the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer; and wherein the second electron transport layer comprises:
  ≥50 wt.-% to ≤95 wt.-%, preferably ≥60 wt.-% to ≤90 wt.-%, and more preferred ≥70 wt.-% to ≤90 wt.-%, and most preferred about 80 wt.-%. of i) the first organic aromatic matrix compound; and
  ≥5 wt.-% to ≤50 wt.-%, preferably ≥10 wt.-% to ≤40 wt.-%, and more preferred ≥10 wt.-% to ≤30 wt.-%, and most preferred about 20 wt.-%, of ii) the polar organic aromatic phosphine compound;
wherein the wt.-% is based on the total weight of i) and ii) of the second electron transport layer.

According to another aspect of the present invention, there is provided an organic light emitting diode (OLED) comprising:
at least one anode electrode;
at least one emission layer, wherein the emission layer comprises at least one emitter dopant that emits visible light at operation of the OLED;
an electron transport layer stack of at least two electron transport layers, and wherein
  a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of a polar organic aromatic phosphine compound; and
  b) the second electron transport layer comprises two organic aromatic matrix compounds, which are a mixture of:
    i) the first organic aromatic matrix compound; and
    ii) a polar organic aromatic phosphine compound having a MW of about ≥400 to about ≤1000, and a dipole moment of about >2.5 Debye and about ≤10 Debye; and
at least one cathode electrode layer; wherein
  the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer; and wherein the second electron transport layer comprises at least one non-emitter dopant and comprises:
  ≥50 wt.-% to ≤95 wt.-%, preferably ≥60 wt.-% to ≤90 wt.-%, and more preferred ≥70 wt.-% to ≤90 wt.-%, and most preferred about 80 wt.-%. of i) the first organic aromatic matrix compound; and
  ≥5 wt.-% to ≤50 wt.-%, preferably ≥10 wt.-% to ≤40 wt.-%, and more preferred ≥10 wt.-% to ≤30 wt.-%, and most preferred about 20 wt.-%, of ii) the polar organic aromatic phosphine compound;
wherein the wt.-% is based on the total weight of i) and ii) of the second electron transport layer.

According to another aspect of the present invention, there is provided an organic light emitting diode (OLED) comprising:
at least one anode electrode;
at least one emission layer, wherein the emission layer comprises at least one emitter dopant that emits visible light at operation of the OLED;
an electron transport layer stack of at least two electron transport layers, and wherein
  a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of a polar organic aromatic phosphine compound; and b) the second electron transport layer comprises two organic aromatic matrix compounds, which are a mixture of:
i) the first organic aromatic matrix compound; and
ii) a polar organic aromatic phosphine compound having a MW of about ≥400 to about ≤1000, and a dipole moment of about >2.5 Debye and about ≤10 Debye; and
at least one cathode electrode layer; wherein
the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer; and wherein the second electron transport layer comprises at least one non-emitter dopant, wherein the non-emitter dopant is a metal compound, preferably the metal compound is selected from the group comprising a metal halide, a metal organic complex and/or a zero-valent metal; and more preferred the metal organic complex has the formula VII:

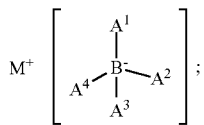

(VII)

wherein M is an alkali metal ion, each of $A^1$-$A^4$ is independently selected from substituted or unsubstituted $C_6$-$C_{20}$ aryl or substituted or unsubstituted $C_2$-$C_{20}$ heteroaryl, even more preferred M is lithium ion, and most preferred lithium tetra(1H-pyrazol-1-yl)borate; and the second electron transport layer comprises:
≥50 wt.-% to ≤95 wt.-%, preferably ≥60 wt.-% to ≤90 wt.-%, and more preferred ≥70 wt.-% to ≤90 wt.-%, and most preferred about 80 wt.-%. of i) the first organic aromatic matrix compound; and
≥5 wt.-% to ≤50 wt.-%, preferably ≥10 wt.-% to ≤40 wt.-%, and more preferred ≥10 wt.-% to ≤30 wt.-%, and most preferred about 20 wt.-%, of ii) the polar organic aromatic phosphine compound;
wherein the wt.-% is based on the total weight of i) and ii) of the second electron transport layer.

According to another aspect of the present invention the first electron transport layer can be free of a non-emitter dopant.

According to another aspect of the present invention the second electron transport layer may comprises in addition a non-emitter dopant.

According to another aspect of the present invention the non-emitter dopant is a metal compound, preferably the metal compound is selected from the group comprising a metal halide, a metal organic complex and/or a zero-valent metal.

According to another aspect of the present invention the non-emitter dopant is selected from the group comprising a metal halide, a metal organic complex and/or a zero-valent metal.

According to another aspect of the present invention the non-emitter dopant is a zero-valent metal.

According to another aspect of the present invention the second electron transport layer may comprises in addition a non-emitter dopant that is a zero-valent metal.

According to another aspect of the present invention, there is provided an organic light emitting diode (OLED) comprising:
at least one anode electrode;
at least one emission layer, wherein the emission layer comprises at least one emitter dopant that emits visible light at operation of the OLED;
an electron transport layer stack of at least two electron transport layers, and wherein
a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of a polar organic aromatic phosphine compound; and
b) the second electron transport layer comprises two organic aromatic matrix compounds, which are a mixture of:
i) the first organic aromatic matrix compound; and
ii) a polar organic aromatic phosphine compound having a MW of about ≥400 to about ≤1000, and a dipole moment of about >2.5 Debye and about ≤10 Debye; and
at least one cathode electrode layer; wherein
the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer; and wherein the first electron transport layer comprises ≥90 wt.-% to ≤100 wt.-%, preferably ≥95 wt.-% to ≤98 wt.-%, of the first organic aromatic matrix compound.

According to another aspect of the present invention, there is provided an organic light emitting diode (OLED) comprising:
at least one anode electrode;
at least one emission layer, wherein the emission layer comprises at least one emitter dopant that emits visible light at operation of the OLED;
an electron transport layer stack of at least two electron transport layers, and wherein
a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of a polar organic aromatic phosphine compound; and
b) the second electron transport layer comprises two organic aromatic matrix compounds, which are a mixture of:
i) the first organic aromatic matrix compound; and
ii) a polar organic aromatic phosphine compound having a MW of about ≥400 to about ≤1000, and a dipole moment of about >2.5 Debye and about ≤10 Debye; and
at least one cathode electrode layer; wherein
the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer; and wherein the first electron transport layer comprises a non-emitter dopant and comprises ≥90 wt.-% to ≤100 wt.-%, preferably ≥95 wt.-% to ≤98 wt.-%, of the first organic aromatic matrix compound.

According to another aspect of the present invention, there is provided an organic light emitting diode (OLED) comprising:
at least one anode electrode;
at least one emission layer, wherein the emission layer comprises at least one emitter dopant that emits visible light at operation of the OLED;
an electron transport layer stack of at least two electron transport layers, and wherein
a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of a polar organic aromatic phosphine compound; and
b) the second electron transport layer comprises two organic aromatic matrix compounds, which are a mixture of:
i) the first organic aromatic matrix compound; and
ii) a polar organic aromatic phosphine compound having a MW of about ≥400 to about ≤1000, and a dipole moment of about >2.5 Debye and about ≤10 Debye; and
at least one cathode electrode layer; wherein
the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer; and wherein the first electron transport layer comprises ≥90 wt.-% to ≤100 wt.-%, preferably ≥95 wt.-% to ≤98 wt.-%, of the first organic aromatic matrix compound; and the second electron transport layer comprises:
≥50 wt.-% to ≤95 wt.-%, preferably ≥60 wt.-% to ≤90 wt.-%, and more preferred ≥70 wt.-% to ≤90 wt.-%, and most preferred about 80 wt.-%. of i) the first organic aromatic matrix compound; and
≥5 wt.-% to ≤50 wt.-%, preferably ≥10 wt.-% to ≤40 wt.-%, and more preferred ≥10 wt.-% to ≤30 wt.-%, and most preferred about 20 wt.-%, of ii) the polar organic aromatic phosphine compound; wherein the wt.-% is based on the total weight of i) and ii) of the second electron transport layer.

According to another aspect of the present invention, there is provided an organic light emitting diode (OLED) comprising:
at least one anode electrode;
at least one emission layer, wherein the emission layer comprises at least one emitter dopant that emits visible light at operation of the OLED;
an electron transport layer stack of at least two electron transport layers, and wherein
a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of a polar organic aromatic phosphine compound; and
b) the second electron transport layer comprises two organic aromatic matrix compounds, which are a mixture of:
i) the first organic aromatic matrix compound; and
ii) a polar organic aromatic phosphine compound having a MW of about ≥400 to about ≤1000, and a dipole moment of about >2.5 Debye and about ≤10 Debye; and
at least one cathode electrode layer; wherein
the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer; and wherein the first electron transport layer comprises a non-emitter dopant and comprises ≥90 wt.-% to ≤100 wt.-%, preferably ≥95 wt.-% to ≤98 wt.-%, of the first organic aromatic matrix compound; and the second electron transport layer comprises a non-emitter dopant and comprises:
≥50 wt.-% to ≤95 wt.-%, preferably ≥60 wt.-% to ≤90 wt.-%, and more preferred ≥70 wt.-% to ≤90 wt.-%, and most preferred about 80 wt.-%. of i) the first organic aromatic matrix compound; and
≥5 wt.-% to ≤50 wt.-%, preferably ≥10 wt.-% to ≤40 wt.-%, and more preferred ≥10 wt.-% to ≤30 wt.-%, and most preferred about 20 wt.-%, of ii) the polar organic aromatic phosphine compound;
wherein the wt.-% is based on the total weight of i) and ii) of the second electron transport layer.

According to an aspect of the present invention, there is provided an organic light emitting diode (OLED) comprising:
at least one anode electrode;
at least one emission layer, wherein the emission layer comprises at least one emitter dopant that emits visible light at operation of the OLED;
an electron transport layer stack of at least two electron transport layers, and wherein
a) the first electron transport layer consist of i) a first organic aromatic matrix compound having a MW of about ≥400 to about ≤1000 and a dipole moment of about ≥0 Debye and about ≤2.5 Debye, wherein the first electron transport layer is free of a polar organic aromatic phosphine compound; and
b) the second electron transport layer comprises two organic aromatic matrix compounds, which are a mixture of:
i) the first organic aromatic matrix compound; and
ii) a polar organic aromatic phosphine compound having a MW of about ≥400 to about ≤1000, and a dipole moment of about >2.5 Debye and about ≤10 Debye; and
at least one cathode electrode layer; wherein
the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer.

According to another aspect of the present invention, there is provided an organic light emitting diode (OLED) comprising:
- at least one anode electrode;
- at least one emission layer, wherein the emission layer comprises at least one emitter dopant that emits visible light at operation of the OLED;
- an electron transport layer stack of at least two electron transport layers, wherein the electron transport layer stack is free of an emitter dopant which emits visible light at operation of the OLED, and wherein
  - a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of a polar organic aromatic phosphine compound; and
  - b) the second electron transport layer comprises two organic aromatic matrix compounds, which are a mixture of:
    - i) the first organic aromatic matrix compound; and
    - ii) a polar organic aromatic phosphine compound having a MW of about ≥400 to about ≤1000, and a dipole moment of about >2.5 Debye and about ≤10 Debye; and
- at least one cathode electrode layer; wherein the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer.

According to another aspect of the present invention, there is provided an organic light emitting diode (OLED) comprising:
- at least one anode electrode;
- at least one emission layer, wherein the emission layer comprises at least one emitter dopant that emits visible light at operation of the OLED;
- an electron transport layer stack of at least two electron transport layers, wherein the electron transport layer stack is free of an emitter dopant which emits visible light at operation of the OLED, and wherein the first electron transport layer is free of a non-emitter dopant and the second electron transport layer comprises a non-emitter dopant, and wherein
  - a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of a polar organic aromatic phosphine compound; and
  - b) the second electron transport layer comprises two organic aromatic matrix compounds, which are a mixture of:
    - i) the first organic aromatic matrix compound; and
    - ii) a polar organic aromatic phosphine compound having a MW of about ≥400 to about ≤1000, and a dipole moment of about >2.5 Debye and about ≤10 Debye; and
- at least one cathode electrode layer; wherein the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer.

According to another aspect of the present invention, there is provided an organic light emitting diode (OLED) comprising:
- at least one anode electrode;
- at least one emission layer, wherein the emission layer comprises at least one emitter dopant that emits visible light at operation of the OLED;
- an electron transport layer stack of at least two electron transport layers, wherein the electron transport layer stack is free of an emitter dopant which emits visible light at operation of the OLED, and wherein
  - a) the first electron transport layer consist of first organic aromatic matrix compound having a MW of about ≥400 to about ≤1000 i) a and a dipole moment of about ≥0 Debye and about ≤2.5 Debye, wherein the first electron transport layer is free of a polar organic aromatic phosphine compound; and
  - b) the second electron transport layer comprises a non-emitter dopant and two organic aromatic matrix compounds, which are a mixture of:
    - i) the first organic aromatic matrix compound; and
    - ii) a polar organic aromatic phosphine compound having a MW of about ≥400 to about ≤1000, and a dipole moment of about >2.5 Debye and about ≤10 Debye; and
- at least one cathode electrode layer; wherein the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer.

According to another aspect of the present invention, there is provided an organic light emitting diode (OLED) comprising:
- at least one anode electrode;
- at least one emission layer, wherein the emission layer comprises at least one emitter dopant that emits visible light at operation of the OLED;
- an electron transport layer stack of at least two electron transport layers, wherein the electron transport layer stack is free of an emitter dopant which emits visible light at operation of the OLED, and wherein
  - a) the first electron transport layer consist of i) a first organic aromatic matrix compound having a MW of about ≥400 to about ≤1000 and a dipole moment of about ≥0 Debye and about ≤2.5 Debye, wherein the first electron transport layer is free of a polar organic aromatic phosphine compound; and
  - b) the second electron transport layer consist of a non-emitter dopant and two organic aromatic matrix compounds, which are a mixture of:
    - i) the first organic aromatic matrix compound; and
    - ii) a polar organic aromatic phosphine compound having a MW of about ≥400 to about ≤1000, and a dipole moment of about >2.5 Debye and about ≤10 Debye; and
- at least one cathode electrode layer; wherein the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer.

According to another aspect of the present invention, there is provided an organic light emitting diode (OLED) comprising:
- at least one anode electrode;
- at least one emission layer, wherein the emission layer comprises at least one emitter dopant that emits visible light at operation of the OLED;
- an electron transport layer stack of at least two electron transport layers, and wherein
  a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of:
     a polar organic aromatic phosphine compound, aryl compound with a triplet level ≥2.9 eV, phenyltriazole, benzimidazole, phenanthroline, oxadiazole, benzooxazole, oxazole, quinazoline, benzo[h]quinazoline, pyrido[3,2-h]quinazoline, pyrimido[4,5-f] quinazoline, quinoline, benzoquinoline, pyrrolo[2,1-a]isoquinolin and benzofuro[2,3-d]pyridazine;
  b) the second electron transport layer comprises two organic aromatic matrix compounds, which are a mixture of:
     i) the first organic aromatic matrix compound; and
     ii) a polar organic aromatic phosphine compound having a MW of about ≥400 to about ≤1000, and a dipole moment of about >2.5 Debye and about ≤10 Debye; and
- at least one cathode electrode layer; wherein
the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer.

The invention relates further to an organic light-emitting diode (OLED) comprising a substrate, an anode electrode, a hole injection layer, a hole transport layer, optional an electron blocking layer, an emission layer, optional a hole blocking layer, an electron transport layer stack comprising a first electron transport layer and a second electron transport layer, optional an electron injection layer, and a cathode electrode layer, wherein the layers are arranged in that order.

According to another aspect of the present invention, there is provided an organic light emitting diode (OLED) comprising:
- at least one anode electrode;
- at least one emission layer, wherein the emission layer comprises at least one emitter dopant that emits visible light at operation of the OLED;
- an electron transport layer stack of at least two electron transport layers, wherein the electron transport layer stack is free of an emitter dopant which emits visible light at operation of the OLED, and wherein
  a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of:
     a polar organic aromatic phosphine compound, aryl compound with a triplet level ≥2.9 eV, phenyltriazole, benzimidazole, phenanthroline, oxadiazole, benzooxazole, oxazole, quinazoline, benzo[h]quinazoline, pyrido[3,2-h]quinazoline, pyrimido[4,5-f]quinazoline, quinoline, benzoquinoline, pyrrolo[2,1-a]isoquinolin and benzofuro[2,3-d]pyridazine; and
  b) the second electron transport layer comprises two organic aromatic matrix compounds, which are a mixture of:
     i) the first organic aromatic matrix compound; and
     ii) a polar organic aromatic phosphine compound having a MW of about ≥400 to about ≤1000, and a dipole moment of about >2.5 Debye and about ≤10 Debye; and
- at least one cathode electrode layer; wherein
the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer.

According to another aspect of the present invention, there is provided an organic light emitting diode (OLED) comprising:
- at least one anode electrode;
- at least one emission layer, wherein the emission layer comprises at least one emitter dopant that emits visible light at operation of the OLED;
- an electron transport layer stack of at least two electron transport layers, wherein the electron transport layer stack is free of an emitter dopant which emits visible light at operation of the OLED, and wherein the first electron transport layer is free of a non-emitter dopant and the second electron transport layer (162) comprises a non-emitter dopant, and wherein
  a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of:
     a polar organic aromatic phosphine compound, aryl compound with a triplet level ≥2.9 eV, phenyltriazole, benzimidazole, phenanthroline, oxadiazole, benzooxazole, oxazole, quinazoline, benzo[h]quinazoline, pyrido[3,2-h]quinazoline, pyrimido[4,5-f]quinazoline, quinoline, benzoquinoline, pyrrolo[2,1-a]isoquinolin and benzofuro[2,3-d]pyridazine; and
  b) the second electron transport layer comprises two organic aromatic matrix compounds, which are a mixture of:
     i) the first organic aromatic matrix compound; and
     ii) a polar organic aromatic phosphine compound having a MW of about ≥400 to about ≤1000, and a dipole moment of about >2.5 Debye and about ≤10 Debye; and
- at least one cathode electrode layer; wherein
the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer.

According to another aspect of the present invention, there is provided an organic light emitting diode (OLED) comprising:
- at least one anode electrode;
- at least one emission layer, wherein the emission layer comprises at least one emitter dopant that emits visible light at operation of the OLED;
- an electron transport layer stack of at least two electron transport layers, wherein the electron transport layer stack is free of an emitter dopant which emits visible light at operation of the OLED, and wherein the first electron transport layer is free of a non-emitter dopant and the second electron transport layer (162) comprises a non-emitter dopant, and wherein
  - a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of:
    - a polar organic aromatic phosphine compound, aryl compound compounds with a triplet level ≥2.9 eV, phenyltriazole, benzimidazole, phenanthroline, oxadiazole, benzooxazole, oxazole, quinazoline, benzo[h]quinazoline, pyrido[3,2-h]quinazoline, pyrimido[4,5-f]quinazoline, quinoline, benzoquinoline, pyrrolo[2,1-a]isoquinolin and benzofuro[2,3-d]pyridazine; and
  - b) the second electron transport layer comprises two organic aromatic matrix compounds, which are a mixture of:
    - i) the first organic aromatic matrix compound; and
    - ii) a polar organic aromatic phosphine compound having a MW of about ≥400 to about ≤1000, and a dipole moment of about >2.5 Debye and about ≤10 Debye; and
- at least one cathode electrode layer; wherein the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer; and wherein the second electron transport layer comprises:
  - ≥50 wt.-% to ≤95 wt.-%, preferably ≥60 wt.-% to ≤90 wt.-%, and more preferred ≥70 wt.-% to ≤90 wt.-%, and most preferred about 80 wt.-%. of i) the first organic aromatic matrix compound; and
  - ≥5 wt.-% to ≤50 wt.-%, preferably ≥10 wt.-% to ≤40 wt.-%, and more preferred ≥10 wt.-% to ≤30 wt.-%, and most preferred about 20 wt.-%, of ii) the polar organic aromatic phosphine compound;
  - wherein the wt.-% is based on the total weight of i) and ii) of the second electron transport layer.

According to another aspect of the present invention, there is provided an organic light emitting diode (OLED) comprising:
- at least one anode electrode;
- at least one emission layer, wherein the emission layer comprises at least one emitter dopant that emits visible light at operation of the OLED;
- an electron transport layer stack of at least two electron transport layers, wherein the electron transport layer stack is free of an emitter dopant which emits visible light at operation of the OLED, and wherein the first electron transport layer is free of a non-emitter dopant and the second electron transport layer (162) comprises a non-emitter dopant, and wherein
  - a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of:
    - a polar organic aromatic phosphine compound, aryl compound compounds with a triplet level ≥2.9 eV, phenyltriazole, benzimidazole, phenanthroline, oxadiazole, benzooxazole, oxazole, quinazoline, benzo[h]quinazoline, pyrido[3,2-h]quinazoline, pyrimido[4,5-f]quinazoline, quinoline, benzoquinoline, pyrrolo[2,1-a]isoquinolin and benzofuro[2,3-d]pyridazine; and
  - b) the second electron transport layer comprises two organic aromatic matrix compounds, which are a mixture of:
    - i) the first organic aromatic matrix compound; and
    - ii) a polar organic aromatic phosphine compound having a MW of about ≥400 to about ≤1000, and a dipole moment of about >2.5 Debye and about ≤10 Debye; and
- at least one cathode electrode layer; wherein the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer; and wherein the second electron transport layer comprises a non-emitter dopant and comprises:
  - ≥50 wt.-% to ≤95 wt.-%, preferably ≥60 wt.-% to ≤90 wt.-%, and more preferred ≥70 wt.-% to ≤90 wt.-%, and most preferred about 80 wt.-%. of i) the first organic aromatic matrix compound; and
  - ≥5 wt.-% to ≤50 wt.-%, preferably ≥10 wt.-% to ≤40 wt.-%, and more preferred ≥10 wt.-% to ≤30 wt.-%, and most preferred about 20 wt.-%, of ii) the polar organic aromatic phosphine compound;
  - wherein the wt.-% is based on the total weight of i) and ii) of the second electron transport layer.

Electron Transport Layer Stack

The electron transport layer stack according to the invention, comprises at least two electron transport layers, wherein
- a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of a polar organic aromatic phosphine compound; and
- b) the second electron transport layer comprises two organic aromatic matrix compounds, which are a mixture of:
  - i) the first organic aromatic matrix compound; and
  - ii) a polar organic aromatic phosphine compound having a MW of about ≥400 to about ≤1000, and a dipole moment of about >2.5 Debye and about ≤10 Debye.

According to another aspect the second electron transport layer may comprises i) the first organic aromatic matrix compound and ii) a polar organic aromatic phosphine compound having a MW of about ≥400 to about ≤1000, and a dipole moment of about >2.5 Debye and about ≤10 Debye, preferably of about ≥3 and ≤5 Debye, even more preferred ≥2.5 and less than ≤4 Debye.

The use of a first organic aromatic matrix compound and a polar organic aromatic phosphine compound having a MW of about ≥400 to about ≤1000 offers the benefit of good control of the deposition rate during vacuum thermal evaporation and high reproducibility in manufacturing processes. If the MW is less than 400, the deposition rate cannot be controlled as the evaporation rate is too high. If the MW is above 1000, the deposition rate cannot be controlled as the evaporation rate is too low.

If the first organic aromatic matrix compound has a dipole moment of ≥0 and ≤2.5 Debye, very efficient electron transport is achieved and the OLED can be operated at very low operating voltages and/or high external quantum efficiency EQE and/or very long lifetime are obtained.

The use of a polar organic aromatic phosphine compound having a dipole moment of about >2.5 Debye and about ≤10 Debye, offers the benefit of efficient electron injection from the cathode and/or electron injection layer and efficient electron transport into the first electron transport layer.

Another advantage of the electron transport layer stack according to the present invention is that injection and transport of electrons may be balanced and holes may be efficiently blocked. In a conventional OLED, since the amounts of electrons and holes vary with time, after driving is initiated, the number of excitons generated in an emission area may be reduced. As a result, a carrier balance may not be maintained, so as to reduce the lifetime of the OLED.

In a preferred embodiment, the triplet level T1 of the first organic aromatic matrix compound is selected lower than the triplet level T1 of the polar organic aromatic phosphine compound, preferably T1 of the first organic matrix compound is at least 0.1 eV lower, more preferably at least 0.2 eV lower than the triplet level T1 of the polar organic aromatic phosphine compound.

According to various aspects, the reduction potential of the first organic matrix compound is less negative than the reduction potential of the polar organic aromatic phosphine compound.

According to various aspects, the LUMO of the first organic matrix compound is more negative than the LUMO of the polar organic aromatic phosphine compound.

If the organic aromatic matrix compound and the polar organic aromatic phosphine compound are selected in this range, very low operating voltage and/or high external quantum efficiency and/or long lifetime are obtained, as the charge balance can be maintained during operation of the OLED.

The present invention offers a significant benefit in terms of takt time and yield, as the layers can be rapidly deposited while the VTE (vacuum thermal evaporation) sources move back and forth underneath the substrate.

In a preferred embodiment, the first VTE source containing the first organic aromatic matrix compound moves first underneath the substrate and the first electron transport layer is deposited onto the emission layer. The shutter of the second VTE source containing the polar organic aromatic phosphine compound stays closed. Then, the shutter is opened on the second VTE source and the second electron transport layer is deposited while the first and second VTE source move backwards underneath the substrate. If a non-emitter dopant is deposited at the same time as the polar organic aromatic phosphine compound, the shutter of a third VTE source is opened and closed at the same time as the shutter of the second VTE source.

In another preferred embodiment, the shutter of the first, second and optional third VTE source are open while the third electron transport layer (163) is deposited onto the emission layer. Then the shutter is closed on the second and third VTE source and the shutter stays open on the first VTE source, while the sources move backwards underneath the substrate to deposit the first electron transport layer (161). Then, the shutters of the second and optional third VTE source are opened again and the first, second and third VTE source move forwards to deposit the second electron transport layer (162). Thereby, alternating layers of first and second electron transport layer may be rapidly deposited till the desired layer thickness is obtained.

Preferably, the first organic aromatic matrix compound in the first electron transport layer and the first organic aromatic matrix compound in the second electron transport layer are selected the same compound. More preferred, the first organic aromatic matrix compound in all layers of the ETL-stack is selected the same compound.

According to another aspect, the electron transport layer stack is free of an emitter dopant which emits visible light at operation of the OLED.

According to another aspect, the first electron transport layer is free of a non-emitter dopant and the second electron transport layer comprises a non-emitter dopant, wherein the non-emitter dopant is a metal compound, preferably the metal compound is selected from the group comprising a metal halide, a metal organic complex and/or a zero-valent metal.

The electron transport layer stack is arranged between the emission layer and the electron cathode layer. The electron transport layer stack can be arranged between the emission layer and the electron injection layer, if the OLED comprises an injection layer.

Preferably, the ETL-stack is contacting sandwiched between the emission layer and electron injection layer.

In another preferred embodiment, the ETL-stack is contacting sandwiched between the emission layer and the cathode electrode.

In another embodiment, the electron transport layer may be contacting sandwiched between a hole blocking layer and an electron injection layer, if the OLED comprises a hole blocking layer and an injection layer.

According to various embodiments of the OLED of the present invention the electron transport layer stack comprises at least two electron transport layers, wherein
  a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of a polar organic aromatic phosphine compound; and
  b) the second electron transport layer comprises two organic aromatic matrix compounds, which are a mixture of:
    i) the first organic aromatic matrix compound; and
    ii) a polar organic aromatic phosphine compound having a MW of about ≥400 to about ≤1000, and a dipole moment of about >2.5 Debye and about ≤10 Debye.

The organic light emitting device may comprise further electron transport layers, preferably a third and optional a fourth electron transport layer. The first, second, third and fourth electron transport layer may form an electron transport layer stack, wherein the first electron transport layer is in direct contact with the second electron transport layer, the second electron transport layer is in direct contact with the third electron transport layer, and the third electron transport layer is in direct contact with the fourth electron transport layer. As an alternative embodiment the first and second electron transport layer forms a separate electron transport layer stack, and the third and optional fourth electron transport layer forms a separate electron transport layer stack and may be arranged between a charge generation layer and the cathode.

According to another aspect the OLED may comprises an electron transport layer stack of a first electron transport layer, a second electron transport layer, a third electron transport layer, and a fourth electron transport layer, wherein the fourth electron transport layer comprises a first organic aromatic matrix compound having a MW of about ≥400 to about ≤1000 and a dipole moment of about ≥0 Debye and about ≤2.5 Debye, wherein the fourth electron transport layer is free of a polar organic aromatic phosphine compound.

Preferably, the first electron transport layer and fourth electron transport layer may be selected the same, and the second and third electron transport layer may be selected the same.

According to a more preferred aspect there is provided an organic light emitting diode (OLED) wherein the organic light emitting diode comprises an electron transport layer stack of a first electron transport layer, a second electron transport layer and a third electron transport layer, wherein the third electron transport layer is arranged nearest to the anode, the second electron transport layer is arranged nearest to the cathode and the first electron transport layer is arranged in between the third electron transport layer and the second electron transport layer.

According to a more preferred aspect there is provided an organic light emitting diode (OLED) wherein the organic light emitting diode comprises an electron transport layer stack of a first electron transport layer, a second electron transport layer and a third electron transport layer, wherein the third electron transport layer is arranged nearest to the anode, the second electron transport layer is arranged nearest to the cathode and the first electron transport layer is arranged in between the third electron transport layer and the second electron transport layer, and wherein the third electron transport layer comprises two organic aromatic matrix compounds, which are a mixture of:
  i) a first organic aromatic matrix compound having a MW of about ≥400 to about ≤1000 and a dipole moment of about ≥0 Debye and about ≤2.5 Debye and which is free of a polar organic aromatic phosphine compound; and
  ii) a polar organic aromatic phosphine compound having a MW of about ≥400 to about ≤1000 and a dipole moment of about >2.5 Debye and about ≤10 Debye, and
  iii) optional a non-emitter dopant, wherein the non-emitter dopant is a metal compound, preferably the metal compound is selected from the group comprising an metal halide, metal organic complex and/or zero-valent metal.

According to a further aspect there is provided an organic light emitting diode (OLED) wherein the organic light emitting diode comprises an electron transport layer stack of a first electron transport layer, a second electron transport layer, a third electron transport layer and a fourth electron transport layer, wherein the third electron transport layer is arranged nearest to the anode, followed by the first electron transport layer, followed by the second electron transport layer and followed by the fourth electron transport layer, wherein the fourth electron transport layer is arranged nearest to the cathode and the first electron transport layer and second electron transport layer are arranged in between the third electron transport layer and the fourth electron transport layer.

According to another aspect there is provided an organic light emitting diode (OLED) wherein the organic light emitting diode comprises an electron transport layer stack of a first electron transport layer and a second electron transport layer, and an electron layer stack of a third electron transport layer and a fourth electron transport layer, wherein the third electron transport layer is arranged nearest to the cathode and the fourth electron transport layer contacts the third electron transport layer is arranged nearest to the anode; and wherein the second electron transport layer is arranged nearest to the cathode and the first electron transport layer contacts the second electron transport layer and is arranged nearest to the anode.

According to a more preferred aspect there is provided an organic light emitting diode (OLED) wherein the organic light emitting diode comprises an electron transport layer stack of a first electron transport layer, a second electron transport layer, a third electron transport layer and a fourth electron transport layer, wherein the third electron transport layer is arranged nearest to the anode, followed by the first electron transport layer, followed by the second electron transport layer and followed by the fourth electron transport layer, wherein the fourth electron transport layer is arranged nearest to the cathode and the first electron transport layer and second electron transport layer are arranged in between the third electron transport layer and the fourth electron transport layer, and wherein the third electron transport layer comprises two organic aromatic matrix compounds, which are a mixture of:
  i) a first organic aromatic matrix compound having a MW of about ≥400 to about ≤1000 and a dipole moment of about ≥0 Debye and about ≤2.5 Debye and which is free of a polar organic aromatic phosphine compound; and
  ii) a polar organic aromatic phosphine compound having a MW of about ≥400 to about ≤1000 and a dipole moment of about >2.5 Debye and about ≤10 Debye, and
  iii) optional a non-emitter dopant, wherein the non-emitter dopant is a metal compound, preferably the metal compound is selected from the group comprising an metal halide, metal organic complex and/or zero-valent metal; and wherein
  the fourth electron transport layer comprises:
    a first organic aromatic matrix compound having a MW of about ≥400 to about ≤1000 and a dipole moment of about ≥0 Debye and about ≤2.5 Debye, wherein the fourth electron transport layer is free of a polar organic aromatic phosphine compound.

According to a more preferred aspect, there is provided an organic light emitting diode (OLED) wherein the organic light emitting diode comprises:
  at least one anode electrode;
  at least one emission layer, wherein the emission layer comprises at least one emitter dopant that emits visible light at operation of the OLED (100);
  at least one cathode electrode layer;
  an electron transport layer stack of a first electron transport layer (161), a second electron transport layer (162) and a third electron transport layer (163), wherein the third electron transport layer (163) comprises two organic aromatic matrix compounds, which are a mixture of:
i) a first organic aromatic matrix compound having a MW of about ≥400 to about ≤1000 and a dipole moment of about ≥0 Debye and about ≤2.5 Debye and which is free of a polar organic aromatic phosphine compound; and
ii) a polar organic aromatic phosphine compound having a MW of about ≥400 to about ≤1000 and a dipole moment of about >2.5 Debye and about ≤10 Debye, and
iii) optional a non-emitter dopant, wherein the non-emitter dopant is a metal compound, preferably the metal compound is selected from the group comprising an metal halide, metal organic complex and/or zero-valent metal.

In a preferred embodiment, the second electron transport layer (162) and the third electron transport layer (163) may have the same composition.

According to a more preferred aspect, there is provided an organic light emitting diode (OLED) wherein the organic light emitting diode comprises, wherein the OLED comprises an electron transport layer stack (160) of a first electron transport layer (161), a second electron transport layer (162), a third electron transport layer (163), and a fourth electron transport layer (164), wherein the fourth electron transport layer (164) comprises:
a first organic aromatic matrix compound having a MW of about ≥400 to about ≤1000 and a dipole moment of about ≥0 Debye and about ≤2.5 Debye, wherein the fourth electron transport layer (161) is free of a polar organic aromatic phosphine compound.

In another aspect is provided an electron transport layer stack comprises five or more electron transport layers, wherein an electron transport layer comprises i) a first organic aromatic matrix compound having a MW of about ≥400 to about ≤1000 and a dipole moment of about ≥0 Debye and about ≤2.5 Debye, wherein the first electron transport layer is free of a polar organic aromatic phosphine compound; and an electron transport layer comprises two organic aromatic matrix compounds, which are a mixture of i) the first organic aromatic matrix compound; and ii) a polar organic aromatic phosphine compound having a MW of about ≥400 to about ≤1000, and a dipole moment of about >2.5 Debye and about ≤10 Debye are alternatingly arranged.

In a preferred embodiment, the first electron transport layer (161) and the fourth electron transport layer (164) may have the same composition.

In a more preferred embodiment, the second electron transport layer (162) and the third electron transport layer (163) may have the same composition and the first electron transport layer (161) and the fourth electron transport layer (164) may have the same composition.

Preferably, the second and optional third electron transport layer according to the invention comprises a polar organic aromatic phosphine oxide compound.

In a preferred embodiment of the OLED, the electron transport layer stack is free of emitter compounds, also named emitter dopants, which emit visible light at operation of the OLED.

According to another aspect, the electron transport layer stack can be free of a metal, metal halide, metal salt and/or lithium organic metal complex.

The thickness of the first electron transport layer may be in the range of ≥2 nm to about ≤10 nm, preferably ≥3 nm to about ≤5 nm.

The thickness of the second electron transport layer may be in the range of ≥20 nm to about ≤50 nm, preferably ≥25 nm to about ≤40 nm.

According to various embodiments of the OLED of the present invention the thicknesses of the electron transport layer stack can be in the range of about ≥20 nm to about ≤100 nm, preferably of about ≥30 nm to about ≤80 nm, further preferred of about ≥35 nm to about ≤60 nm, and more preferred of about ≥33 nm to about ≤40 nm.

The electron transport layer of the ETL-stack may be formed on the EML by vacuum deposition, spin coating, slot-die coating, printing, casting, or the like. When the electron transport layer of the ETL-stack are formed by vacuum deposition or spin coating, the deposition and coating conditions may be similar to those for formation of the HIL. However, the deposition and coating conditions may vary, according to a compound that is used to form the electron transport layers of the ETL-stack.

First Organic Aromatic Matrix Compound

According to one embodiment, the first organic aromatic matrix compound/s have a MW of about ≥400 to about ≤1000 and a dipole moment of about ≥0 Debye and about ≤2.5 Debye. When the first organic aromatic matrix compound has a MW in this range, the evaporation rate may be controlled to a level sufficient for manufacturing and high takt time can be realized while maintaining high reproducibility.

Particularly high external quantum efficiency EQE, low operating voltage and/or lifetime are obtained when the first organic matrix compound has a dipole moment ≥0 and ≤2.5 Debye. When the first organic aromatic matrix compound has a dipole moment in this range, it can also be described as non-polar matrix compound.

The dipole moment $|\vec{\mu}|$ of a molecule containing N atoms is given by:

$$\vec{\mu} = \sum_i^N q_i \vec{r}_i$$

$$|\vec{\mu}| = \sqrt{\mu_x^2 + \mu_y^2 + \mu_z^2}$$

where $q_i$ and $\vec{r}_i$ are the partial charge and position of atom i in the molecule. The dipole moment is determined by a semi-empirical molecular orbital method. The values in Table 2 were calculated using the method as described below. The partial charges and atomic positions are obtained using either the DFT functional of Becke and Perdew BP with a def-SV(P) basis or the hybrid functional B3LYP with a def2-TZVP basis set as implemented in the program package TURBOMOLE V6.5. If more than one conformation is viable, the conformation with the lowest total energy is selected to determine the dipole moment.

When the first organic aromatic matrix compound has a dipole moment between 0 and 2.5 Debye, the first organic aromatic matrix compound may contain a center of inversion I, a horizontal mirror plane, more than one $C_n$ axis (n>1), and/or n $C_2$ perpendicular to $C_n$.

The first organic aromatic matrix compound is an electron transporting compound. Therefore, the triplet level $T_1$ of the first organic matrix compound may be selected in the range which supports electron transport. Preferably, the first organic aromatic matrix compound is selected from an organic aromatic matrix compound with a triplet level >1 eV and <2.9 eV, preferably >1.2 and <2.8 eV, more preferred >1.3 and <2.7 eV.

The triplet level $T_1$ is determined through quantum-chemical calculations. To this end, the software package "Gaussion-03 W" is used. Firstly a geometry optimisation is carried out using the "Ground State/Semi-empirical/Default Spin/AM1/Charge 0/Spin Singlet" method. This is followed by an energy calculation on the basis of the optimised geometry. This is followed by an energy calculation on the basis of the optimised geometry. The "TD-SFC/DFT/Default Spin/B3PW91" method with the "6-31G(d)" base set is used (Charge 0, Spin Singlet). The result may be further optimized using B3PW91.

According to various aspects, the reduction potential of the first organic matrix compound is less negative when measured under the same conditions with cyclic voltammetry in tetrahydrofurane against Fc+/Fc redox couple than the reduction potential of pyrene, preferably less negative than the reduction potential of 1,3,5-tris(1-phenyl-1H-benzimidazol-2-yl)benzene, more preferably less negative than the reduction potential of (9-phenyl-9H-carbazole-2,7-diyl)bis(diphenylphosphine oxide) and more negative than the reduction potential of 4,4'-bis(4,6-diphenyl-1,3,5-triazin-2-yl)biphenyl, preferably more negative than the reduction potential of 4-(naphtalen-1-yl)-2,7,9-triphenylpyrido[3,2-h]quinazoline.

The redox potential is determined by cyclic voltammetry with potenioststic device Metrohm PGSTAT30 and software Metrohm Autolab GPES at room temperature. The redox potentials given at particular compounds were measured in an argon de-aerated, dry 0.1M THF solution of the tested substance, under argon atmosphere, with 0.1M tetrabutylammonium hexafluorophosphate supporting electrolyte, between platinum working electrodes and with an Ag/AgCl pseudo-standard electrode (Metrohm Silver rod electrode), consisting of a silver wire covered by silver chloride and immersed directly in the measured solution, with the scan rate 100 mV/s. The first run was done in the broadest range of the potential set on the working electrodes, and the range was then adjusted within subsequent runs appropriately. The final three runs were done with the addition of ferrocene (in 0.1M concentration) as the standard. The average of potentials corresponding to cathodic and anodic peak of the studied compound, after subtraction of the average of cathodic and anodic potentials observed for the standard Fc+/Fc redox couple, afforded finally the values reported above. All studied compounds as well as the reported comparative compounds showed well-defined reversible electrochemical behaviour.

Under these conditions, the reduction potential of pyrene is −2.64 V, the reduction potential of 1,3,5-tris(1-phenyl-1H-benzimidazol-2-yl)benzene is −2.58 V, the reduction potential of (9-phenyl-9H-carbazole-2,7-diyl)bis(diphenylphosphine oxide) is −2.51 V, the reduction potential of 4,4'-bis(4,6-diphenyl-1,3,5-triazin-2-yl)biphenyl is −2.03 V, and the reduction potential of 4-(naphtalen-1-yl)-2,7,9-triphenylpyrido[3,2-h]quinazoline is −2.18 V.

A simple rule is very often used for the conversion of redox potentials into electron affinities and ionization potential: IP (in eV)=4.84 eV+e*Eox (wherein Eox is given in Volt vs. ferrocene/ferrocenium (Fc/Fc+) and EA (in eV)=4.84 eV+e*Ered (Ered is given in Volt vs. Fc/Fc+) respectively (see B. W. D'Andrade, Org. Electron. 6, 11-20 (2005)), e* is the elemental charge. It is common practice, even if not exactly correct, to use the terms "energy of the HOMO" E(HOMO) and "energy of the LUMO" E(LUMO), respectively, as synonyms for the ionization energy and electron affinity (Koopmans Theorem).

Thereby, the LUMO of pyrene is −2.2 eV, the LUMO of 1,3,5-tris(1-phenyl-1H-benzimidazol-2-yl)benzene is −2.26 eV, the LUMO of (9-phenyl-9H-carbazole-2,7-diyl)bis(diphenylphosphine oxide) is −2.33 eV, the LUMO of 4,4'-bis(4,6-diphenyl-1,3,5-triazin-2-yl)biphenyl is −2.81 eV, and the LUMO of 4-(naphtalen-1-yl)-2,7,9-triphenylpyrido[3,2-h]quinazoline is −2.66 eV.

According to a more preferred aspect, the first organic aromatic matrix compound may comprises a conjugated system of at least ten, preferably at least fourteen delocalized electrons.

Examples of conjugated systems of delocalized electrons are systems of alternating pi- and sigma bonds. Optionally, one or more two-atom structural units having the pi-bond between its atoms can be replaced by an atom bearing at least one lone electron pair, typically by a divalent atom selected from O, S or Se or by a trivalent atom selected from N or P. Preferably, the conjugated system of delocalized electrons comprises at least one aromatic or heteroaromatic ring according to the Hückel rule. Also preferably, the first organic aromatic matrix compound may comprise at least two aromatic or heteroaromatic rings which are either linked by a covalent bond or condensed.

According to a more preferred aspect, the first organic aromatic matrix compound is selected from the group comprising benzo[k]fluoranthene, pyrene, anthracene, fluorene, spiro(bifluorene), phenanthrene, perylene, triptycene, spiro[fluorene-9,9'-xanthene], coronene, triphenylene, xanthene, benzofurane, dibenzofurane, dinaphthofurane, acridine, benzo[c]acridine, dibenzo[c,h]acridine, dibenzo[a,j]acridine, triazine, pyridine, pyrimidine, carbazole, thienopyrimidine, dithienothiophene, benzothienopyrimidine, benzothieno-pyrimidine, triaryl borane or mixtures thereof.

According to a more preferred aspect, the first organic aromatic matrix compound is free of a phosphine group, a phenanthroline group, a benzimidazole group or metal cations.

It may be further preferred that the first organic aromatic matrix compound comprises a triaryl borane compound of formula (1)

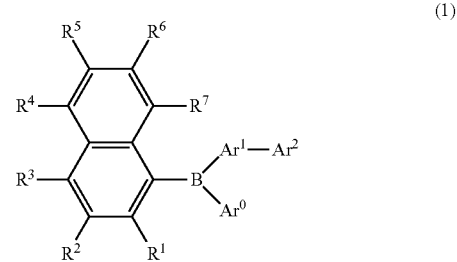

(1)

wherein $R^1$, $R^3$ and $R^7$ are independently selected from a group consisting of H, D, $C_1$-$C_{16}$ alkyl and $C_1$-$C_{16}$ alkoxy;

$R^2$, $R^4$, $R^5$ and $R^6$ are independently selected from a group consisting of H, D, $C_1$-$C_{16}$ alkyl, $C_1$-$C_{16}$ alkoxy and $C_6$-$C_{20}$ aryl;

$Ar^0$ is selected from substituted or unsubstituted $C_6$-$C_{20}$ aryl, wherein, in case that $Ar^0$ is substituted, the substituents are independently selected from a group consisting of D, $C_1$-$C_{12}$ alkyl, $C_1$-$C_{16}$ alkoxy and $C_6$-$C_{20}$ aryl; and Ar$^1$ is selected from substituted or unsubstituted C$_6$-C$_{20}$ arylene, wherein, in case that Ar$^1$ is substituted, the substituents are independently selected from a group consisting of D, C$_1$-C$_{12}$ alkyl, C$_1$-C$_{16}$ alkoxy and C$_6$-C$_{20}$ aryl; and Ar$^2$ is selected from Ar$^2$ is selected from a group consisting of H, D, substituted or unsubstituted C$_6$-C$_{40}$ aryl and C$_5$-C$_{40}$ heteroaryl.

Preferably, Ar$^0$ is selected from substituted or unsubstituted phenyl or naphthyl, wherein, in case that Ar$^0$ is substituted, the substituents are independently selected from a group consisting of D, C$_1$-C$_{12}$ alkyl, C$_1$-C$_{16}$ alkoxy and C$_6$-C$_{20}$ aryl.

Triaryl borane compounds of formula (1):

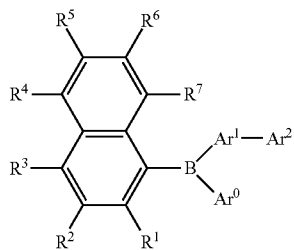

(1)

are disclosed in WO2015049030A2 and EP15187135.7.

In a further preferred embodiment, the first organic aromatic matrix compound comprises: a dibenzo[c,h]acridine compound of formula (2)

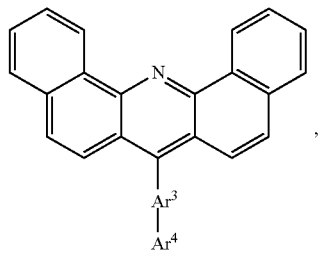

(2)

and/or a dibenzo[a,j]acridine compound of formula (3)

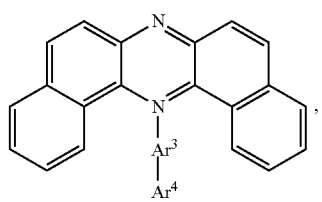

(3)

and/or a benzo[c]acridine compound of formula (4)

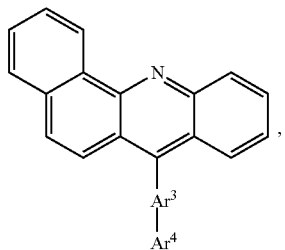

(4)

wherein Ar$^3$ is independently selected from C$_6$-C$_{20}$ arylene, preferably phenylene, biphenylene, or fluorenylene;

Ar$^4$ is independently selected from unsubstituted or substituted C$_6$-C$_{40}$ aryl, preferably phenyl, naphthyl, anthranyl, pyrenyl, or phenanthryl;

and in case that Ar$^4$ is substituted, the one or more substituents may be independently selected from the group consisting of C$_1$-C$_{12}$ alkyl and C$_1$-C$_{12}$ heteroalkyl, wherein C$_1$-C$_5$ alkyl is preferred.

Suitable dibenzo[c,h]acridine compounds are disclosed in EP 2 395 571. Suitable dibenzo[a,j]acridine are disclosed in EP 2 312 663. Suitable benzo[c]acridine compounds are disclosed in WO 2015/083948.

In a further embodiment, it is preferred that the first organic aromatic matrix compound comprises a dibenzo[c,h]acridine compound substituted with C$_6$-C$_{40}$ aryl, C$_5$-C$_{40}$ heteroaryl and/or C$_1$-C$_{12}$ alkyl groups, preferably 7-(naphthalen-2-yl)dibenzo[c,h]acridine, 7-(3-(pyren-1-yl)phenyl) dibenzo[c,h]acridine, 7-(3-(pyridin-4-yl)phenyl)dibenzo[c,h]acridine.

In a further embodiment, it is preferred that the first organic aromatic matrix compound comprises a dibenzo[a,j]acridine compound substituted with C$_6$-C$_{40}$ aryl, C$_5$-C$_{40}$ heteroaryl and/or C$_1$-C$_{12}$ alkyl groups, preferably 14-(3-(pyren-1-yl)phenyl)dibenzo[a,j]acridine.

In a further embodiment, it is preferred that the first organic aromatic matrix compound comprises a benzo[c] acridine compound substituted with C$_6$-C$_{40}$ aryl, C$_5$-C$_{40}$ heteroaryl and/or C$_1$-C$_{12}$ alkyl groups, preferably 7-(3-(pyren-1-yl)phenyl)benzo[c]acridine.

It may be further preferred that the first organic aromatic matrix compound comprises a triazine compound of formula (5)

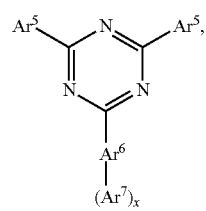

(5)

wherein Ar$^5$ is independently selected from unsubstituted or substituted C$_6$-C$_{20}$ aryl or Ar$^{5.1}$-Ar$^{5.2}$, wherein Ar$^{5.1}$ is selected from unsubstituted or substituted C$_6$-C$_{20}$ arylene and Ar$^{5.2}$ is selected from unsubstituted or substituted C$_6$-C$_{20}$ aryl or unsubstituted and substituted C$_5$-C$_{20}$ heteroaryl;

Ar$^6$ is selected from unsubstituted or substituted C$_6$-C$_{20}$ arylene, preferably phenylene, biphenylene, terphenylene, fluorenylene;

Ar⁷ is independently selected from a group consisting of substituted or unsubstituted aryl, substituted or unsubstituted heteroaryl, the aryl and the heteroaryl having 6 to 40 ring-forming atoms, preferably phenyl, naphthyl, phenantryl, fluorenyl, terphenyl, pyridyl, quinolyl, pyrimidyl, triazinyl, benzo[h]quinolinyl, or benzo[4,5]thieno[3,2-d]pyrimidine;

x is selected from 1 or 2, wherein in case that $Ar^5$ is substituted the one or more substituents may independently be selected from $C_1$-$C_{12}$ alkyl and $C_1$-$C_{12}$ heteroalkyl, preferably $C_1$-$C_5$ alkyl;

and in case that $Ar^7$ is substituted, the one or more substituents may be independently selected from $C_1$-$C_{12}$ alkyl and $C_1$-$C_{12}$ heteroalkyl, preferably $C_1$-$C_5$ alkyl, and from $C_6$-$C_{20}$ aryl.

Suitable triazine compounds are disclosed in US 2011/284832, WO 2014/171541, WO 2015/008866, WO2015/105313, JP 2015-074649 A, JP 2015-126140, KR 2015/0088712, KR2015-012551 and WO16171358A1.

Furthermore, it is preferred that the first organic aromatic matrix compound comprises a triazine compound substituted with $C_6$-$C_{40}$ aryl, $C_5$-$C_{40}$ heteroaryl and/or $C_1$-$C_{12}$ alkyl groups, preferably 3-[4-(4,6-di-2-naphthalenyl-1,3,5-triazin-2-yl)phenyl]quinolone, 2-[3-(6'-methyl[2,2'-bipyridin]-5-yl)-5-(9-phenanthrenyl)phenyl]-4,6-diphenyl-1,3,5-triazine, 2-(3-(phenanthren-9-yl)-5-(pyridin-2-yl)phenyl)-4,6-diphenyl-1,3,5-triazine, 2,4-diphenyl-6-(5'''-phenyl-[1,1':3',1'':3'',1''':3''',1''''-quinquephenyl]-3-yl)-1,3,5-triazine, 2-([1,1'-biphenyl]-3-yl)-4-(3'-(4,6-diphenyl-1,3,5-triazin-2-yl)-[1,1'-biphenyl]-3-yl)-6-phenyl-1,3,5-triazine and/or 2-(3'-(4,6-diphenyl-1,3,5-triazin-2-yl)-[1,1'-biphenyl]-3-yl)-4-phenylbenzo[4,5]thieno [3,2-d]pyrimidine.

In a preferred embodiment, the first organic aromatic matrix compound comprises a benzothienopyrimidine compound substituted with $C_6$-$C_{40}$aryl, $C_5$-$C_{40}$ heteroaryl and/or $C_1$-$C_{12}$ alkyl groups, preferably 2-phenyl-4-(4',5',6'-triphenyl-[1,1':2',1'':3'',1'''-quaterphenyl]-3'''-yl)benzo[4,5]thieno[3,2-d]pyrimidine. Suitable benzothienopyrimidine compounds are disclosed in W 2015/0105316.

In a preferred embodiment, the first organic aromatic matrix compound comprises a benzo[k]fluoranthene compound substituted with $C_6$-$C_{40}$aryl, $C_5$-$C_{40}$ heteroaryl and/or $C_1$-$C_{12}$ alkyl groups, preferably 7, 12-diphenylbenzo[k]fluoranthene. Suitable benzo[k]fluoranthene compounds are disclosed in JP10189247 A2.

In a preferred embodiment, the first organic aromatic matrix compound comprises a perylene compound substituted with $C_6$-$C_{40}$ aryl, $C_5$-$C_{40}$ heteroaryl and/or $C_1$-$C_{12}$ alkyl groups, preferably 3,9-bis([1,1'-biphenyl]-2-yl)perylene, 3,9-di(naphthalene-2-yl)perylene or 3,10-di(naphthalene-2-yl)perylene. Suitable perylene compounds are disclosed in US2007202354.

In a preferred embodiment, the first organic aromatic matrix compound comprises a pyrene compound. Suitable pyrene compounds are disclosed in US20050025993.

In a preferred embodiment, the first organic aromatic matrix compound comprises a spiro-fluorene compound. Suitable spiro-fluorene compounds are disclosed in JP2005032686.

In a preferred embodiment, the first organic aromatic matrix compound comprises a xanthene compound. Suitable xanthene compounds are disclosed in US2003168970A and WO 2013149958.

In a preferred embodiment, the first organic aromatic matrix compound comprises a coronene compound. Suitable coronene compounds are disclosed in Adachi, C.; Tokito, S.; Tsutsui, T.; Saito, S., Japanese Journal of Applied Physics, Part 2: Letters (1988), 27(2), L269-L271.

In a preferred embodiment, the first organic aromatic matrix compound comprises a triphenylene compound. Suitable triphenylene compounds are disclosed in US20050025993.

In a preferred embodiment, the first organic aromatic matrix compound is selected from carbazole compounds. Suitable carbazole compounds are disclosed in US2015207079.

In a preferred embodiment, the first organic aromatic matrix compound is selected from dithienothiophene compounds. Suitable dithienothiophene compounds are disclosed in KR2011085784.

In a preferred embodiment, the first organic aromatic matrix compound comprises an anthracene compound. Particularly preferred are anthracene compounds represented by Formula 400 below:

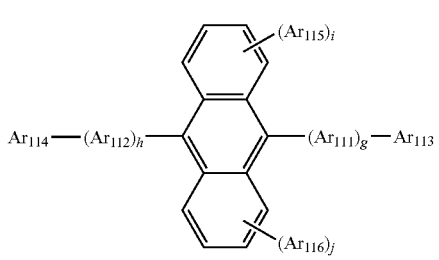

Formula 400

In Formula 400, $Ar_{111}$ and $Ar_{112}$ may be each independently a substituted or unsubstituted $C_6$-$C_{60}$ arylene group; $Ar_{113}$ to $Ar_{116}$ may be each independently a substituted or unsubstituted $C_1$-$C_{10}$ alkyl group or a substituted or unsubstituted $C_6$-$C_{60}$ aryl group; and g, h, i, and j may be each independently an integer from 0 to 4.

In some embodiments, $Ar_{111}$ and $Ar_{112}$ in Formula 400 may be each independently one of:

a phenylene group, a naphthylene group, a phenanthrenylene group, or a pyrenylene group, or a phenylene group, a naphthylene group, a phenanthrenylene group, a fluorenyl group, or a pyrenylene group, each substituted with at least one of a phenyl group, a naphthyl group, or an anthryl group.

In Formula 400, g, h, i, and j may be each independently an integer of 0, 1, or 2.

In Formula 400, $Ar_{113}$ to $Ar_{116}$ may be each independently one of a $C_1$-$C_{10}$ alkyl group substituted with at least one of a phenyl group, a naphthyl group, or an anthryl group;

a phenyl group, a naphthyl group, an anthryl group, a pyrenyl group, a phenanthrenyl group, or a fluorenyl group;

a phenyl group, a naphthyl group, an anthryl group, a pyrenyl group, a phenanthrenyl group, or a fluorenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, or a fluorenyl group; or having the following structure

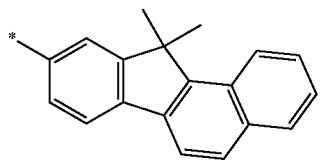

5

According to a further more preferred aspect the first organic aromatic matrix compound can be selected from a compound of Table 1 below. These have been found to have a particularly beneficial effect on operating voltage, external quantum efficiency and/or lifetime.

TABLE 1

First organic aromatic matrix compounds with a dipole moment ≥0 Debye and ≤2.5 Debye which may be suitable used

| Referred to as: | Structure |
|---|---|
| ADN | 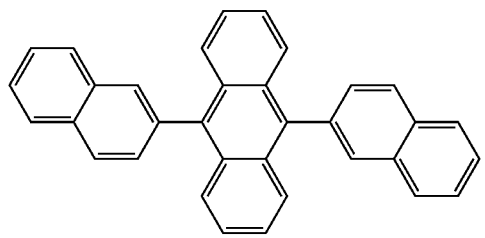 [SMILES: c1ccc2cc(-c3c4ccccc4c(-c4ccc5ccccc5c4)c4ccccc34)ccc2c1] |
| ETM1-1 | 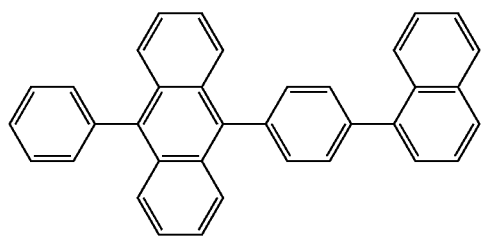 [SMILES: c1ccc(-c2c3ccccc3c(-c3ccc(-c4cccc5ccccc45)cc3)c3ccccc23)cc1] |
| ETM1-2 | 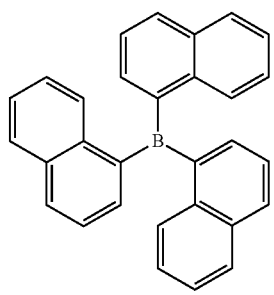 [SMILES: c1ccc2c(B(c3cccc4ccccc34)c3cccc4ccccc34)cccc2c1] |
| ETM1-3 | 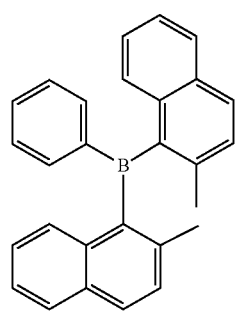 [SMILES: Cc1ccc2ccccc2c1B(c1ccccc1)c1c(C)ccc2ccccc12] |

TABLE 1-continued
First organic aromatic matrix compounds with a dipole moment ≥0 Debye and ≤2.5 Debye which may be suitable used
| Referred to as: | Structure |
| --- | --- |
| ETM1-4 | 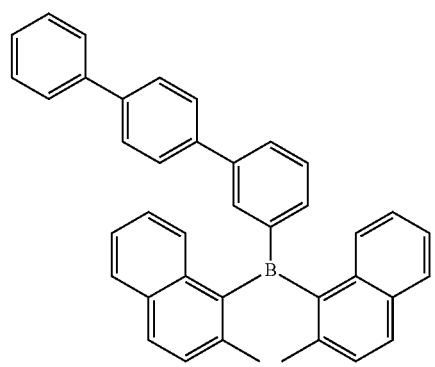 [SMILES: Cc1ccc2ccccc2c1B(c1cccc(-c2ccc(-c3ccccc3)cc2)c1)c1c(C)ccc2ccccc12] |
| ETM1-5 | 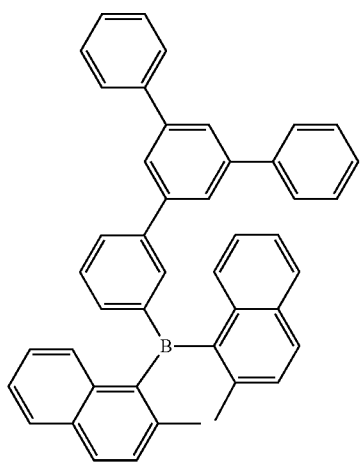 [SMILES: Cc1ccc2ccccc2c1B(c1cccc(-c2cc(-c3ccccc3)cc(-c3ccccc3)c2)c1)c1c(C)ccc2ccccc12] |
| ETM1-6 | 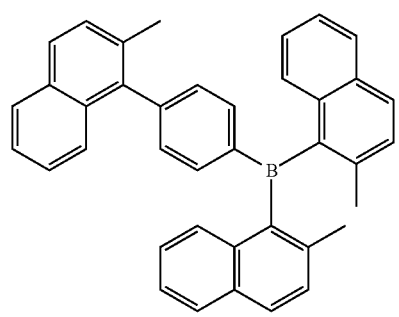 [SMILES: Cc1ccc2ccccc2c1B(c1ccc(-c2c(C)ccc3ccccc23)cc1)c1c(C)ccc2ccccc12] |

TABLE 1-continued

First organic aromatic matrix compounds with a dipole moment ≥0 Debye and ≤2.5 Debye which may be suitable used

| Referred to as: | Structure |
|---|---|
| ETM1-7 | |
| ETM1-8 | |
| ETM1-9 | |

TABLE 1-continued
First organic aromatic matrix compounds with a dipole moment ≥0 Debye and ≤2.5 Debye which may be suitable used
| Referred to as: | Structure |
|---|---|
| ETM1-10 | 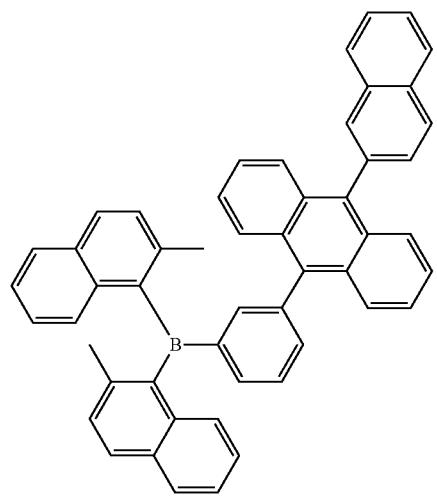 [SMILES: Cc1ccc2ccccc2c1B(c1cccc(-c2c3ccccc3c(-c3ccc4ccccc4c3)c3ccccc23)c1)c1c(C)ccc2ccccc12] |
| ETM1-11 | 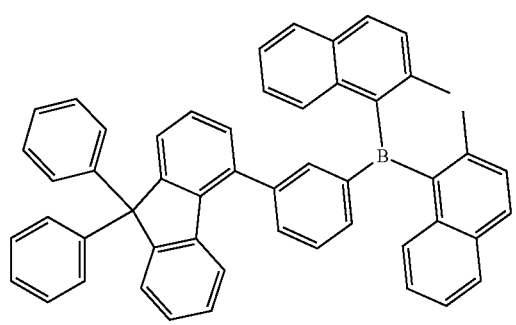 [SMILES: Cc1ccc2ccccc2c1B(c1cccc(-c2cccc3c2-c2ccccc2C3(c2ccccc2)c2ccccc2)c1)c1c(C)ccc2ccccc12] |
| ETM1-12 | 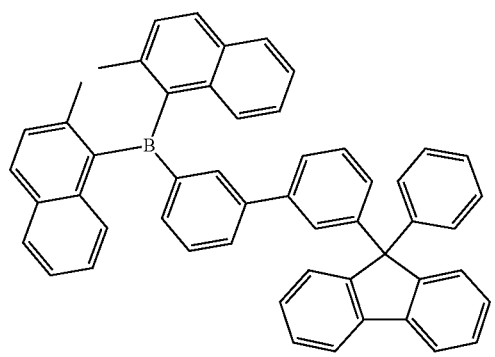 [SMILES: Cc1ccc2ccccc2c1B(c1cccc(-c2cccc(C3(c4ccccc4)c4ccccc4-c4ccccc43)c2)c1)c1c(C)ccc2ccccc12] |

TABLE 1-continued
First organic aromatic matrix compounds with a dipole moment ≥0 Debye and ≤2.5 Debye which may be suitable used
| Referred to as: | Structure |
| --- | --- |
| ETM1-13 | 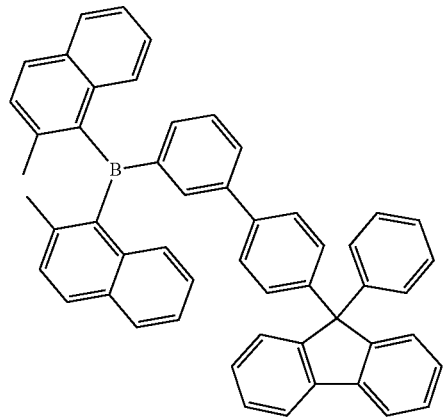 [SMILES: Cc1ccc2ccccc2c1B(c1cccc(-c2ccc(C3(c4ccccc4)c4ccccc4-c4ccccc43)cc2)c1)c1c(C)ccc2ccccc12] |
| ETM1-14 | 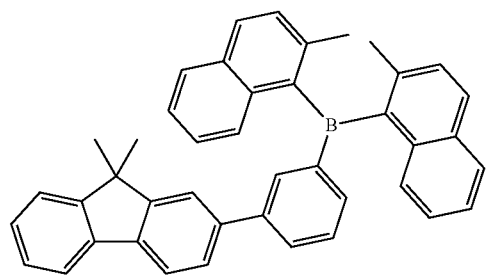 [SMILES: Cc1ccc2ccccc2c1B(c1cccc(-c2ccc3c(c2)C(C)(C)c2ccccc2-3)c1)c1c(C)ccc2ccccc12] |
| ETM1-15 | 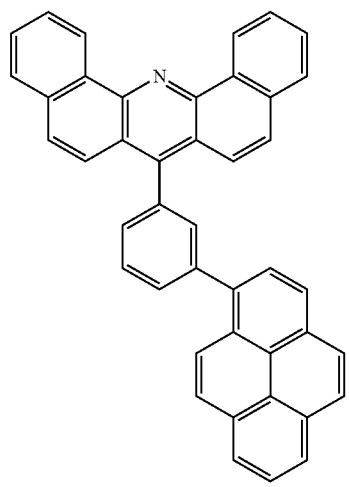 [SMILES: c1cc(-c2c3ccc4ccccc4c3nc3c2ccc2ccccc23)cc(-c2ccc3ccc4cccc5ccc2c3c45)c1] |

TABLE 1-continued
First organic aromatic matrix compounds with a dipole moment ≥0 Debye and ≤2.5 Debye which may be suitable used
| Referred to as: | Structure |
| --- | --- |
| ETM1-16 | 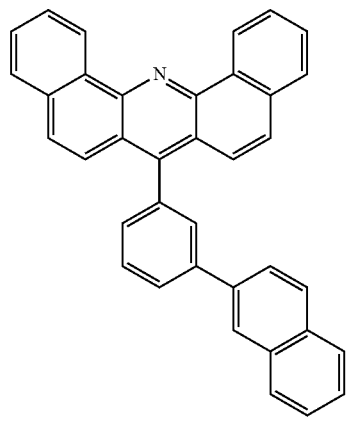 [SMILES: c1cc(-c2ccc3ccccc3c2)cc(-c2c3ccc4ccccc4c3nc3c2ccc2ccccc23)c1] |
| ETM1-17 | 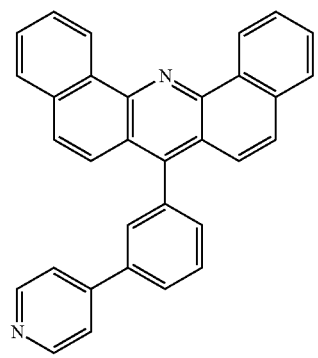 [SMILES: c1cc(-c2ccncc2)cc(-c2c3ccc4ccccc4c3nc3c2ccc2ccccc23)c1] |
| ETM1-18 | 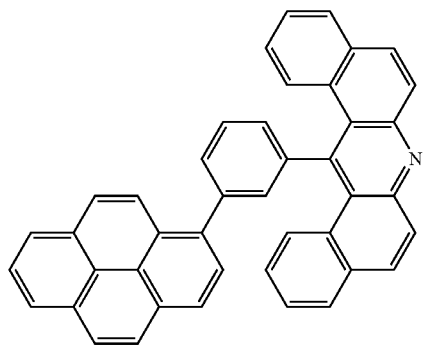 [SMILES: c1cc(-c2ccc3ccc4cccc5ccc2c3c45)cc(-c2c3c(ccc4ccccc43)nc3ccc4ccccc4c23)c1] |

TABLE 1-continued
First organic aromatic matrix compounds with a dipole moment ≥0 Debye and ≤2.5 Debye which may be suitable used
| Referred to as: | Structure |
| --- | --- |
| ETM1-19 | 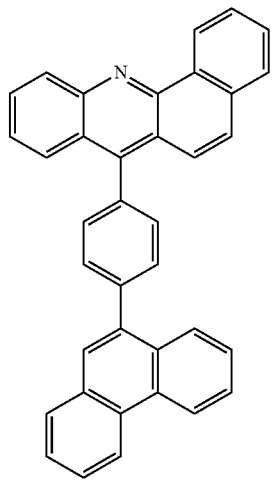 [SMILES: c1ccc2c(c1)cc(-c1ccc(-c3c4ccccc4nc4c3ccc3ccccc34)cc1)c1ccccc12] |
| ETM1-20 | 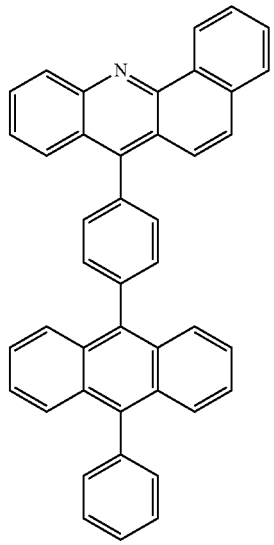 [SMILES: c1ccc(-c2c3ccccc3c(-c3ccc(-c4c5ccccc5nc5c4ccc4ccccc45)cc3)c3ccccc23)cc1] |
| ETM1-21 | 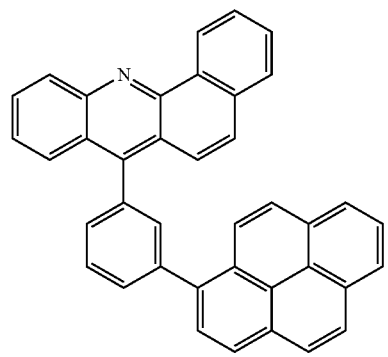 [SMILES: c1cc(-c2c3ccccc3nc3c2ccc2ccccc23)cc(-c2ccc3ccc4cccc5ccc2c3c45)c1] |

TABLE 1-continued
First organic aromatic matrix compounds with a dipole moment ≥0 Debye and ≤2.5 Debye which may be suitable used
| Referred to as: | Structure |
|---|---|
| ETM1-22 | 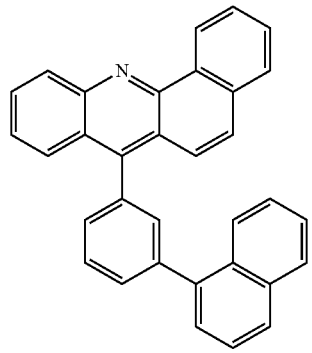 [SMILES: c1cc(-c2cccc3ccccc23)cc(-c2c3ccccc3nc3c2ccc2ccccc23)c1] |
| ETM1-23 | 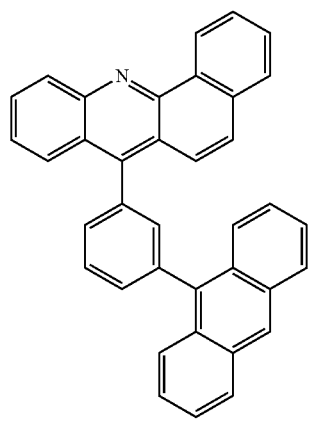 [SMILES: c1cc(-c2c3ccccc3cc3ccccc23)cc(-c2c3ccccc3nc3c2ccc2ccccc23)c1] |
| ETM1-24 | 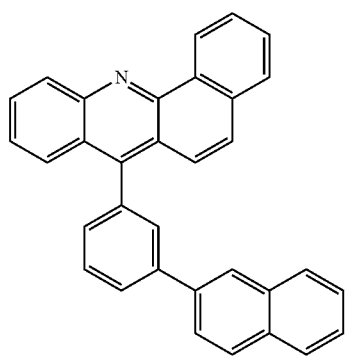 [SMILES: c1cc(-c2ccc3ccccc3c2)cc(-c2c3ccccc3nc3c2ccc2ccccc23)c1] |
| ETM1-25 | 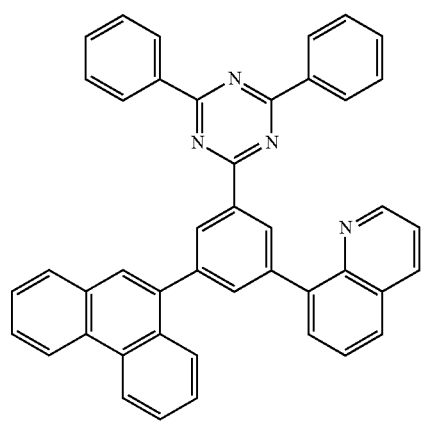 [SMILES: c1ccc(-c2nc(-c3ccccc3)nc(-c3cc(-c4cc5ccccc5c5ccccc45)cc(-c4cccc5cccnc45)c3)n2)cc1] |

TABLE 1-continued
First organic aromatic matrix compounds with a dipole moment ≥0 Debye and ≤2.5 Debye which may be suitable used
| Referred to as: | Structure |
|---|---|
| ETM1-26 | 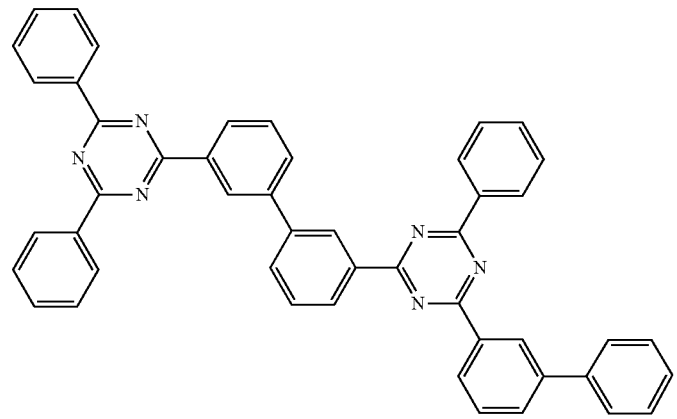 [SMILES: c1ccc(-c2cccc(-c3nc(-c4ccccc4)nc(-c4cccc(-c5cccc(-c6nc(-c7ccccc7)nc(-c7ccccc7)n6)c5)c4)n3)c2)cc1] |
| ETM1-27 | 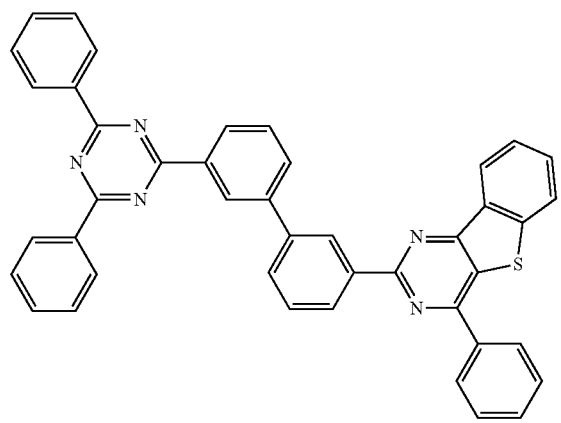 [SMILES: c1ccc(-c2nc(-c3ccccc3)nc(-c3cccc(-c4cccc(-c5nc(-c6ccccc6)c6sc7ccccc7c6n5)c4)c3)n2)cc1] |
| ETM1-28 | 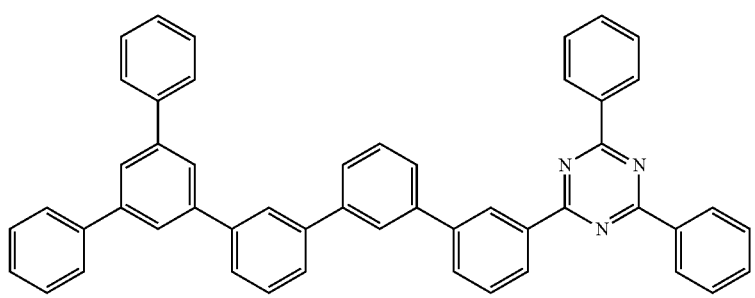 [SMILES: c1ccc(-c2cc(-c3ccccc3)cc(-c3cccc(-c4cccc(-c5cccc(-c6nc(-c7ccccc7)nc(-c7ccccc7)n6)c5)c4)c3)c2)cc1] |
| ETM1-29 | 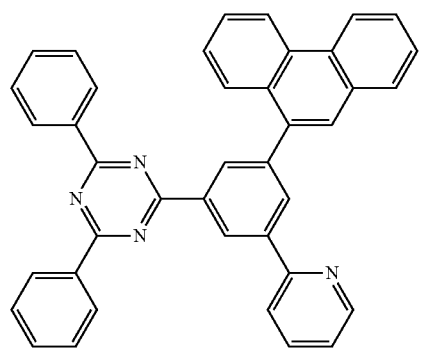 [SMILES: c1ccc(-c2nc(-c3ccccc3)nc(-c3cc(-c4ccccn4)cc(-c4cc5ccccc5c5ccccc45)c3)n2)cc1] |

TABLE 1-continued
First organic aromatic matrix compounds with a dipole moment ≥0 Debye and ≤2.5 Debye which may be suitable used
| Referred to as: | Structure |
| --- | --- |
| ETM1-30 | 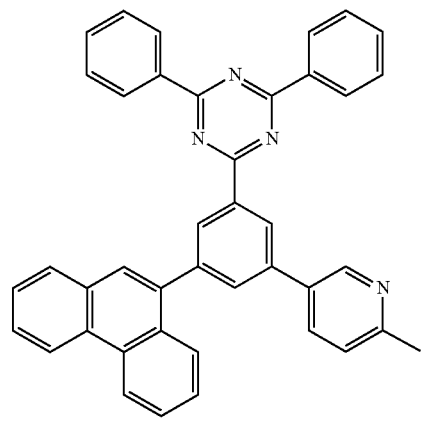 [SMILES: Cc1ccc(-c2cc(-c3nc(-c4ccccc4)nc(-c4ccccc4)n3)cc(-c3cc4ccccc4c4ccccc34)c2)cn1] |
| ETM1-31 | 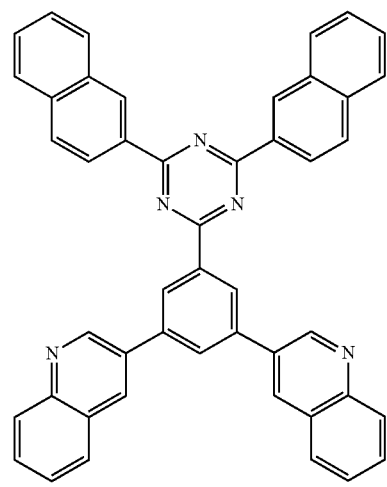 [SMILES: c1ccc2cc(-c3nc(-c4cc(-c5cnc6ccccc6c5)cc(-c5cnc6ccccc6c5)c4)nc(-c4ccc5ccccc5c4)n3)ccc2c1] |
| ETM1-32 | 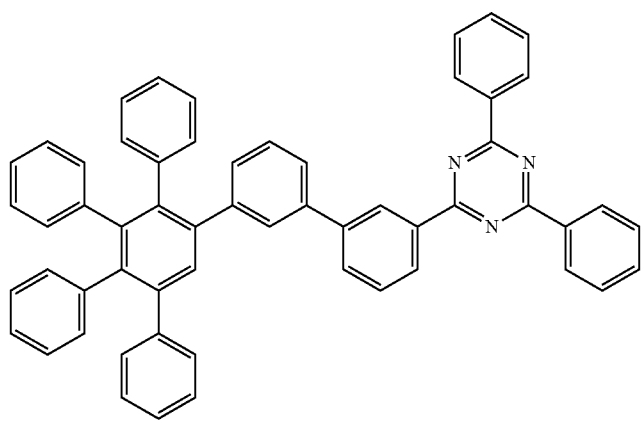 [SMILES: c1ccc(-c2nc(-c3ccccc3)nc(-c3cccc(-c4cccc(-c5cc(-c6ccccc6)c(-c6ccccc6)c(-c6ccccc6)c5-c5ccccc5)c4)c3)n2)cc1] |

TABLE 1-continued
First organic aromatic matrix compounds with a dipole moment ≥0 Debye and ≤2.5 Debye which may be suitable used
| Referred to as: | Structure |
|---|---|
| ETM1-33 | 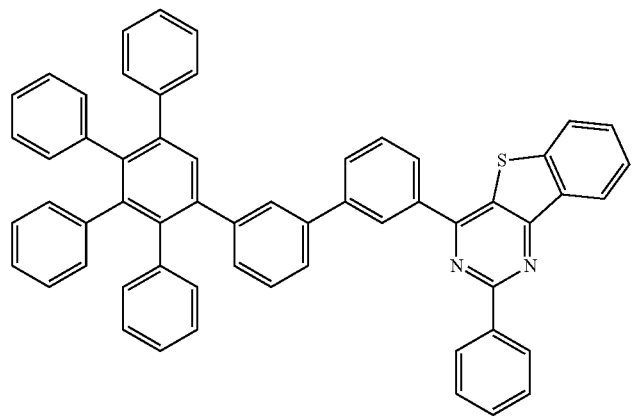 [SMILES: c1ccc(-c2nc(-c3cccc(-c4cccc(-c5cc(-c6ccccc6)c(-c6ccccc6)c(-c6ccccc6)c5-c5ccccc5)c4)c3)c3sc4ccccc4c3n2)cc1] |
| ETM1-34 | 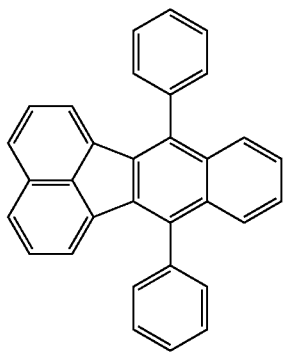 [SMILES: c1ccc(-c2c3c(c(-c4ccccc4)c4ccccc24)-c2cccc4cccc-3c24)cc1] |
| ETM1-35 | 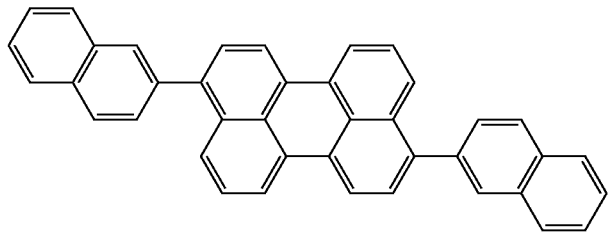 [SMILES: c1ccc2cc(-c3ccc4c5cccc6c(-c7ccc8ccccc8c7)ccc(c7cccc3c74)c65)ccc2c1] |
| ETM1-36 | 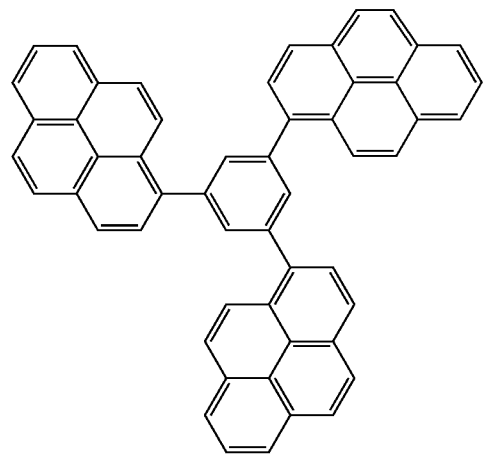 [SMILES: c1cc2ccc3ccc(-c4cc(-c5ccc6ccc7cccc8ccc5c6c78)cc(-c5ccc6ccc7cccc8ccc5c6c78)c4)c4ccc(c1)c2c34] |

TABLE 1-continued

First organic aromatic matrix compounds with a dipole moment ≥0 Debye and ≤2.5 Debye which may be suitable used

| Referred to as: | Structure |
|---|---|
| ETM1-37 | *(structure image)* |

Table 2 below shows the dipole moments of representative examples of the first organic aromatic matrix compound with a dipole moment ≥0 Debye and ≤2.5 Debye.

TABLE 2

| Reference | Name | Structure | Dipole moment/ Debye |
|---|---|---|---|
| ADN | 9,10-di(naphthalen-2-yl)anthracene | *(structure image)* | 0.01 |
| ETM1-2 | Tri(naphthalen-1-yl)borane | *(structure image)* | 0.14 |
| ETM1-8 | bis(2-methylnaphthalen-1-yl)(3-(phenanthren-9-yl)phenyl)borane | *(structure image)* | 0.18 |

TABLE 2-continued

| Reference | Name | Structure | Dipole moment/ Debye |
|---|---|---|---|
| ETM1-15 | 7-(3-(pyren-1-yl)phenyl)dibenzo[c,h]acridine | | 1.80 |
| ETM1-17 | 7-(3-(pyridin-4-yl)phenyl)dibenzo[c,h]acridine | | 2.26 |
| ETM1-18 | 14-(3-(pyren-1-yl)phenyl)dibenzo[a,j]acridine | | 2.50 |
| ETM1-21 | 7-(3-(pyren-1-yl)phenyl)benzo[c]acridine | | 2.13 |

TABLE 2-continued

| Reference | Name | Structure | Dipole moment/ Debye |
|---|---|---|---|
| ETM1-29 | 2-(3-(phenanthren-9-yl)-5-(pyridin-2-yl)phenyl)-4,6-diphenyl-1,3,5-triazine | | 1.76 |
| ETM1-28 | 2,4-diphenyl-6-(5'''-phenyl-[1,1':3',1'':3'',1'''-quinquephenyl]-3-yl)-1,3,5-triazine | | 0.23 |
| ETM1-26 | 2-([1,1'-biphenyl]-3-yl)-4-(3'-(4,6-diphenyl-1,3,5-triazin-2-yl)-[1,1'-biphenyl]-3-yl)-6-phenyl-1,3,5-triazine | | 0.13 |
| ETM1-27 | 2-(3'-(4,6-diphenyl-1,3,5-triazin-2-yl)-[1,1'-biphenyl]-3-yl)-4-phenylbenzo[4,5]thieno[3,2-d]pyrimidine | | 2.0 |

TABLE 2-continued

| Reference | Name | Structure | Dipole moment/ Debye |
|---|---|---|---|
| ETM1-33 | 2-phenyl-4-(4',5',6'-triphenyl-[1,1':2',1":3",1'''-quaterphenyl]-3'''-yl)benzo[4,5]thieno[3,2-d]pyrimidine | | 1.6 |
| ETM1-34 | 7,12-diphenylbenzo[k]fluoranthene (CAS 16391-62-1) | | 0.13 |
| ETM1-35 | 3,9-di(naphthalen-2-yl)perylene (CAS 959611-30-4) | | 0.12 |

In another aspect, the first electron transport layer may comprise a second organic aromatic matrix compound, preferably the second organic aromatic matrix compound is selected from the emitter matrix compound and/or hole-blocking matrix compound.

Polar Organic Aromatic Phosphine Compounds

Examples of polar organic aromatic phosphine compounds are compounds consisting predominantly from covalently bound C, H, O, N, S, P and Se, preferably C, H, O, N and P.

According to a more preferred aspect, the polar organic aromatic phosphine compound is free of metal cations.

According to a more preferred aspect, the polar organic aromatic phosphine compound comprises a conjugated system of at least six, more preferably at least ten delocalized electrons.

Examples of conjugated systems of delocalized electrons are systems of alternating pi- and sigma bonds. Optionally, one or more two-atom structural units having the pi-bond between its atoms can be replaced by an atom bearing at least one lone electron pair, typically by a divalent atom selected from O, S or Se, or by a trivalent atom selected from N or P.

Preferably, the conjugated system of delocalized electrons comprises at least one aromatic or heteroaromatic ring according to the Hückel rule. Also preferably, the polar organic aromatic phosphine compound may comprise at least two aromatic or heteroaromatic rings which are either linked by a covalent bond or condensed.

According to another aspect, the polar organic aromatic phosphine compound is an electron transporting compound. To support electron transport, the polar organic aromatic phosphine compound may be selected from a compound with a triplet level >1 eV and <2.9 eV, preferably >1.2 and <2.8 eV, more preferred >1.3 and <2.7 eV.

According to another aspect, the polar organic aromatic phosphine compound does not participate in electron transport and electron transport is supported by the first organic aromatic matrix compound. The polar organic aromatic phosphine compound may be selected from a compound with a triplet level <3.5 and >2.7 eV, more preferably <3.2 and >2.8 eV, even more preferred <3.5 and >2.9 eV.

According to various aspects, the reduction potential of the polar organic aromatic phosphine compound when measured under the same conditions with cyclic voltammetry in tetrahydrofurane against $Fc^+/Fc$ redox couple is more negative than the reduction potential of 9-phenyl-9H-carbazole-2,7-diyl)bis(diphenylphosphine oxide, preferably more negative than the reduction potential of [1,1':4',1"-terphenyl]-3,5-diylbis(diphenylphosphine oxide) and the same or less negative than the reduction potential of ethane-1,2-diylbis(diphenylphosphine oxide), preferably less negative than the reduction potential of triphenylene.

Under these conditions, the reduction potential of 9-phenyl-9H-carbazole-2,7-diyl)bis(diphenylphosphine oxide is −2.51 V, the reduction potential of [1,1':4',1"-terphenyl]-3,5-diylbis(diphenylphosphine oxide) is −2.58 V, the reduction potential of ethane-1,2-diylbis(diphenylphosphine oxide) is −3.17 V and the reduction potential of triphenylene is −3.04 V.

The LUMO of 9-phenyl-9H-carbazole-2,7-diyl)bis(diphenylphosphine oxide is −2.33 eV, the LUMO of [1,1':4',1"-terphenyl]-3,5-diylbis(diphenylphosphine oxide) is −2.26 eV, the LUMO of ethane-1,2-diylbis(diphenylphosphine oxide) is −1.67 eV and the LUMO of triphenylene is −1.8 eV.

According to another aspect the polar organic aromatic phosphine compound can be selected from the group of organic phosphine oxide compound/s, organic thioxophosphine compound/s or organic selenoxophosphine compound/s.

Preferably, the polar aromatic phosphine compound is selected from a phosphine oxide compound.

According to another aspect there is provided an organic light emitting diode (OLED) wherein the polar organic aromatic phosphine compound of the second electron transport layer has the Formula Ia:

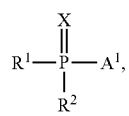

Formula (Ia)

wherein:
X is selected from O, S, Se;
$R^1$ and $R^2$ are independently selected from $C_1$ to $C_{12}$ alkyl, substituted or unsubstituted $C_6$ to $C_{20}$ aryl and substituted or unsubstituted $C_5$ to $C_{20}$ heteroaryl; or $R^1$ and $R^2$ are bridged with an alkene-di-yl group forming with the P atom a substituted or unsubstituted five, six or seven member ring; and
$A^1$ is phenyl or selected from Formula (II):

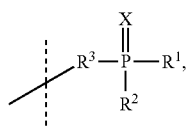

Formula (II)

wherein
$R^3$ is selected from $C_1$ to $C_8$ alkane-di-yl, substituted or unsubstituted $C_6$ to $C_{20}$ arylene and substituted or unsubstituted $C_5$ to $C_{20}$ heteroarylene; or $A^1$ is selected from Formula (III)

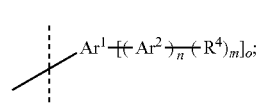

Formula (III)

wherein
n is selected from 0 or 1;
m is selected from 1 or 2;
o is selected from 1 or 2;
and m is 1 if o is 2;
$Ar^1$ is selected from substituted or unsubstituted $C_6$ to $C_{20}$ arylene and substituted or unsubstituted $C_5$ to $C_{20}$ heteroarylene;
$Ar^2$ is selected from substituted or unsubstituted $C_{18}$ to $C_{40}$ arylene and substituted or unsubstituted $C_{10}$ to $C_{40}$ heteroarylene;
$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl.

According to another aspect there is provided an organic light emitting diode (OLED) wherein organic light emitting diode comprising:
at least one anode electrode;
at least one emission layer, wherein the emission layer comprises at least one emitter dopant that emits visible light at operation of the OLED;
an electron transport layer stack of at least two electron transport layers, and wherein
a) the first electron transport layer comprises i) a first organic aromatic matrix compound having a MW of about ≥400 to about ≤1000 and a dipole moment of about ≥0 Debye and about ≤2.5 Debye, wherein the first electron transport layer is free of a polar organic aromatic phosphine compound; and
b) the second electron transport layer comprises two organic aromatic matrix compounds, which are a mixture of:
i) the first organic aromatic matrix compound; and
ii) a polar organic aromatic phosphine compound having a MW of about ≥400 to about ≤1000, and a dipole moment of about >2.5 Debye and about ≤10 Debye, wherein the polar organic aromatic phosphine compound has the Formula Ia:

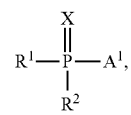

Formula (Ia)

wherein:
X is selected from O, S, Se;
$R^1$ and $R^2$ are independently selected from $C_1$ to $C_{12}$ alkyl, substituted or unsubstituted $C_6$ to $C_{20}$ aryl and substituted or unsubstituted $C_5$ to $C_{20}$ heteroaryl; or $R^1$ and $R^2$ are bridged with an alkene-di-yl group forming with the P atom a substituted or unsubstituted five, six or seven member ring; and $A^1$ is phenyl or selected from Formula (II):

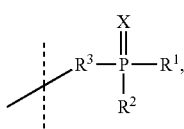

Formula (II)

wherein
$R^3$ is selected from $C_1$ to $C_8$ alkane-di-yl, substituted or unsubstituted $C_6$ to $C_{20}$ arylene and substituted or unsubstituted $C_5$ to $C_{20}$ heteroarylene; or
$A^1$ is selected from Formula (III)

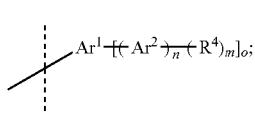

Formula (III)

wherein
n is selected from 0 or 1;
m is selected from 1 or 2;
is selected from 1 or 2;
and m is 1 if o is 2;
$Ar^1$ is selected from substituted or unsubstituted $C_6$ to $C_{20}$ arylene and substituted or unsubstituted $C_5$ to $C_{20}$ heteroarylene;
$Ar^2$ is selected from substituted or unsubstituted $C_{18}$ to $C_{40}$ arylene and substituted or unsubstituted $C_{10}$ to $C_{40}$ heteroarylene;
$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl; and
at least one cathode electrode layer; wherein
the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer.

According to another aspect there is provided an organic light emitting diode (OLED) wherein the polar organic aromatic phosphine compound has the Formula Ia:

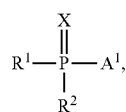

Formula (Ia)

wherein:
X is selected from O, S, Se;
$R^1$ and $R^2$ are independently selected from $C_1$ to $C_{12}$ alkyl, substituted or unsubstituted $C_6$ to $C_{20}$ aryl and substituted or unsubstituted $C_5$ to $C_{20}$ heteroaryl; or $R^1$ and $R^2$ are bridged with an alkene-di-yl group forming with the P atom a substituted or unsubstituted five, six or seven member ring; and $A^1$ is phenyl or selected from Formula (II):

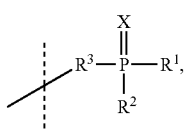

Formula (II)

wherein
$R^3$ is selected from $C_1$ to $C_8$ alkane-di-yl, substituted or unsubstituted $C_6$ to $C_{20}$ arylene and substituted or unsubstituted $C_5$ to $C_{20}$ heteroarylene; or
$A^1$ is selected from Formula (III)

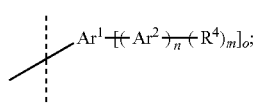

Formula (III)

wherein
n is selected from 0 or 1;
m is selected from 1 or 2;
o is selected from 1 or 2;
and m is 1 if o is 2;
$Ar^1$ is selected from substituted or unsubstituted $C_6$ to $C_{20}$ arylene and substituted or unsubstituted $C_5$ to $C_{20}$ heteroarylene;
$Ar^2$ is selected from substituted or unsubstituted $C_{18}$ to $C_{40}$ arylene and substituted or unsubstituted $C_{10}$ to $C_{40}$ heteroarylene;
$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl.

According to another aspect there is provided an organic light emitting diode (OLED), wherein in Formula Ia the substituent X is selected from O.

According to another aspect the polar organic aromatic phosphine compound according to general Formula Ia, wherein o can be 1 or 2:
o=2, the polar organic aromatic phosphine compound is a compound having the Formula Ib:

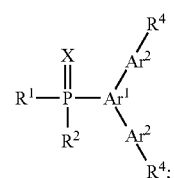

(Ib)

or
o=1 the polar organic aromatic phosphine compound is a compound having the Formula Ic, Id, Ie or If:

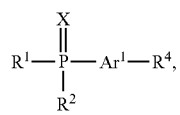

(Ic)

-continued

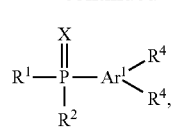
(Id)

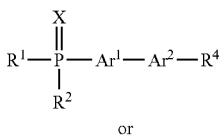
(Ie)

or

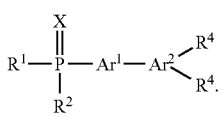
(If)

According to another aspect the polar organic aromatic phosphine compound can be selected from Formula Ib:

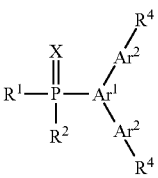
Formula (Ib)

wherein:
X is selected from O, S, Se;
$R^1$ and $R^2$ are independently selected from $C_1$ to $C_{12}$ alkyl, substituted or unsubstituted $C_6$ to $C_{20}$ aryl and substituted or unsubstituted $C_5$ to $C_{20}$ heteroaryl; or $R^1$ and $R^2$ are bridged with an alkene-di-yl group forming with the P atom a substituted or unsubstituted five, six or seven member ring; and
$Ar^1$ is selected from substituted or unsubstituted $C_6$ to $C_{20}$ arylene and substituted or unsubstituted $C_5$ to $C_{20}$ heteroarylene;
$Ar^2$ is selected from substituted or unsubstituted $C_{18}$ to $C_{40}$ arylene and substituted or unsubstituted $C_{10}$ to $C_{40}$ heteroarylene;
$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl.

According to another aspect the polar organic aromatic phosphine compound can be selected from the group comprising a polar organic aromatic phosphine compound of Formula Ic and/or Id:

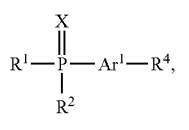
(Ic)

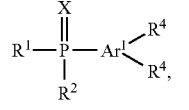
(Id)

wherein:
X is selected from O, S, Se;
$R^1$ and $R^2$ are independently selected from $C_1$ to $C_{12}$ alkyl, substituted or unsubstituted $C_6$ to $C_{20}$ aryl and substituted or unsubstituted $C_5$ to $C_{20}$ heteroaryl; or $R^1$ and $R^2$ are bridged with an alkene-di-yl group forming with the P atom a substituted or unsubstituted five, six or seven member ring; and
$A^1$ is selected from substituted or unsubstituted $C_6$ to $C_{20}$ arylene and substituted or unsubstituted $C_5$ to $C_{20}$ heteroarylene;
$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl.

According to another aspect the polar organic aromatic phosphine compound can be selected from the group comprising a polar organic aromatic phosphine compound of Formula Id or If:

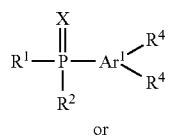
(Id)

or

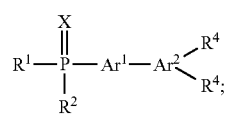
(If)

wherein:
X is selected from O, S, Se;
$R^1$ and $R^2$ are independently selected from $C_1$ to $C_{12}$ alkyl, substituted or unsubstituted $C_6$ to $C_{20}$ aryl and substituted or unsubstituted $C_5$ to $C_{20}$ heteroaryl; or $R^1$ and $R^2$ are bridged with an alkene-di-yl group forming with the P atom a substituted or unsubstituted five, six or seven member ring; and
$Ar^1$ is selected from substituted or unsubstituted $C_6$ to $C_{20}$ arylene and substituted or unsubstituted $C_5$ to $C_{20}$ heteroarylene;
$Ar^2$ is selected from substituted or unsubstituted $C_{18}$ to $C_{40}$ arylene and substituted or unsubstituted $C_{10}$ to $C_{40}$ heteroarylene;
$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl.

According to another aspect $Ar^1$ and $Ar^2$ of the polar organic aromatic phosphine compound, preferably organic aromatic phosphine oxide compound, according to Formula Ia may be defined, wherein
$Ar^1$ is selected from substituted $C_6$ to $C_{20}$ arylene, and/or substituted $C_5$ to $C_{20}$ heteroarylene, wherein the $C_6$ to $C_{20}$ arylene, and/or $C_5$ to $C_{20}$ heteroarylene is substituted with at least one $C_1$ to $C_{12}$ alkyl and/or at least one $C_1$ to $C_{12}$ heteroalkyl group; and
$Ar^2$ is selected from substituted $C_{18}$ to $C_{40}$ arylene and/or substituted $C_{10}$ to $C_{40}$ heteroarylene, wherein the $C_{18}$ to $C_{40}$ arylene and/or $C_{10}$ to $C_{40}$ heteroarylene is substituted with at least one $C_1$ to $C_{12}$ alkyl and/or at least one $C_1$ to $C_{12}$ heteroalkyl group; or
preferably $Ar^1$=substituted $C_6$ to $C_{20}$ arylene and/or substituted $C_5$ to $C_{20}$ heteroarylene, wherein the $C_6$ to $C_{20}$ arylene and/or $C_5$ to $C_{20}$ heteroarylene is substituted with at least one $C_1$ to $C_6$ alkyl and/or $C_1$ to $C_6$ heteroalkyl group; and $Ar^2$=substituted $C_{18}$ to $C_{40}$ arylene and/or substituted $C_{10}$ to $C_{40}$ heteroarylene, wherein the $C_{18}$ to $C_{40}$ arylene and/or $C_{10}$ to $C_{40}$ heteroarylene is substituted with at least one $C_1$ to $C_6$ alkyl and/or $C_1$ to $C_6$ heteroalkyl group; or more preferred $Ar^1$=substituted $C_6$ to $C_{20}$ arylene and/or substituted $C_5$ to $C_{20}$ heteroarylene, wherein the $C_6$ to $C_{20}$ arylene and/or $C_5$ to $C_{20}$ heteroarylene is substituted with at least one $C_1$ to $C_4$ alkyl and/or $C_1$ to $C_4$ heteroalkyl group; and $Ar^2$=substituted $C_{18}$ to $C_{40}$ arylene and/or substituted $C_{10}$ to $C_{40}$ heteroarylene, wherein the $C_{18}$ to $C_{40}$ arylene and/or $C_{10}$ to $C_{40}$ heteroarylene is substituted with at least one $C_1$ to $C_4$ alkyl and/or $C_1$ to $C_4$ heteroalkyl group.

According to another aspect $R^1$ to $R^4$ of the polar organic aromatic phosphine compound, preferably organic aromatic phosphine oxide compound, according to Formula Ia may be defined, wherein $R^1$ and $R^2$ are independently selected from substituted $C_6$ to $C_{20}$ aryl, and/or substituted $C_5$ to $C_{20}$ heteroaryl, wherein the $C_6$ to $C_{20}$ aryl, and/or $C_5$ to $C_{20}$ heteroaryl is substituted with at least one $C_1$ to $C_{12}$ alkyl and/or at least one $C_1$ to $C_{12}$ heteroalkyl group, and preferably $R^1$ and $R^2$ is selected the same; and/or $R^3$ is independently selected from substituted $C_6$ to $C_{20}$ arylene, and/or substituted $C_5$ to $C_{20}$ heteroarylene, wherein the $C_6$ to $C_{20}$ arylene, and/or $C_5$ to $C_{20}$ heteroarylene is substituted with at least one $C_1$ to $C_{12}$ alkyl and/or at least one $C_1$ to $C_{12}$ heteroalkyl group, and/or $R^4$ is independently selected from substituted $C_6$ to $C_{20}$ aryl, and/or substituted $C_5$ to $C_{20}$ heteroaryl, wherein the $C_6$ to $C_{20}$ aryl, and/or $C_5$ to $C_{20}$ heteroaryl is substituted with at least one $C_1$ to $C_{12}$ alkyl and/or at least one $C_1$ to $C_{12}$ heteroalkyl group.

According to another aspect $R^1$ to $R^4$, X, n, m, $Ar^1$ and $Ar^2$ of the polar organic aromatic phosphine compound, preferably organic aromatic phosphine oxide compound, according to Formula Ia may be defined, wherein $R^1$ and $R^2$ is independently selected from $C_1$ to $C_4$ alkyl, unsubstituted or substituted $C_6$ to $C_{10}$ aryl or unsubstituted or substituted $C_5$ to $C_{10}$ heteroaryl; preferably $R^1$ and $R^2$ is independently selected from methyl, phenyl, naphthyl, phenanthryl, pyrenyl or pyridyl; further preferred $R^1$ and $R^2$ are independently selected from methyl, phenyl and pyridyl; and more preferred $R^1$ and $R^2$ is selected the same; and/or X is O or S, and preferably O; and/or $R^3$ is selected from $C_1$ to $C_6$ alkane-di-yl, unsubstituted or substituted $C_6$ to $C_{10}$ arylene or unsubstituted or substituted $C_5$ to $C_{10}$ heteroarylene, and preferably selected from $C_1$ to $C_4$ alkane-di-yl; and/or $R^4$ is selected from H, phenyl, biphenyl, terphenyl, fluorenyl, naphthyl, anthranyl, phenantryl, pyrenyl, carbazoyl, dibenzofuranyl, dinapthofuranyl, preferably H, phenyl, biphenyl or naphthyl, and more preferred H; and/or n is 0 or 1, and preferably n is 1, preferably for n=2 than $Ar^1$ is phenyl, and more preferred for n=1, $R^1$ and $R^2$ are phenyl and $R^4$ is H;

m is 1 or 2 if n is 0 or 1, and m is 2 if n is 2; and/or $Ar^1$ is preferably selected from phenylene, biphenylene, terphenylene, naphthylene, fluorenylene, pyridylene, quinolinylene, and pyrimidinylene; and/or $Ar^2$ is selected from fluorenylene, anthranylene, pyrenylene, phenanthrylene, carbazoylene, benzo[c]acridinylene, dibenzo[c,h]acridinylene, dibenzo[a,j]acridinylene.

According to another aspect $R^1$ to $R^4$, $Ar^1$ and $Ar^2$ of the polar organic aromatic phosphine compound, preferably organic aromatic phosphine oxide compound, according to Formula Ia may be defined, wherein $R^1$, $R^2$, $R^3$, $R^4$, $Ar^1$ and/or $Ar^2$ are unsubstituted.

According to another aspect $R^1$ and $R^2$ of the polar organic aromatic phosphine compound, preferably organic aromatic phosphine oxide compound, according to Formula Ia may be independently selected from $C_1$ to $C_{12}$ alkyl, preferably $C_1$ to $C_8$, even more preferred $C_1$ to $C_6$, and may be most preferred $C_1$ to $C_4$.

According to another aspect $R^4$ of the polar organic aromatic phosphine compound, preferably organic aromatic phosphine oxide compound, according to Formula Ia may be selected from $C_1$ to $C_{12}$ alkyl, preferably $C_1$ to $C_8$, even more preferred $C_1$ to $C_6$, most preferred $C_1$ to $C_4$.

According to another aspect $Ar^2$ of the polar organic aromatic phosphine compound, preferably organic aromatic phosphine oxide compound, according to Formula Ia may be defined, wherein $Ar^2$ is selected from a substituent according to Formula IVa to IVh:

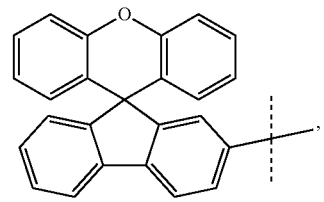

(IVa)

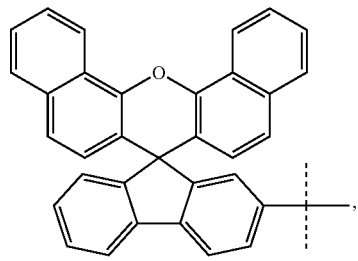

(IVb)

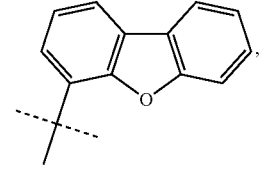

(IVc)

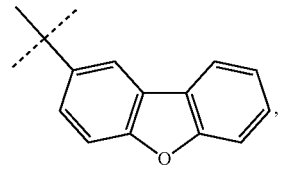

(IVd)

-continued (IVe)

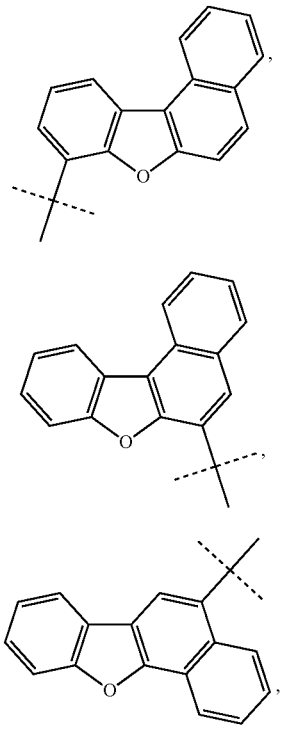

(IVf)

(IVg)

-continued (IVh)

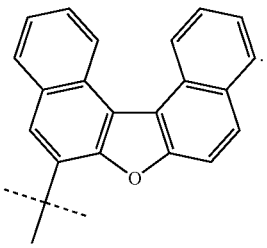

According to another aspect, the polar organic aromatic phosphine compound of Formula (Ia) is defined, wherein $A^1$ is selected from Formula (II).

Preferably, $R^3$ is selected from $C_1$ to $C_6$ alkane-di-yl, unsubstituted or substituted $C_6$ to $C_{10}$ arylene or unsubstituted or substituted $C_5$ to $C_{10}$ heteroarylene, and preferably selected from $C_1$ to $C_4$ alkane-di-yl.

Preferred examples are shown in Table 3 below. These compounds have been found to have particularly beneficial effect on operating voltage, external quantum efficiency (EQE) and/or lifetime.

TABLE 3

Organic aromatic phosphine oxide compounds of Formula (Ia) wherein $A^1$ is Formula (II)

| Name | Structure |
| --- | --- |
| ethane-1,2-diylbis(diphenylphosphine oxide) | |
| butane-1,4-diylbis(diphenylphosphine oxide) | |

TABLE 3-continued

Organic aromatic phosphine oxide compounds of Formula (Ia) wherein $A^1$ is Formula (II)

| Name | Structure |
|---|---|
| ethane-1,2-diylbis(di(naphthalen-2-yl)phosphine oxide) | |
| (9-phenyl-9H-carbazole-2,7-diyl)bis(diphenylphosphine oxide) | |
| [1,1':4',1''-terphenyl]-3,5-diylbis(diphenylphosphine oxide) | |
| [1,1'-binaphthalene]-2,2'-diylbis(diphenylphosphine oxide) | |

According to another aspect, the polar organic aromatic phosphine compound of Formula (Ia), wherein $A^1$ can be selected from Formula (III). Preferably, o is 1 and n is 0 or 1 and m is 1 or 2. The molecular weight of these compounds is in a range which is particularly suitable for vacuum deposition and particularly low operating voltages, high efficiencies and/or long lifetime are achieved. Particularly preferred examples are shown in Table 4 below.

TABLE 4

Organic aromatic phosphine oxide compounds of Formula (Ia) wherein $A^1$ is Formula (III)

| Name | Structure |
| --- | --- |
| (4-(anthracen-9-yl)phenyl)diphenylphosphine oxide | |
| (3-(phenanthren-9-yl)phenyl)diphenylphosphine oxide | |
| (4-(phenanthren-9-yl)phenyl)diphenylphosphine oxide | |
| (3-(phenanthren-9-yl)phenyl)diphenylphosphine oxide | |
| diphenyl(3-(pyren-1-yl)phenyl)phosphine oxide | |
| diphenyl(4'-(pyren-1-yl)-[1,1'-biphenyl]-3-yl)phosphine oxide | |

TABLE 4-continued

Organic aromatic phosphine oxide compounds of Formula (Ia) wherein A¹ is Formula (III)

| Name | Structure |
| --- | --- |
| diphenyl(3'-(pyren-1-yl)-[1,1'-biphenyl]-3-yl)phosphine oxide | |
| diphenyl(3'-(pyren-1-yl)-[1,1'-biphenyl]-4-yl)phosphine oxide | |
| diphenyl(3''-(pyren-1-yl)-[1,1':4',1''-terphenyl]-3-yl)phosphine oxide | |
| (3-(dinaphtho[2,1-b:1',2'-d]furan-6-yl)phenyl)diphenylphosphine oxide | |
| diphenyl(4-(9-phenyl-9H-carbazol-3-yl)phenyl)phosphine oxide | |

TABLE 4-continued

Organic aromatic phosphine oxide compounds of Formula (Ia) wherein A¹ is Formula (III)

| Name | Structure |
|---|---|
| (3',5'-di(pyren-1-yl)-[1,1'-biphenyl]-3-yl)diphenylphosphine oxide | 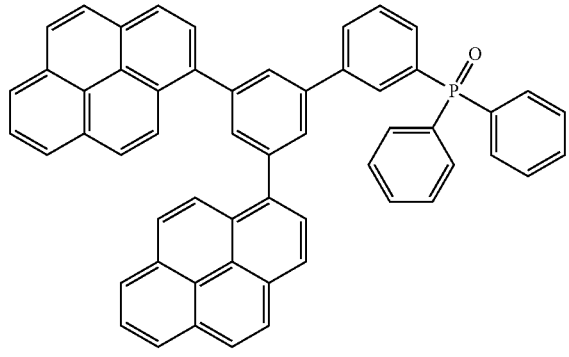 [SMILES: O=P(c1ccccc1)(c1ccccc1)c1cccc(-c2cc(-c3ccc4ccc5cccc6ccc3c4c56)cc(-c3ccc4ccc5cccc6ccc3c4c56)c2)c1] |

In another preferred embodiment, o is 2 and n is 0 or 1 and m is 1. The crystallinity of these compounds is reduced and low operating voltages are achieved. Particularly preferred examples are shown in Table 4 above.

Polar organic aromatic phosphine compound that can be suitable used for the polar organic aromatic phosphine compound comprising electron transport layer/s, may have the Formula (Ia), wherein A¹ is phenyl and R¹ and R² are bridged with an alkene-di-yl group forming with the P atom a five and seven membered ring. These polar organic aromatic phosphine compounds may provide high glass transition temperature Tg and particularly low operating voltage, high external quantum efficiency (EQE) and/or long lifetime. Particularly preferred are the polar organic aromatic phosphine compounds that are shown in Table 5.

TABLE 5

Phosphine oxide compounds of Formula (Ia),
wherein R¹ and R² are bridged with an alkene-di-yl group
forming with the P atom a five and seven membered ring

| Name | Structure |
|---|---|
| 3-Phenyl-3H-benzo[b]dinaphtho[2,1-d:1',2'-f]phosphepine-3-oxide | 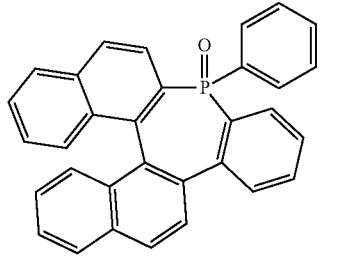 [SMILES: O=P1(c2ccccc2)c2ccccc2-c2ccc3ccccc3c2-c2c1ccc1ccccc21] |
| 1,2,3,4,5-pentaphenylphosphole 1-oxide | 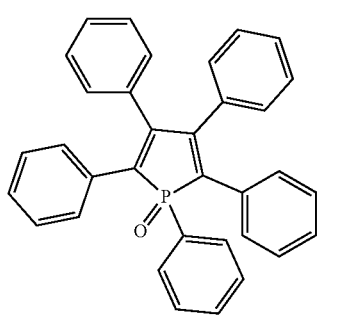 [SMILES: O=P1(c2ccccc2)C(c2ccccc2)=C(c2ccccc2)C(c2ccccc2)=C1c1ccccc1] |

TABLE 5-continued

Phosphine oxide compounds of Formula (Ia),
wherein R¹ and R² are bridged with an alkene-di-yl group
forming with the P atom a five and seven membered ring

| Name | Structure |
|---|---|
| 5-phenylbenzo[b]phosphindole 5-oxide | 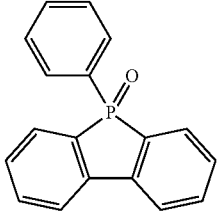 [SMILES: O=P1(c2ccccc2)c2ccccc2-c2ccccc21] |

According to another aspect the organic aromatic phosphine oxide compound according to the invention may be selected from a compound according to Formula A1 to A27:

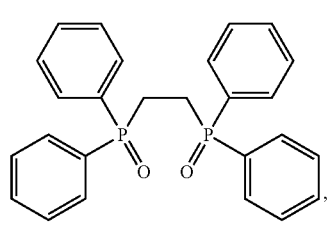

(A1)

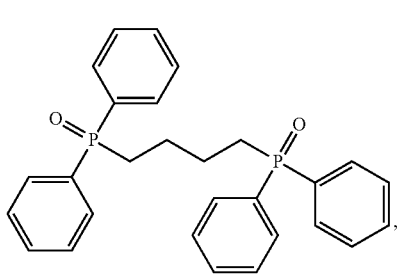

(A2)

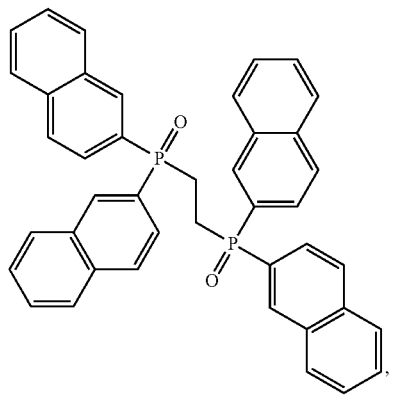
(A3)
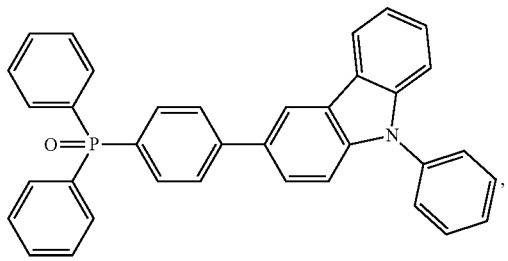
(A7)
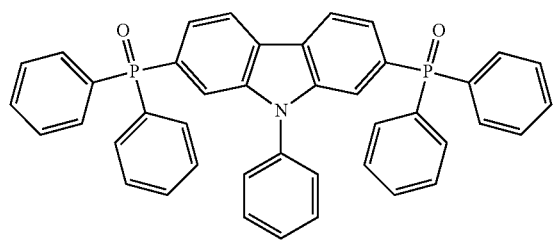
(A4)
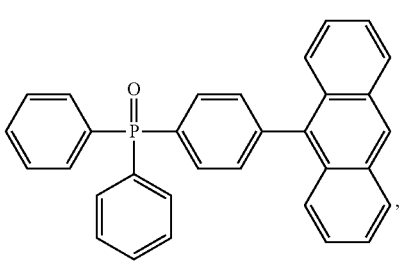
(A8)
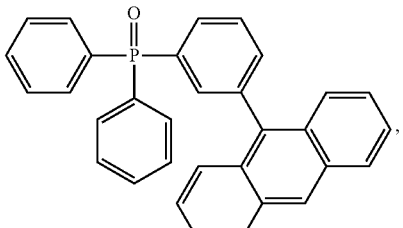
(A9)
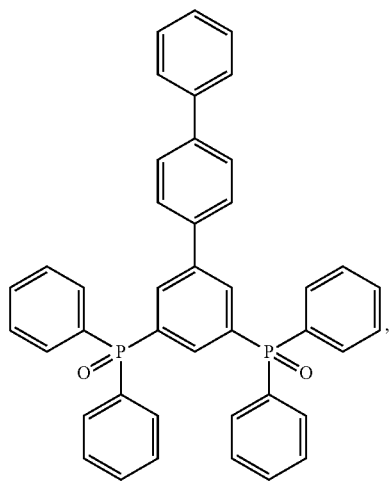
(A5)
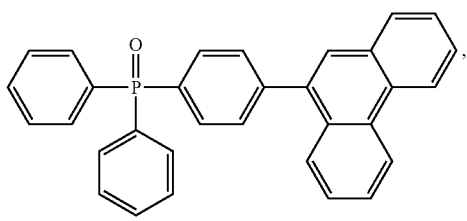
(A10)
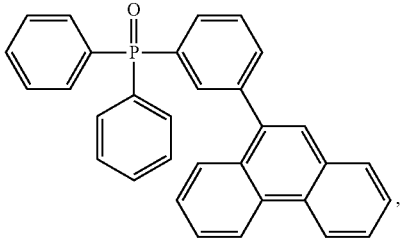
(A11)
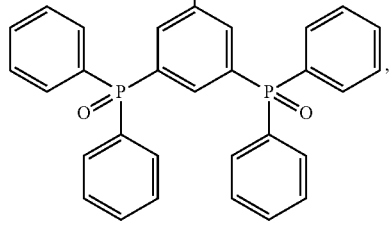
(A6)
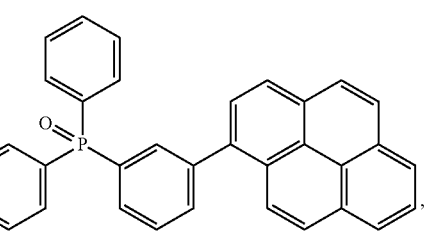
(A12)

(A13)
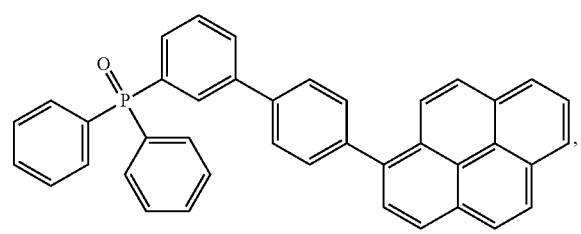
(A14)
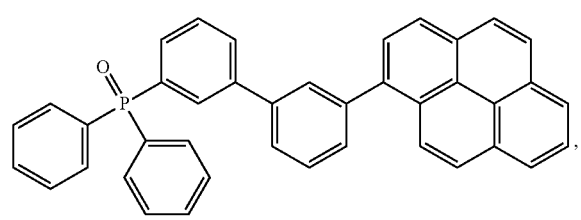
(A15)
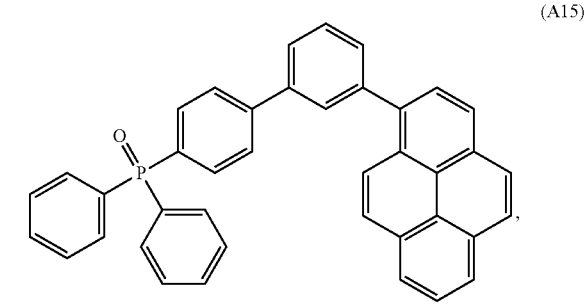
(A16)
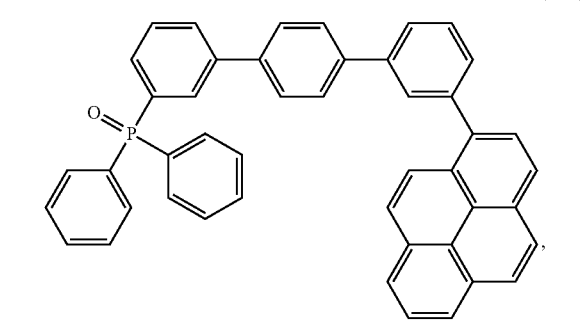
(A17)
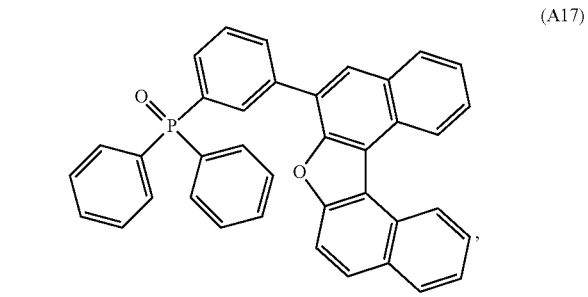
(A18)
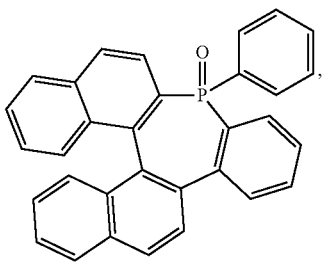
(A19)
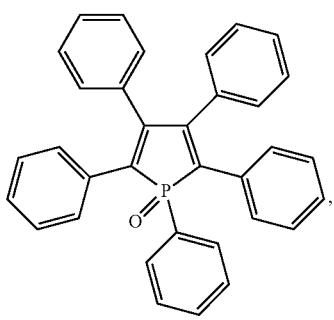
(A20)
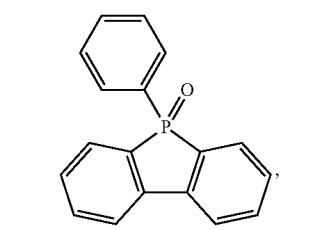
(A21)
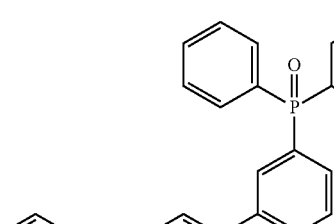
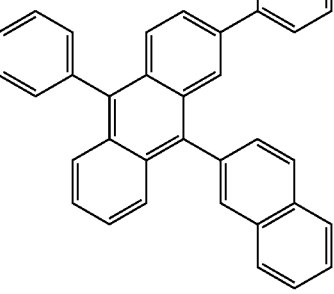

(A22)
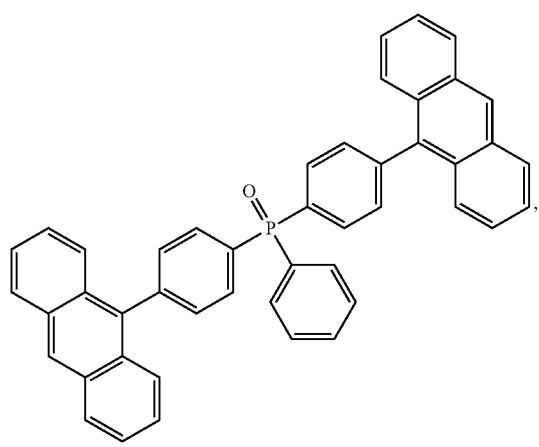
(A23)
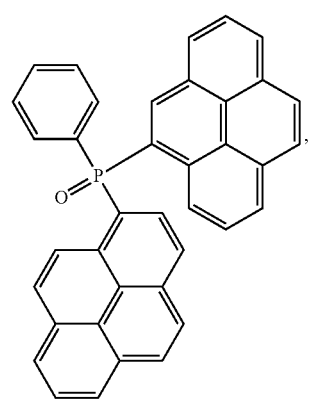
(A24)
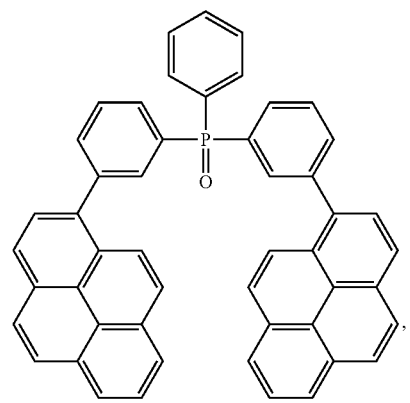
(A25)
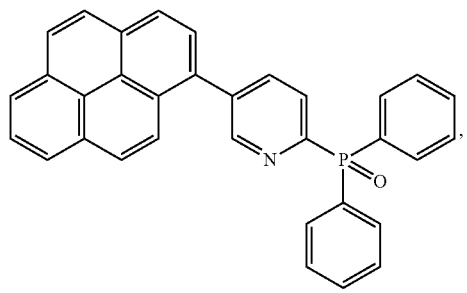
(A26)
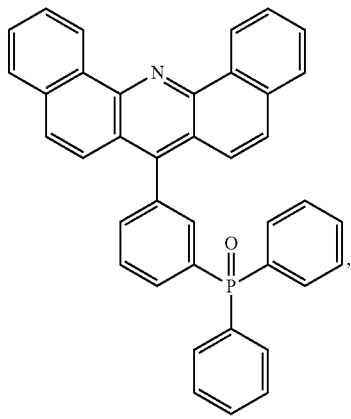
(A27)
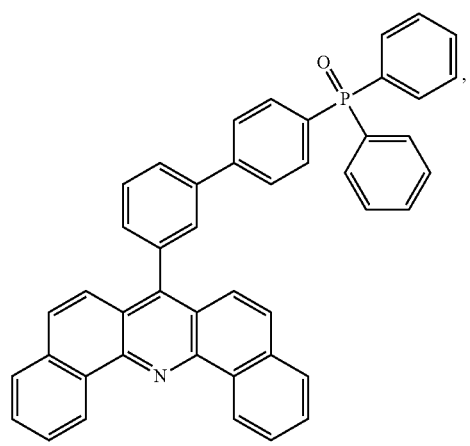
(A28)
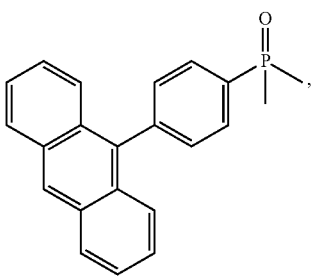
(A29)
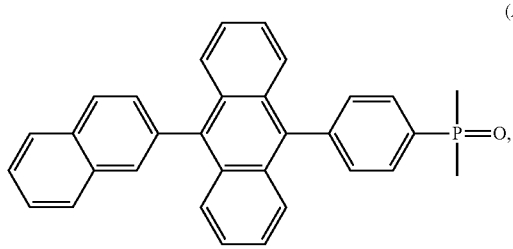
(A30)
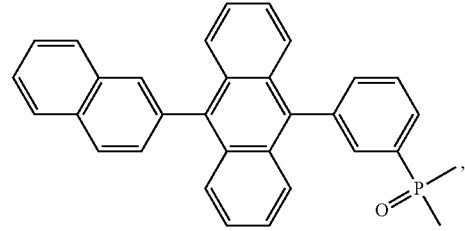

-continued
(A31)
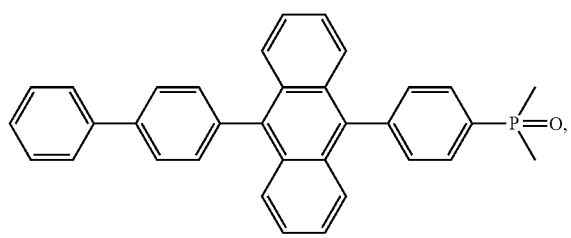
(A32)
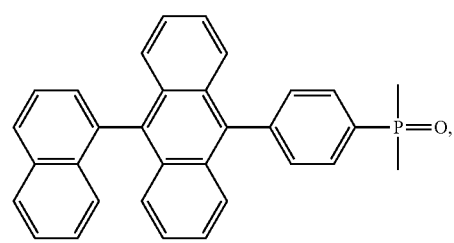
(A33)
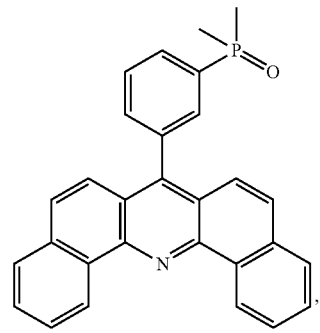
(A34)
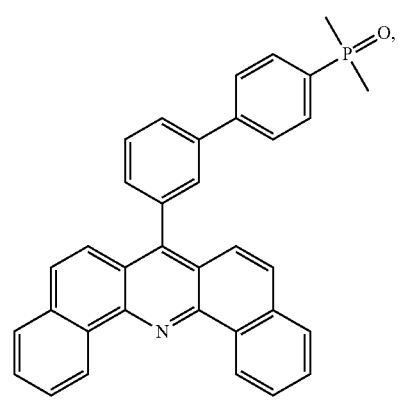
-continued
(A35)
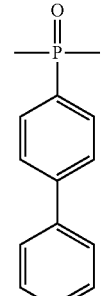
(A36)
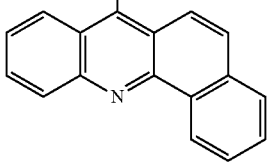
(A37)
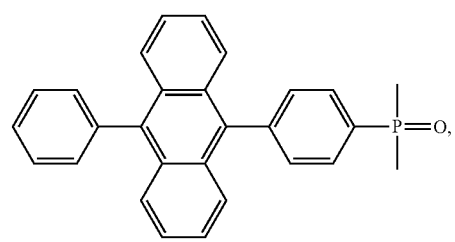
(A38)
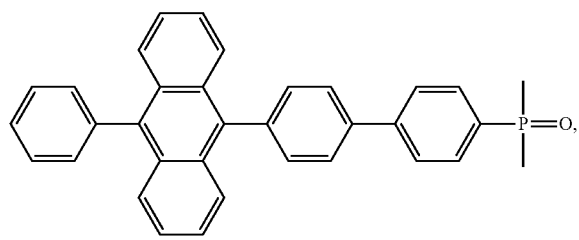
(A39)
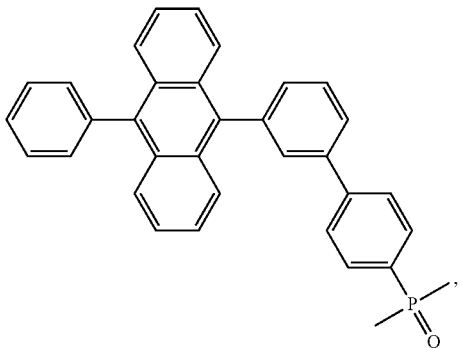

-continued (A40)

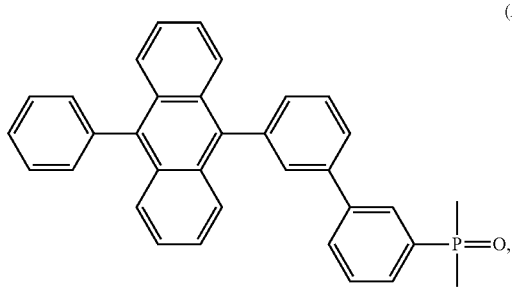

(A41)

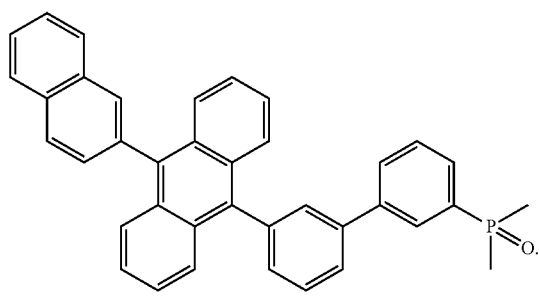

It is further preferred that the organic aromatic phosphine oxide compounds are substituted with a $C_6$-$C_{40}$ aryl, $C_5$-$C_{40}$ heteroaryl and/or $C_1$-$C_{12}$ alkyl groups, preferably (3-(dibenzo[c,h]acridin-7-yl)phenyl)diphenylphosphine oxide, 3-phenyl-3H-benzo[b]di-naphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl) diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl) phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide.

According to another aspect, the polar organic aromatic phosphine compound is not an emitter dopant and does not emit visible light at operation of the OLED.

According to another aspect, the polar organic aromatic phosphine compound is not an emitter matrix compound.

According to another embodiment of the electron transport layer stack:

the first organic aromatic matrix compounds with a dipole moment ≥0 Debye and ≤2.5 Debye can be selected from the compounds below:

ETM1-1

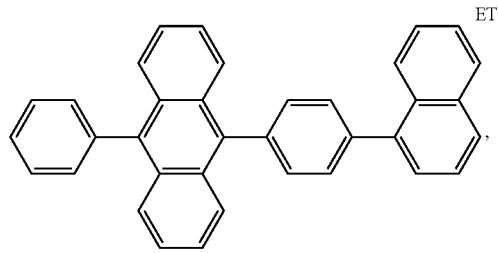

ETM1-15

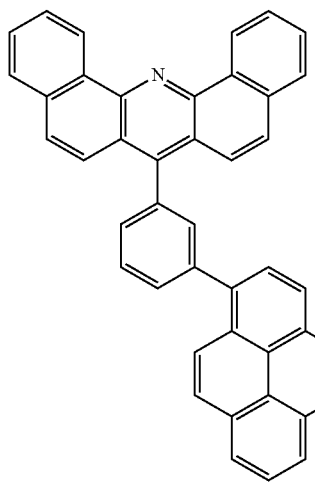

, and

ETM1-32

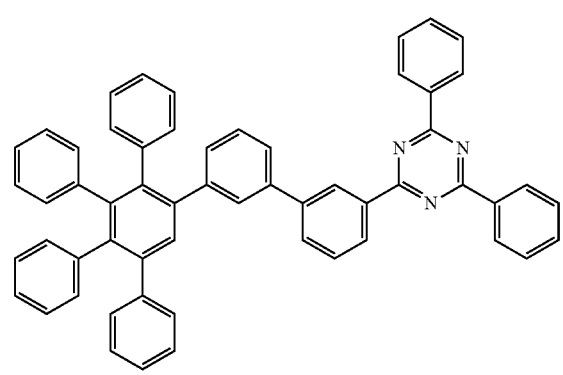

.

the polar organic aromatic phosphine compound can be:

A18

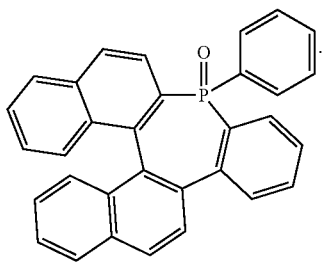

.

Non-Emitter Dopant

According to various embodiments of the OLED of the present invention, the first electron transport layer (161) is free of a non-emitter dopant and the second electron transport layer (162) comprises a non-emitter dopant, wherein the non-emitter dopant is a metal compound, preferably the metal compound is selected from the group comprising a metal halide, a metal organic complex and/or a zero-valent metal.

According to various embodiments of the OLED of the present invention, the metal halide may be selected from the group comprising halide wherein the metal is selected from the group comprising Li, Na, K, Cs, Mg, Ca, Ba; and the halide is selected from the group comprising F, Cl, Br and J; and preferably a lithium halide.

The lithium halide may be selected from the group comprising a LiF, LiCl, LiBr or LiJ, and preferably LiF.

According to various embodiments of the OLED of the present invention, the metal organic complex may be selected from the group of metal quinolate, a metal borate, a metal phenolate and/or a metal Schiff base.

Preferably the metal organic complex may be an alkali organic complex, preferably a lithium organic complex.

Preferably the lithium organic complex can be selected from the group of a lithium quinolate, a lithium borate, a lithium phenolate and/or a lithium Schiff base, preferably of a lithium quinolate complex has the formula I, II or III:

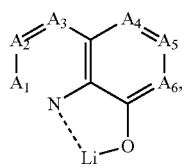
(I)

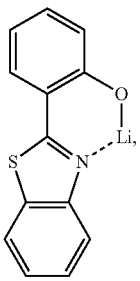
(II)

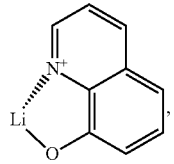
(III)

wherein
$A_1$ to $A_6$ are same or independently selected from CH, CR, N, O,
R is same or independently selected from hydrogen, halogen, alkyl or aryl or heteroaryl with 1 to 20 carbon atoms, and more preferred of a lithium 8-hydroxyquinolate.

According to various embodiments of the organic electroluminescent device of the present invention the organic ligand of the lithium organic complex can be a borate based organic ligand.

Preferably, the lithium organic complex is a compound of formula (VII)

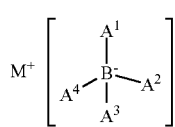
(VII)

wherein M is an alkali metal ion, each of $A^1$-$A^4$ is independently selected from substituted or unsubstituted $C_6$-$C_{20}$ aryl or substituted or unsubstituted $C_2$-$C_{20}$ heteroaryl.

Preferably, the alkali organic complex is a complex of formula (VIII)

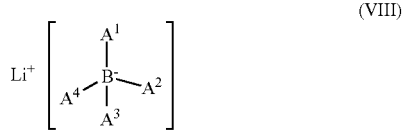
(VIII)

wherein each of $A^1$-$A^4$ is independently selected from substituted or unsubstituted $C_6$-$C_{20}$ aryl or substituted or unsubstituted $C_2$-$C_{20}$ heteroaryl.

Preferably the lithium organic complex is a lithium tetra (1H-pyrazol-1-yl)borate. Borate based organic ligands that can be suitable used are disclosed in WO 2013079676 A1.

According to various embodiments of the organic electroluminescent device of the present invention the organic ligand of the lithium organic complex can be a phenolate ligand. According to various embodiments of the organic electroluminescent device of the present invention the organic ligand of the lithium organic complex can be a phosphoryl phenolate ligand.

Preferably the lithium organic complex is a phosphoryl phenolate compound of formula (IX):

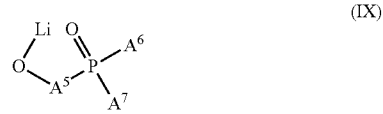
(IX)

wherein $A^5$ is a $C_6$-$C_{20}$ arylene and each of $A^6$-$A^7$ is independently selected from a $C_6$-$C_{20}$ aryl, wherein $A^5$, $A^6$ and $A^7$ may be unsubstituted or substituted with groups comprising C and H or with a further LiO group, provided that the given C count in an aryl or arylene group includes also all substituents present on the said group. Preferably the lithium organic complex is a lithium 2-(diphenylphosphoryl)phenolate. Phenolate ligands that can be suitable used are disclosed in WO 2013079678 A1.

Further, phenolate ligands can be selected from the group comprising pyridinolate, preferably 2-(diphenylphosphoryl) pyridin-3-olate. Pyridine phenolate ligands that can be suitable used are disclosed in JP 2008195623.

In addition, phenolate ligands can be selected from the group comprising imidazole phenolates, preferably 2-(1-phenyl-1H-benzo[d]imidazol-2-yl)phenolate. Imidazol phenolate ligands that can be suitable used are disclosed in JP 2001291593.

Also, phenolate ligands can be selected from the group comprising oxazol phenolates, preferably 2-(benzo[d]oxazol-2-yl)phenolate. Oxazol phenolate ligands that can be suitable used are disclosed in US 20030165711.

According to various embodiments of the organic electroluminescent device of the present invention the organic ligand of the lithium organic complex can be a phosphoryl heteroaryloate ligand.

Preferably the lithium organic complex is a phosphoryl heteroaryloate compound of formula (X):

(X)

wherein $A^8$, $A^9$ and $A^{10}$ are independently selected from $C_1$-$C_{30}$-alkyl, $C_3$-$C_{30}$-cycloalkyl, $C_2$-$C_{30}$-heteroalkyl, $C_6$-$C_{30}$-aryl, $C_2$-$C_{30}$-heteroaryl, $C_1$-$C_{30}$-alkoxy, $C_3$-$C_{30}$-cycloalkyloxy, $C_6$-$C_{30}$-aryloxy, and from structural unit having general formula E-Z—, wherein Z is a spacer unit containing trivalent nitrogen atom bearing a lone electron pair, wherein the spacer unit has a structure which allows formation of a 5-, 6- or 7-membered chelate ring with the metal cation, wherein the chelate ring comprises the oxygen atom of the phosphine oxide group and trivalent nitrogen atom of the spacer unit coordinated to the metal cation and E is an electron transporting unit comprising a conjugated system of at least 10 delocalized electrons, and at least one group selected from $A^8$, $A^9$ and $A^{10}$ has the general formula E-Z—.

Preferably the lithium organic complex is a lithium 2-(diphenylphosphoryl)pyridin-3-olate. Heteroarylolate ligands that can be suitable used are disclosed in EP 2724388 and incorporated by reference.

According to various embodiments of the organic electroluminescent device of the present invention the organic ligand of the alkali organic complex can be selected from a borate ligand and a phosphoryl phenolate ligand and a heteroarylolate ligand. Preferably, the organic ligand of the alkali organic complex is selected from a borate ligand and a phosphoryl phenolate ligand.

More preferably the lithium organic complex can be selected from the group comprising a lithium quinolate, a lithium borate, a lithium phenolate, a lithium pyridinolate or a lithium Schiff base; preferably the lithium organic complex, is selected from the group comprising a lithium quinolate, a lithium borate, a lithium phenolate, a lithium pyridinolate or a lithium Schiff base;

preferably the lithium quinolate has the formula XI, XII or XIII:

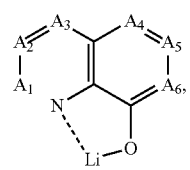

(XI)

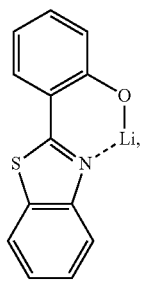

(XII)

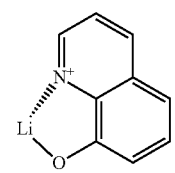

(XIII)

wherein $A_1$ to $A_6$ are same or independently selected from CH, CR, N, O;

R is same or independently selected from hydrogen, halogen, alkyl or aryl or heteroaryl with 1 to 20 carbon atoms; and more preferred $A_1$ to $A_6$ are CH;

preferably the lithium borate is a lithium tetra(1H-pyrazol-1-yl)borate;

preferably the lithium phenolate is a lithium 2-(pyridin-2-yl)phenolate, a lithium 2-(diphenylphosphoryl)phenolate, a lithium imidazol phenolates, or a lithium 2-(pyridin-2-yl)phenolate and more preferred a lithium 2-(1-phenyl-1H-benzo[d]imidazol-2-yl)phenolate, or a lithium 2-(benzo[d]oxazol-2-yl)phenolate;

preferably the lithium pyridinolate is a lithium 2-(diphenylphosphoryl)pyridin-3-olate, preferably the lithium Schiff base has the structure 100, 101, 102 or 103:

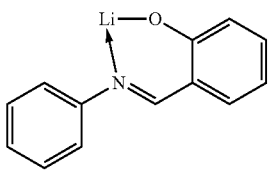

100

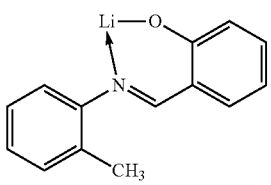

101

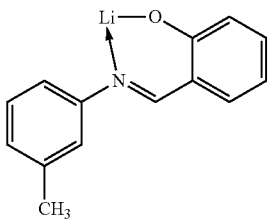

102

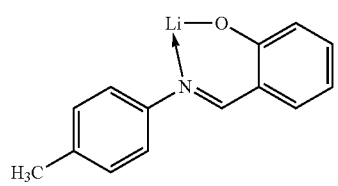

103

Quinolates that can be suitable used are disclosed in WO 2013079217 A1.

According to various embodiments of the organic electroluminescent device of the present invention the organic ligand of the lithium organic complex can be a phenolate ligand, Preferably the lithium organic complex is a lithium 2-(diphenylphosphoryl)phenolate. Phenolate ligands that can be suitable used are disclosed in WO 2013079678 A1.

Further, phenolate ligands can be selected from the group comprising pyridinolate, preferably 2-(diphenylphosphoryl)pyridin-3-olate. Pyridine phenolate ligands that can be suitable used are disclosed in JP 2008195623.

In addition, phenolate ligands can be selected from the group comprising imidazol phenolates, preferably 2(1-phenyl-1H-benzo[d]imidazol-2-yl)phenolate. Imidazole phenolate ligands that can be suitable used are disclosed in JP 2001291593.

Also, phenolate ligands can be selected from the group comprising oxazol phenolates, preferably 2-(benzo[d]oxazol-2-yl)phenolate. Oxazol phenolate ligands that can be suitable used are disclosed in US 20030165711.

Lithium Schiff base organic complexes can be use. Lithium Schiff base organic complexes that can be suitable used having the structure 100, 101, 102 or 103:

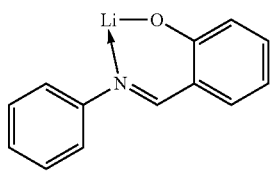

100

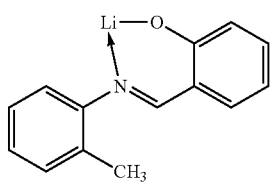

101

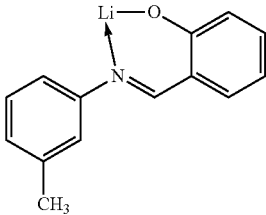

102

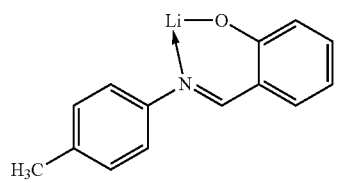

103

Suitable organic ligands to form a lithium organic complex that can be used for the electron injection layer are disclosed in US 2014/0048792 and Kathirgamanathan, Poopathy; Arkley, Vincent; Surendrakumar, Sivagnanasundram; Chan, Yun F.; Ravichandran, Seenivasagam; Ganeshamurugan, Subramaniam; Kumaraverl, Muttulingam; Antipan-Lara, Juan; Paramaswara, Gnanamolly; Reddy, Vanga R., Digest of Technical Papers—Society for Information Display International Symposium (2010), 41(Bk. 1), 465-468.

Extraordinary preferred lithium organic complexes which may be used in the present invention are summarized in the following Table 6.

TABLE 6

| Compound | Name | Structure | Reference |
|---|---|---|---|
| LiQ | lithium 8-hydroxyquinolate | | WO 2013079217 A1 |
| Li-1 | lithium tetra (1H-pyrazol-1-yl)borate | | WO 2013079676 A1 |
| Li-2 | lithium 2-(diphenyl-phosphoryl)phenolate | | WO 2013079678A1 |

TABLE 6-continued

Lithium organic complex that can be suitable used

| Compound | Name | Structure | Reference |
|---|---|---|---|
| Li-3 | lithium 2-(pyridin-2-yl)phenolate | | JP2 008195623 |
| Li-4 | lithium 2-(1-phenyl-1H-benzo[d]imidazol-2-yl)phenolate | | JP 2001291593 |
| Li-5 | lithium 2-(benzo[d]oxazol-2-yl)phenolate | | US 20030165711 |
| Li-6 | lithium 2-(diphenyl-phosphoryl)pyridin-3-olate | | EP 2724388 |

According to various embodiments of the OLED of the present invention, the zero-valent metal, is selected from the group comprising alkali metal, alkaline earth metal, rare earth metal and/or a group 3 transition metal, preferably the zero-valent metal is selected from the group comprising Li, Na, K, Rb, Cs, Mg, Ca, Sr, Ba, Yb, Sm, Eu, Nd, Tb, Gd, Ce, La, Sc and Y, more preferred the zero-valent metal is selected from the group comprising Li, Na, Mg, Ca, Ba, Yb, and further more preferred the zero-valent metal is selected from the group comprising Li, Mg, Ba, Yb.

According to another aspect, the second electron transport layer comprises a non-emitter dopant, wherein the non-emitter dopant is a metal organic complex of a lithium quinolate, a lithium borate, a lithium phenolate and/or a lithium Schiff base, preferably of a lithium quinolate complex having the formula I, II or III.

According to another aspect, the second electron transport layer comprises a non-emitter dopant, wherein the non-emitter dopant is a metal organic complex of a borate based organic ligand, preferably, the lithium organic complex is a compound of formula (VII)

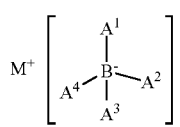
(VII)

wherein M is an alkali metal ion, each of $A^1$-$A^4$ is independently selected from substituted or unsubstituted $C_6$-$C_{20}$ aryl or substituted or unsubstituted $C_2$-$C_{20}$ heteroaryl; or an alkali organic complex of formula (VIII)

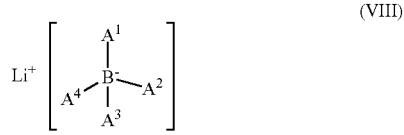
(VIII)

wherein each of $A^1$-$A^4$ is independently selected from substituted or unsubstituted $C_6$-$C_{20}$ aryl or substituted or unsubstituted $C_2$-$C_{20}$ heteroaryl; or an Li organic complex of formula (VIII)

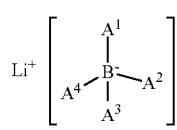
(VIII)

wherein each of $A^1$-$A^4$ is independently selected from substituted or unsubstituted $C_6$-$C_{20}$ aryl or substituted or unsubstituted $C_2$-$C_{20}$ heteroaryl.

According to another aspect, the second electron transport layer comprises a non-emitter dopant, wherein the non-emitter dopant is a metal compound, preferably the metal compound is selected from the group comprising a metal halide, a metal organic complex and/or a zero-valent metal; and more preferred the metal organic complex has the formula VII:

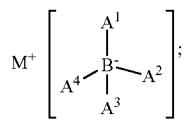

(VII)

and
in addition preferred the metal organic complex is a lithium borate, and most preferred lithium tetra(1H-pyrazol-1-yl)borate.

According to another aspect, the first electron transport layer is free of a non-emitter dopant and the second electron transport layer comprises a non-emitter dopant, wherein the non-emitter dopant is a metal compound, preferably the metal compound is selected from the group comprising a metal halide, a metal organic complex and/or a zero-valent metal; and more preferred the metal organic complex has the formula VII:

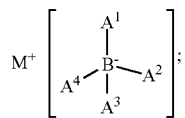

(VII)

and
wherein M is an alkali metal ion, each of $A^1$-$A^4$ is independently selected from substituted or unsubstituted $C_6$-$C_{20}$ aryl or substituted or unsubstituted $C_2$-$C_{20}$ heteroaryl, even more preferred M is lithium ion, and most preferred lithium tetra(1H-pyrazol-1-yl)borate.

Substrate

The substrate may be any substrate that is commonly used in manufacturing of organic light-emitting diodes. If light is emitted through the substrate, the substrate may be a transparent material, for example a glass substrate or a transparent plastic substrate, having excellent mechanical strength, thermal stability, transparency, surface smoothness, ease of handling, and waterproofness. If light is emitted through the top surface, the substrate may be a transparent or non-transparent material, for example a glass substrate, a plastic substrate, a metal substrate or a silicon substrate.

Anode Electrode

The anode electrode may be formed by depositing or sputtering a compound that is used to form the anode electrode. The compound used to form the anode electrode may be a high work-function compound, so as to facilitate hole injection. The anode material may also be selected from a low work function material (i.e. Aluminum). The anode electrode may be a transparent or reflective electrode. Transparent conductive compounds, such as indium tin oxide (ITO), indium zinc oxide (IZO), tin-dioxide ($SnO_2$), and zinc oxide (ZnO), may be used to form the anode electrode 120. The anode electrode 120 may also be formed using magnesium (Mg), aluminum (Al), aluminum-lithium (Al—Li), calcium (Ca), magnesium-indium (Mg—In), magnesium-silver (Mg—Ag), silver (Ag), gold (Au), or the like.

The anode electrode may be formed from a high conductivity metal, for example copper (Cu) or silver (Ag).

HIL

A hole injection layer (HIL), comprising a first and/or second hole injection layer, that can be suitable used for the OLED of the present invention are described in US2002158242 AA, EP1596445A1 and EP1988587A1.

The first HIL may be formed on the anode electrode by vacuum deposition, spin coating, printing, casting, slot-die coating, Langmuir-Blodgett (LB) deposition, or the like.

The second HIL may be formed on the n-type charge generation layer by vacuum deposition, spin coating, slot-die coating, printing, casting, Langmuir-Blodgett (LB) deposition, or the like.

When the HIL is formed using vacuum deposition, the deposition conditions may vary according to the compound that is used to form the HIL, and the desired structure and thermal properties of the HIL. In general, however, conditions for vacuum deposition may include a deposition temperature of 100° C. to 500° C., a pressure of $10^{-8}$ to $10^{-3}$ torr (1 ton equals 133.322 Pa), and a deposition rate of 0.1 to 10 nm/sec.

For example, the coating conditions may include a coating speed of about 2000 rpm to about 5000 rpm, and a thermal treatment temperature of about 80° C. to about 200° C. Thermal treatment removes a solvent after the coating is performed.

HTL

A hole transport layer (HTL), comprising a first and/or second hole transport layer, that can be suitable used for the OLED of the present invention are described in Shirota and Kageyama, Chem. Rev. 2007, 107, 953-1010.

The first hole transport layer (HTL) may be formed on the HIL by vacuum deposition, spin coating, slot-die coating, printing, casting, Langmuir-Blodgett (LB) deposition, or the like.

The second hole transport layer (HTL) may be formed on the second hole injection layer by vacuum deposition, spin coating, slot-die coating, printing, casting, Langmuir-Blodgett (LB) deposition, or the like.

When the HTL is formed by vacuum deposition or spin coating, the conditions for deposition and coating may be similar to those for the formation of the HIL. However, the conditions for the vacuum or solution deposition may vary, according to the compound that is used to form the HTL.

Electron Blocking Layer

The function of the electron blocking layer (EBL) 150 is to prevent electrons from being transferred from the emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer is selected between 2 and 20 nm.

The electron blocking layer may comprise a compound of Formula Z below

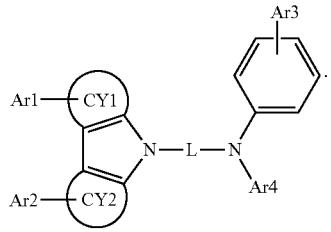

(Z)

In Formula Z, CY1 and CY2 are the same as or different from each other, and each independently represent a benzene cycle or a naphthalene cycle, Ar1 to Ar3 are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms, Ar4 is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms, L is a substituted or unsubstituted arylene group having 6 to 30 carbon atoms.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable triplet control layer, in particular the triarylamine compounds, are described in EP 2 722 908 A1, and fully incorporated by reference.

Emission Layer (EML)

The EML may be formed on the HTL by vacuum deposition, spin coating, slot-die coating, printing, casting, LB, or the like. When the EML is formed using vacuum deposition or spin coating, the conditions for deposition and coating may be similar to those for the formation of the HIL.

The first emission layer may be formed on the first hole transport layer.

The second emission layer may be formed on the second hole transport layer.

However, the conditions for deposition and coating may vary, according to the compound that is used to form the EML.

The emission layer (EML) may be formed of a combination of a host and a dopant. Example of the host are Alq3, 4,4'-N,N'-dicarbazole-biphenyl (CBP), poly(n-vinylcarbazole) (PVK), 9,10-di(naphthalene-2-yl)anthracenee (ADN), 4,4',4''-Tris(carbazol-9-yl)-triphenyl-amine (TCTA), 1,3,5-tris(N-phenylbenzimidazole-2-yl)benzene (TPBI), 3-tert-butyl-9,10-di-2-naphthylanthracenee (TBADN), distyrylarylene (DSA), Bis(2-(2-hydroxyphenyl)benzothiazolate)zinc (Zn(BTZ) 2), E3 below, AND, Compound 12 below, and Compound 13 below.

E3

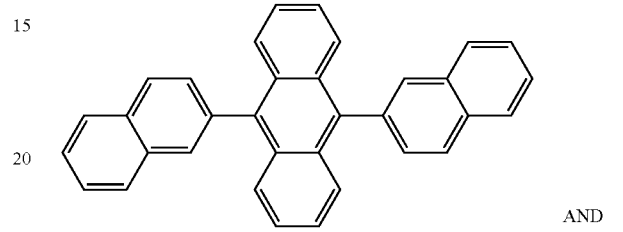

AND

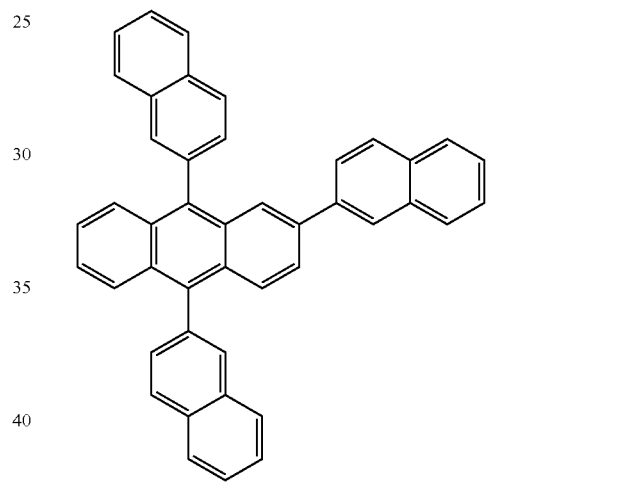

Compound 12

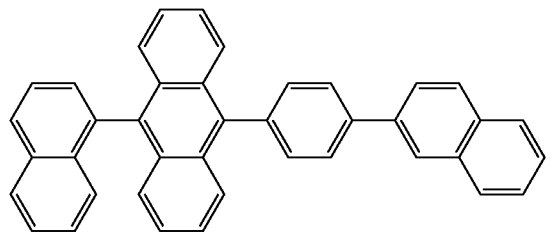

Compound 13

In a preferred embodiment, the emission layer comprises at least one emitter dopant that emits visible light at operation of the OLED.

The dopant may be a phosphorescent or fluorescent emitter. Phosphorescent emitters and emitters which emit light via a thermally activated delayed fluorescence (TADF) mechanism are preferred due to their higher efficiency. The emitter may be a small molecule or a polymer. Examples of a red dopant are PtOEP, Ir(piq)$_3$, and Btp 2Ir(acac), but are not limited thereto. These compounds are phosphorescent emitters, however, fluorescent red dopants could also be used.

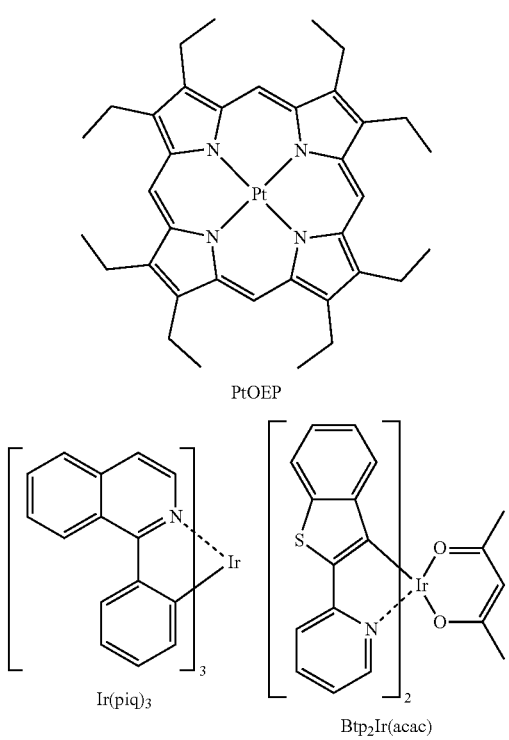

PtOEP

Ir(piq)₃

Btp₂Ir(acac)

Examples of a phosphorescent green dopant are Ir(ppy)₃ (ppy=phenylpyridine), Ir(ppy)₂(acac), Ir(mpyp)₃ are shown below. Compound 14 is an example of a fluorescent green emitter and the structure is shown below.

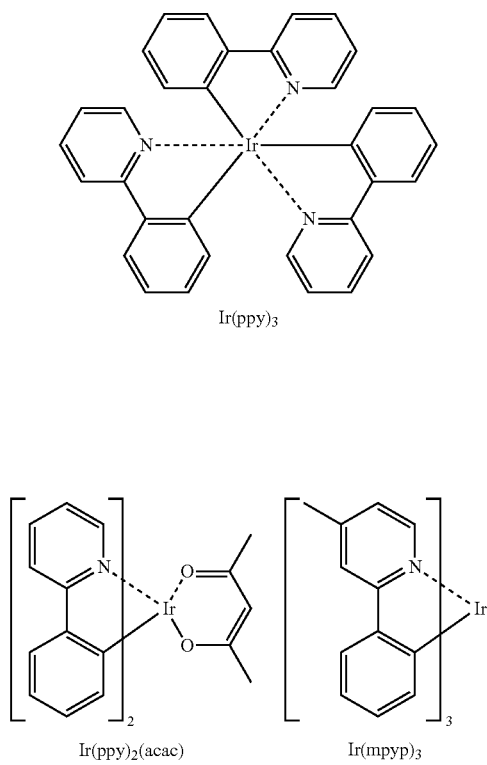

Ir(ppy)₃

Ir(ppy)₂(acac)

Ir(mpyp)₃

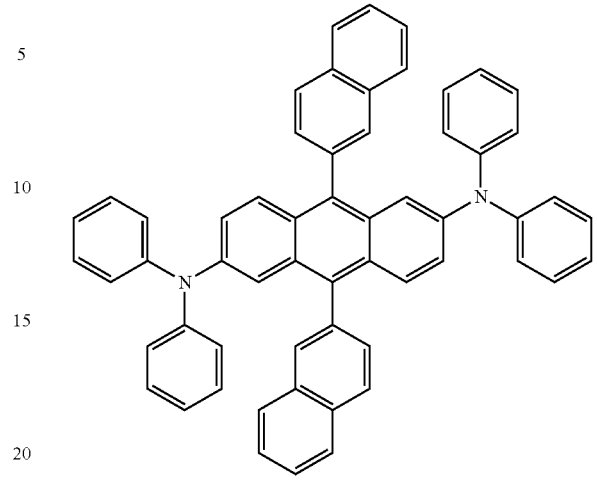

Compound 14

Examples of a phosphorescent blue dopant are F₂Irpic, (F₂ppy)₂Ir(tmd) and Ir(dfppz) 3, ter-fluorene, the structures are shown below. 4.4'-bis(4-diphenyl amiostyryl)biphenyl (DPAVBi), 2,5,8,11-tetra-tert-butyl perylene (TBPe), and Compound 15 below are examples of fluorescent blue dopants.

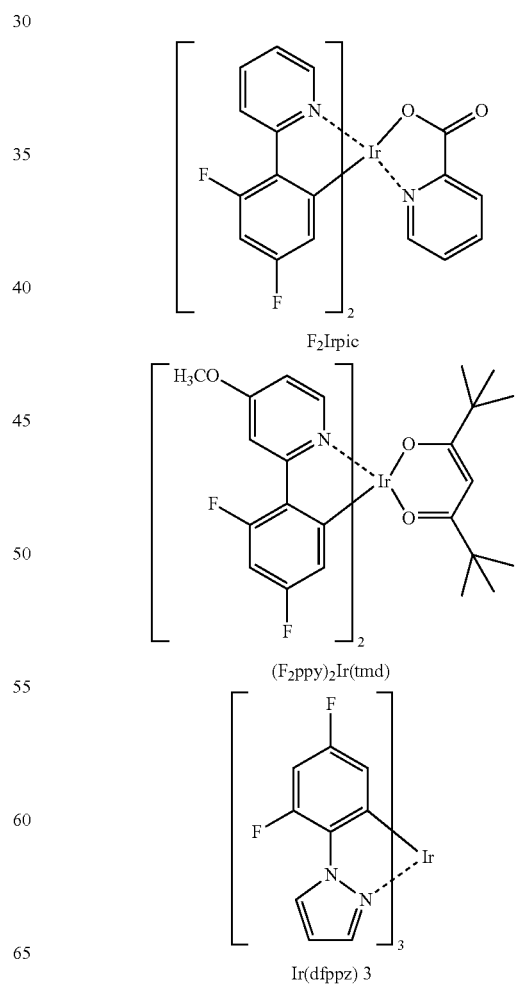

F₂Irpic (F₂ppy)₂Ir(tmd)

Ir(dfppz) 3

Compound 15

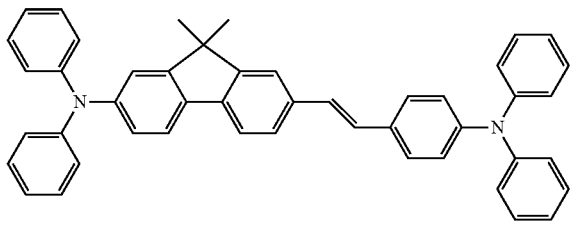

The amount of the dopant may be in the range of about 0.01 to about 50 parts by weight, based on 100 parts by weight of the host. Alternatively, the emission layer may comprise or consist of a light-emitting polymer. The EML may have a thickness of about 10 nm to about 100 nm, for example, about 20 nm to about 60 nm. When the thickness of the EML is within this range, the EML may have excellent light emission, without a substantial increase in driving voltage.

In a preferred embodiment, the emission layer comprising or consisting of the light-emitting polymer is in direct contact with the electron transport layer stack.

Hole Blocking Layer (HBL)

When the EML comprises a phosphorescent dopant, a hole blocking layer (HBL) may be formed on the EML, by using vacuum deposition, spin coating, slot-die coating, printing, casting, LB deposition, or the like, in order to prevent the diffusion of triplet excitons or holes into the ETL.

Hole blocking layer that can be suitable used for the OLED of the present invention are described in US2015207093A and US2015060794A, and fully incorporated by reference.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include an oxadiazole derivative, a triazole derivative, a triazine derivative, an acridine derivative, and a phenanthroline derivative.

If the hole blocking layer has a high triplet level, it may also be described as triplet control layer. The function of the triplet control layer is to reduce quenching of triplets if a phosphorescent green or blue emission layer is used. Thereby, higher efficiency of light emission from a phosphorescent emission layer can be achieved. The triplet control layer is selected from a heteroaryl compound with a triplet level above the triplet level of the phosphorescent emitter in the adjacent emission layer.

The first hole blocking layer may be formed on the first emission layer.

The second hole blocking layer may be formed on the second emission layer.

The HBL may have a thickness of about 5 nm to about 100 nm, for example, about 10 nm to about 30 nm. When the thickness of the HBL is within this range, the HBL may have excellent hole-blocking properties, without a substantial increase in driving voltage.

Charge Generation Layer

Charge generation layers (CGL) that can be suitable used for the OLED of the present invention are described in US 2012098012 A.

The charge generation layer is generally composed of a double layer. The charge generation layer can be a pn junction charge generation layer joining n-type charge generation layer and p-type charge generation layer. The pn junction charge generation layer generates charges or separates them into holes and electrons; and injects the charges into the individual light emission layer. In other words, the n-type charge generation layer provides electrons for the first light emission layer adjacent to the anode electrode while the p-type charge generation layer provides holes to the second light emission layer adjacent to the cathode electrode, by which luminous efficiency of an organic light emitting device incorporating multiple light emission layers can be further improved and at the same time, driving voltage can be lowered.

The p-type charge generation layer can be composed of metal or organic material doped with p-type dopant. Here, the metal can be one or an alloy consisting of two or more selected from a group consisting of Al, Cu, Fe, Pb, Zn, Au, Pt, W, In, Mo, Ni, and Ti. Also, p-type dopant and host used for organic material doped with the p-type can employ conventional materials. For example, the p-type dopant can be one selected from a group consisting of tetrafluore-7,7,8,8-tetracyanoquinodimethane (F4-TCNQ), derivative of tetracyanoquinodimethane, radialene derivative, iodine, FeCl3, FeF3, and SbC15. Also, the host can be one selected from a group consisting of N,N'-di(naphthalen-1-yl)-N,N-diphenyl-benzidine (NPB), N,N'-diphenyl-N,N'-bis(3-methylphenyl)-1,1-biphenyl-4,4'-diamine (TPD) and N,N',N'-tetranaphthyl-benzidine (TNB).

The n-type charge generation layer can be composed of metal or organic material doped with n-type. The metal can be one selected from a group consisting of Li, Na, K, Rb, Cs, Mg, Ca, Sr, Ba, La, Ce, Sm, Eu, Tb, Dy, and Yb. Also, n-type dopant and host used for organic material doped with the n-type can employ conventional materials. For example, the n-type dopant can be alkali metal, alkali metal compound, alkali earth metal, or alkali earth metal compound. More specifically, the n-type dopant can be one selected from a group consisting of Cs, K, Rb, Mg, Na, Ca, Sr, Eu and Yb. The host material can be one selected from a group consisting of tris(8-hydroxyquinoline)aluminum, triazine, hydroxyquinoline derivative, benzazole derivative, and silole derivative.

In another preferred embodiment, the n-type charge generation layer is arranged adjacent to the electron transport layer. The n-type charge generation layer according to one embodiment may include compounds of the following Chemical Formula16.

(16)

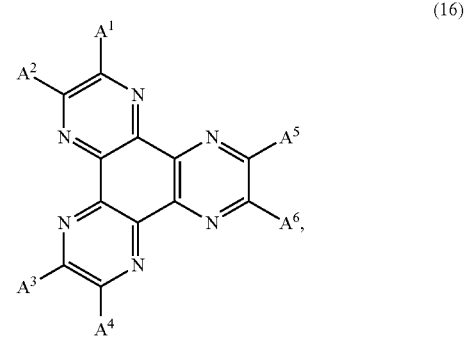

wherein
each of A¹ to A⁶ may be hydrogen, a halogen atom, nitrile (—CN), nitro (—NO₂), sulfonyl (—SO₂R), sulfoxide (—SOR), sulfonamide (—SO₂NR), sulfonate (—SO₃R), trifluoromethyl (—CF₃), ester (—COOR), amide (—CONHR or —CONRR'), substituted or unsubstituted straight-chain or branched-chain C1-C12 alkoxy, substituted or unsubstituted straight-chain or branched-chain C1-C12 alkyl, substituted or unsubstituted straight-chain or branched chain C2-C12 alkenyl, a substituted or unsubstituted aromatic or non-aromatic heteroring, substituted or unsubstituted aryl, substituted or unsubstituted mono- or di-arylamine, substituted or unsubstituted alkylamine, or the like.

Herein, each of the above R and R' may be substituted or unsubstituted $C_1$-$C_{60}$ alkyl, substituted or unsubstituted aryl, or a substituted or unsubstituted 5- to 7-membered heteroring, or the like.

Particularly preferred is an n-type charge generation layer comprising a compound of Formula (17)

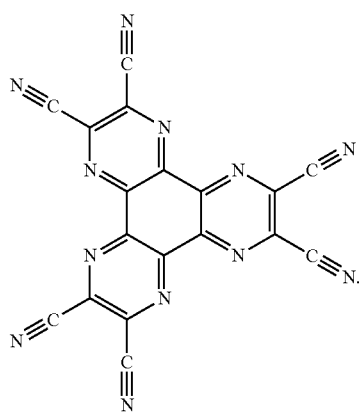

(17)

The p-type charge generation layer is arranged on top of the n-type charge generation layer. As the materials for the p-type charge generation layer, aryl amine-based compounds may be used. One embodiment of the aryl amine-based compounds includes compounds of the following Chemical Formula 18:

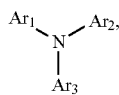

(18)

wherein
Ar₁, Ar₂ and Ar₃ are each independently hydrogen or a hydrocarbon group. Herein, at least one of Ar₁, Ar₂ and Ar₃ may include aromatic hydrocarbon substituents, and each substituent may be the same, or they may be composed of different substituents. When Ar₁, Ar₂ and Ar₃ are not aromatic hydrocarbons, they may be hydrogen; a straight-chain, branched-chain or cyclic aliphatic hydrocarbon; or a heterocyclic group including N, O, S or Se.

In another aspect of the present invention, the organic light emitting diode (100) further comprises an n-type CGL (185), a p-type CGL (135) and an ETL-stack (160), wherein the ETL-stack (160) comprises a first electron transport layer (160a) comprising a first organic aromatic matrix compound selected from polar organic aromatic phosphine compound and a second electron transport layer (160b) comprising a second organic matrix compound. Preferably, the polar organic aromatic phosphine compound is selected from the group of organic phosphine oxide, organic thioxophosphine compound and/or an organic selenoxophosphine compound, and the second organic matrix compound is selected from an organic compound with a dipole moment of about ≥0 Debye and about ≤2.5 Debye.

In a particularly preferred embodiment, the electron injection layer (180) and the first electron transport layer (160) comprise the same polar organic aromatic phosphine compound.

In a preferred embodiment, the n-type CGL comprises or consists of the first zero-valent metal.

Electron Injection Layer (EIL)

The organic light emitting diode may comprise an electron injection layer. The electron injection layer may consist of at least one metal compound.

The metal compound can be selected from the group comprising a metal halide, a metal organic complex and/or a zero-valent metal.

Preferably, the metal compound is selected from the group comprising a metal halide, a metal organic complex and/or a zero-valent metal, preferably an alkali halide, alkali organic complex, more preferred an alkali halide, alkali organic complex, most preferred are lithium fluoride and lithium quinolate (LiQ).

The metal halide may be selected from the group comprising halide wherein the metal is selected from the group comprising Li, Na, K, Cs, Mg, Ca and Ba; and the halide is selected from the group comprising F, Cl, Br and J; and preferably a lithium halide.

The lithium halide may be selected from the group comprising a LiF, LiCl, LiBr or LiJ, and preferably LiF.

The metal organic complex may be selected from the group of metal quinolate, a metal borate, a metal phenolate and/or a metal Schiff base.

Preferably the metal organic complex may be a lithium organic complex.

Preferably the lithium organic complex can be selected from the group of a lithium quinolate, a lithium borate, a lithium phenolate and/or a lithium Schiff base, preferably of a lithium quinolate complex has the formula I, II or III:

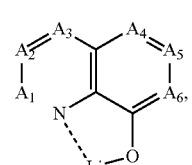

(I)

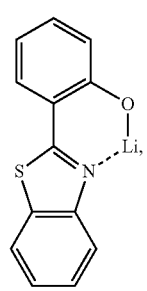

(II)

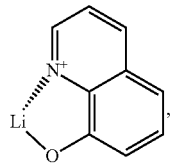 (III)

wherein
$A_1$ to $A_6$ are same or independently selected from CH, CR, N, O,
R is same or independently selected from hydrogen, halogen, alkyl or aryl or heteroaryl with 1 to 20 carbon atoms, and more preferred of a lithium 8-hydroxyquinolate.

The zero-valent metal, if not defined other in the description, is selected from the group comprising alkali metal, alkaline earth metal, rare earth metal and/or a group 3 transition metal, preferably the zero-valent metal is selected from the group comprising Li, Na, K, Rb, Cs, Mg, Ca, Sr, Ba, Yb, Sm, Eu, Nd, Tb, Gd, Ce, La, Sc and Y, more preferred the zero-valent metal is selected from the group comprising Li, Na, Mg, Ca, Ba, Yb, and further more preferred the zero-valent metal is selected from the group comprising Li, Mg, Ba, Yb.

Preferably, the electron injection layer is free of organic matrix compound. Therefore, the electron injection layer is not an electron transport layer.

The electron injection layer can be sandwiched between the electron transport layer stack and the cathode electrode layer, preferably the electron injection layer is arranged in direct contact to the cathode electrode layer.

The EIL, if present, may be formed directly on the electron transport layer stack. Deposition and coating conditions for forming the EIL are similar to those for formation of an hole injection layer (HIL), although the deposition and coating conditions may vary, according to a material that is used to form the EIL.

The thickness of the EIL may be in the range of about 1 nm to 10 nm. According to a preferred embodiment the electron injection layer may a thickness of ≥1 nm and ≤10 nm, preferably ≥2 nm to ≤6 nm, preferably of ≥3 nm to ≤5 nm and more preferred of ≥3 nm to ≤4 nm. When the thickness of the EIL is within this range, the EIL according to the invention may have improved electron-injecting properties, especially a substantial decrease in operating voltage and/or increase in external quantum efficiency EQE.

According to another aspect of the OLED, the second electron transport layer, and/or the second electron transport layer and fourth electron transport layer, comprise a polar organic aromatic phosphine compound having a MW of about ≥400 to about ≤1000, and a dipole moment of about >2.5 Debye and about ≤10 Debye, and wherein the electron injection layer is free of a polar organic aromatic phosphine compound and is free of a first organic aromatic matrix compound.

Preferably, an electron injection layer is present if the second electron transport layer does not contain a non-emitter dopant.

If the second electron transport layer contains a non-emitter dopant, an electron injection layer may not be present.

Cathode Electrode

The cathode electrode is formed on the EIL. The cathode electrode is an electron-injecting electrode. The cathode electrode may be formed of a metal, an alloy, an electrically conductive compound, or a mixture thereof. The cathode electrode may have a low work function. For example, the cathode may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. In addition, the cathode electrode may be formed of a transparent conductive material, such as ITO or IZO.

The thickness of the cathode electrode may be in the range of about 5 nm to 1000 nm, for example, in the range of 10 nm to 100 nm. When the cathode is in the range of 5 nm to 50 nm, the electrode will transparent even if a metal or metal alloy is used.

The cathode electrode is not an electron injection layer or electron transport layer.

In a preferred embodiment, the cathode electrode is in direct contact with the electron transport layer stack. Surprisingly, it was found that very good electron injection from the cathode electrode into the electron transport layer stack can be achieved when the electron transport layer which is in direct contact with the cathode comprises a non-emitter dopant. Preferably, the second electron transport layer is in direct contact with the cathode electrode.

Very low operating voltages and high external quantum efficiency EQE are achieved when the cathode electrode layer is in direct contact with an electron injection layer. Thereby, the battery life of mobile devices is increased. However, the cathode electrode and the electron injection layer, if present, differ in their components.

Light-Emitting Diode (OLED)

According to another aspect of the present invention, there is provided an organic light-emitting diode (OLED) comprising: a substrate, an anode electrode a hole injection layer, a hole transport layer, optional an electron blocking layer, an emission layer, optional a hole blocking layer, optional an electron transport layer, an electron injection layer, and a first cathode electrode layer, wherein the layers are arranged in that order.

According to another aspect of the present invention, there is provided an organic light-emitting diode (OLED) comprising: a substrate, an anode electrode a first hole injection layer, a first hole transport layer, optional first electron blocking layer, a first emission layer, optional a first hole blocking layer, optional a first electron transport layer, an n-type charge generation layer, a p-type charge generation layer, a second hole transport layer, optional second electron blocking layer, a second emission layer, optional a second hole blocking layer, optional a second electron transport layer, an electron injection layer, and a cathode electrode layer, wherein the layers are arranged in that order.

According to various embodiments of the OLED of the present invention, the OLED may not comprises an electron injection layer.

According to various embodiments of the OLED of the present invention, the OLED may not comprises an electron blocking layer.

According to various embodiments of the OLED of the present invention, the OLED may not comprises a hole blocking layer.

According to various embodiments of the OLED of the present invention, the OLED may not comprises a charge generation layer.

According to various embodiments of the OLED of the present invention, the OLED may not comprises a second emission layer.

Method of Manufacture

According to various embodiments of the present invention, the method may further include forming on a substrate an anode electrode the other layers of hole injection layer, hole transport layer, optional an electron blocking layer, emission layer, optional hole blocking layer, an electron transport layer stack comprising at least a first electron transport layer and a second electron transport layer, optional an electron injection layer, and a cathode electrode layer, are deposited in that order; or the layers are deposited the other way around, starting with the cathode electrode layer.

According to various embodiments of the present invention, the method may further include that on the substrate an anode electrode is deposited and on the anode electrode the other layers of hole injection layer, hole transport layer, optional an electron blocking layer, emission layer, optional hole blocking layer, an electron transport layer stack comprising at least a first electron transport layer and a second electron transport layer, optional an electron injection layer, and a cathode electrode layer, are deposited in that order; or the layers are deposited the other way around, starting with the first cathode electrode layer.

According to various embodiments of the present invention, the method may further include forming on a substrate an anode electrode a first hole injection layer, a first hole transport layer, optional first electron blocking layer, a first emission layer, optional a first hole blocking layer, a first electron transport layer stack, an n-type charge generation layer, an p-type charge generation layer, a second hole transport layer, optional second electron blocking layer, a second emission layer, optional a second hole blocking layer, optional a second electron transport layer stack, optional an electron injection layer, a cathode electrode layer, wherein the layers are arranged in that order; or the layers are deposited the other way around, starting with the cathode electrode layer.

However, according to one aspect the layers are deposited the other way around, starting with the cathode electrode, and sandwiched between the cathode electrode and the anode electrode.

The anode electrode and/or the cathode electrode can be deposited on a substrate. Preferably the anode is deposited on a substrate.

According to another aspect of the present invention, there is provided a method of manufacturing an organic light-emitting diode (OLED), the method using:
- at least one deposition source, preferably two deposition sources and more preferred at least three deposition sources; and/or
- deposition via vacuum thermal evaporation; and/or
- deposition via solution processing, preferably the processing is selected from spin-coating, printing, casting and/or slot-die coating.

Electronic Device

Another aspect is directed to an electronic device comprising at least one organic light-emitting diode (OLED). A device comprising organic light-emitting diodes (OLED) is for example a display or a lighting panel.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
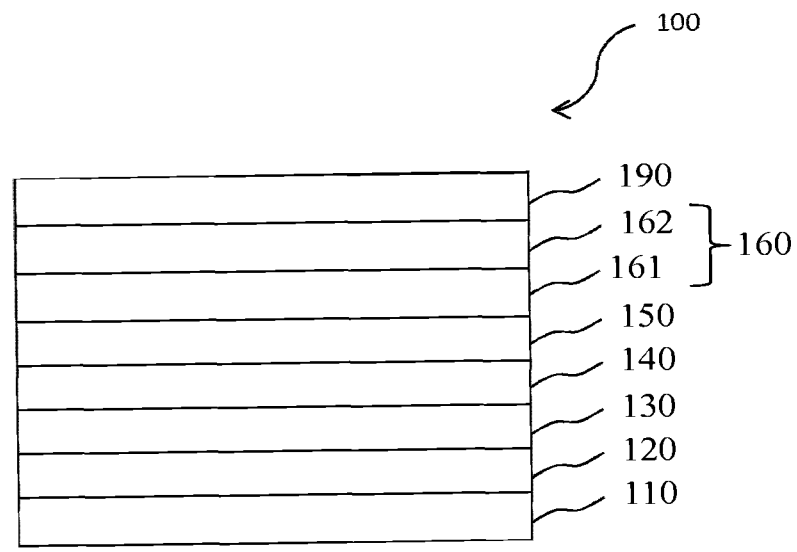
FIG. 1 is a schematic sectional view of an organic light-emitting diode (OLED), according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

FIG. 1 is a schematic sectional view of an organic light-emitting diode (OLED) 100, according to an exemplary embodiment of the present invention. The OLED 100 includes a substrate 110, an anode electrode 120, a hole injection layer (HIL) 130, a hole transport layer (HTL) 140, an emission layer (EML) 150, an electron transport layer stack (ETL) 160 of a first electron transport layer 161 and a second electron transport layer 162. The first electron transport layer 161 comprises i) a first organic aromatic matrix compound having a MW of about ≥400 to about ≤1000 and a dipole moment of about ≥0 Debye and about ≤2.5 Debye, wherein the first electron transport layer 161 is free of an polar organic aromatic phosphine compound; and the second electron transport layer 162 comprises two organic aromatic matrix materials, which are a mixture of:
  i) the first organic aromatic matrix compound; and ii) an polar organic aromatic phosphine compound having a MW of about ≥400 to about ≤1000, and a dipole moment of about >2.5 Debye and about ≤10 Debye.

The polar organic aromatic phosphine compound selected from the group of organic aromatic phosphine oxide compound or an organic aromatic thioxophosphine compound or an organic aromatic selenoxophosphine compound. The cathode electrode layer 190 is disposed directly onto the second electron transport layer (ETL) 162.

Figure 2:
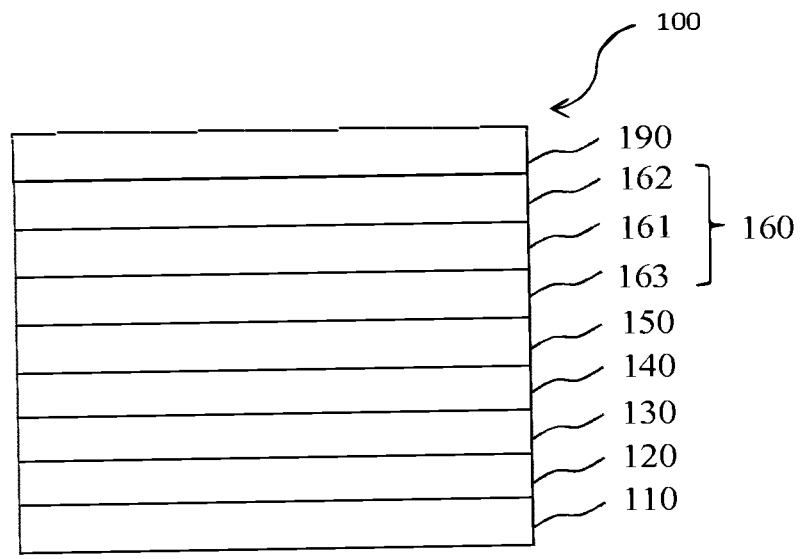
FIG. 2 is a schematic sectional view of an OLED, according to an exemplary embodiment of the present invention.

FIG. 2 is a schematic sectional view of an OLED 100, according to another exemplary embodiment of the present invention. FIG. 2 differs from FIG. 1 in that the OLED 100 of FIG. 2 comprises an electron transport layer stack 160 of a first electron transport layer 161, a second electron transport layer 162 and a third electron transport layer 163. The third electron transport layer 163 may have the same composition as the first electron transport layer 161.

Figure 3:
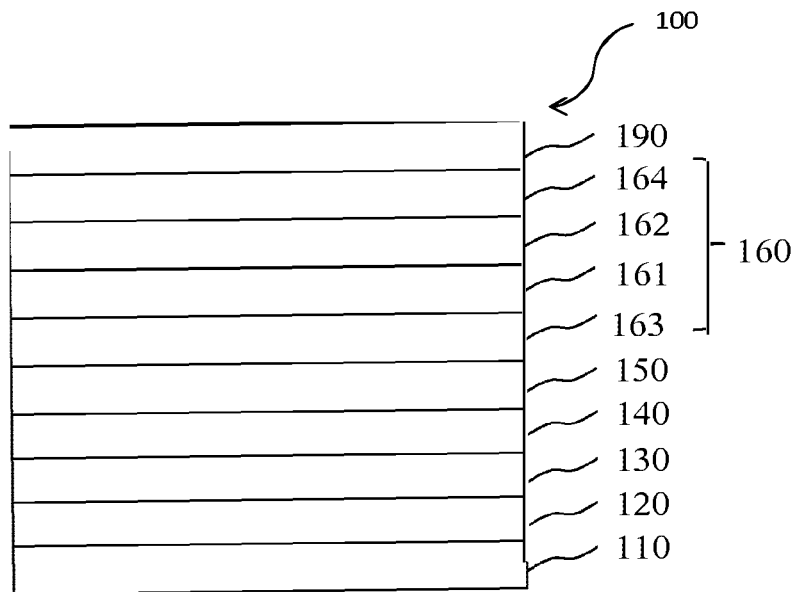
FIG. 3. is a schematic sectional view of an OLED, according to another exemplary embodiment of the present invention.

FIG. 3 is a schematic sectional view of an OLED 100, according to another exemplary embodiment of the present invention. FIG. 3 differs from FIG. 1 in that the OLED 100 of FIG. 3 comprises an electron transport layer stack 160 of a first electron transport layer 161, a second electron transport layer 162, a third electron transport layer 163, and a fourth electron transport layer 164.

Figure 4:
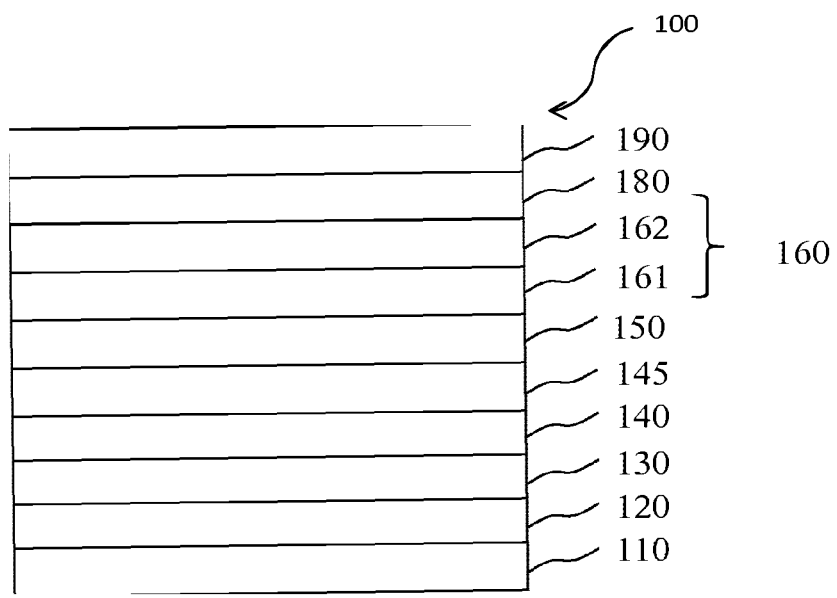
FIG. 4 is a schematic sectional view of an OLED, according to another exemplary embodiment of the present invention.

FIG. 4 is a schematic sectional view of an OLED 100, according to another exemplary embodiment of the present invention. FIG. 4 differs from FIG. 1 in that the OLED 100 of FIG. 4 comprises an electron blocking layer (EBL) 145 and an electron injection layer (EIL) 180.

Figure 5:
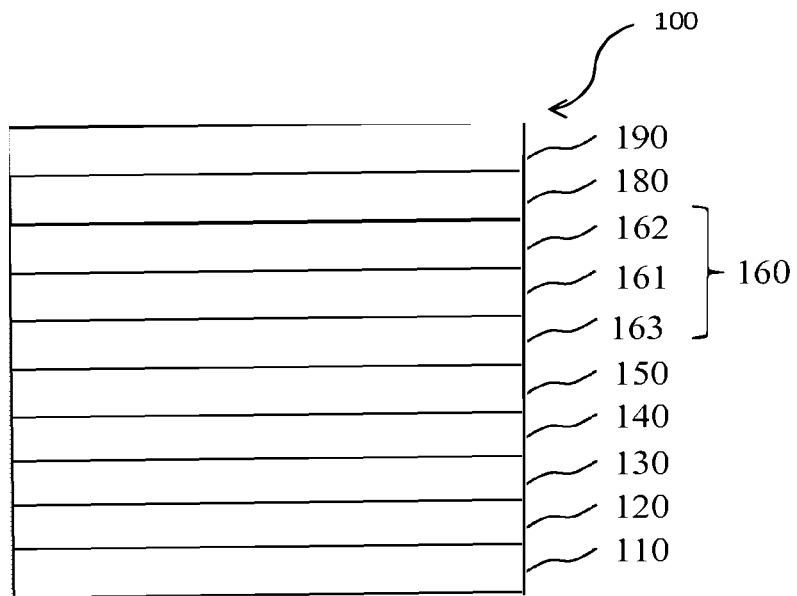
FIG. 5 is a schematic sectional view of an OLED, according to another exemplary embodiment of the present invention.

FIG. 5 is a schematic sectional view of an OLED 100, according to another exemplary embodiment of the present invention. FIG. 5 differs from FIG. 2 in that the OLED 100 of FIG. 5 comprises an electron injection layer (EIL) 180.

Figure 6:
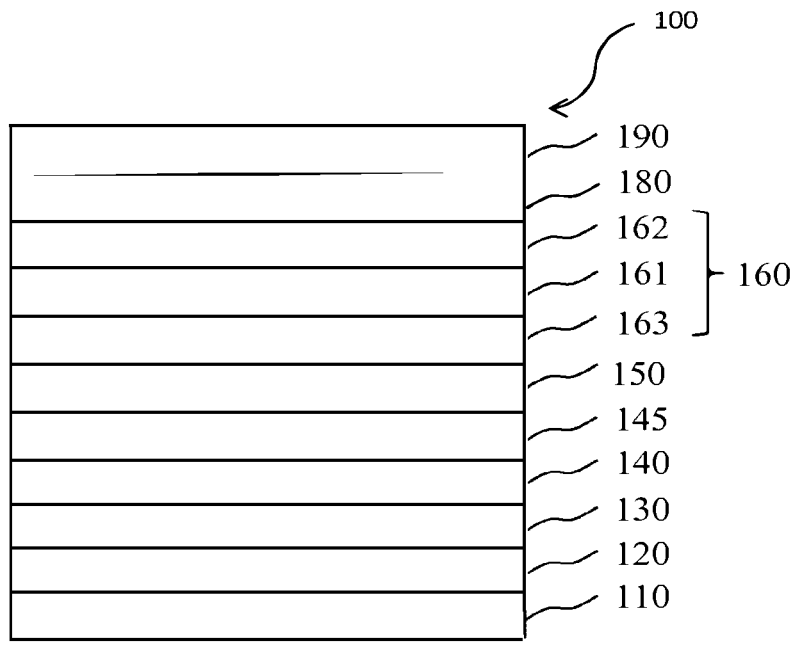
FIG. 6 is a schematic sectional view of an OLED, according to another exemplary embodiment of the present invention.

FIG. 6 is a schematic sectional view of an OLED 100, according to another exemplary embodiment of the present invention. FIG. 6 differs from FIG. 5 in that the OLED 100 of FIG. 6 comprises in addition an electron blocking layer (EBL) 145.

Figure 7:
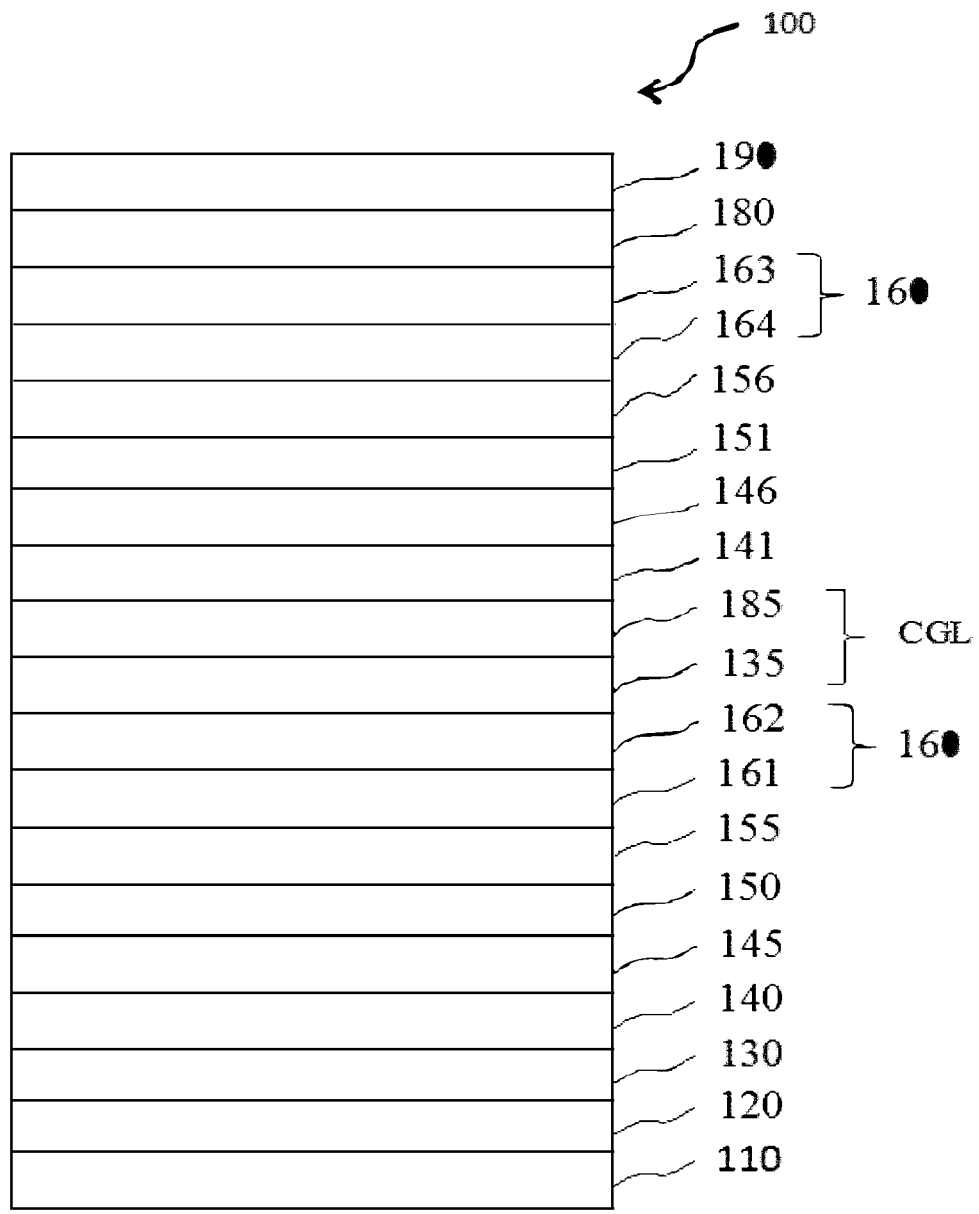
FIG. 7 is a schematic sectional view of a tandem OLED comprising a charge generation layer, according to an exemplary embodiment of the present invention.

FIG. 7 is a schematic sectional view of a tandem OLED 100 including a substrate 110, an anode electrode 120, a first hole injection layer (HIL) 130, a first hole transport layer (HTL) 140, a first electron blocking layer (EBL) 145, a first emission layer (EML) 150, a first hole blocking layer (HBL) 155, an electron transport layer stack 160 of a first electron transport layer (ETL) 161 and a second electron transport layer (ETL) 162, an n-type charge generation layer (n-type CGL) 185, a p-type charge generation layer (p-type GCL) 186, a second hole transport layer (HTL) 141, a second electron blocking layer (EBL) 146, a second emission layer (EML) 151, a second hole blocking layer (EBL) 156, a second electron transport layer stack (ETL) 160 of a fourth electron transport layer (ETL) 164 and a third electron transport layer (ETL) 163, an electron injection layer (EIL) 180, a first cathode electrode layer 191 and a second cathode electrode layer 192. The second electron transport layer 162 and the third electron transport layer 163 comprising a polar organic aromatic phosphine compound selected from the group of organic aromatic phosphine oxide compound or an organic aromatic thioxophosphine compound or an organic aromatic selenoxophosphine compound.

In the description above the method of manufacture an OLED 100 of the present invention can be started with a substrate 110 onto which an anode electrode 120 is formed, on the anode electrode 120, a first hole injection layer 130, first hole transport layer 140, an optional first electron blocking layer 145, a first emission layer 150, an optional first hole blocking layer 155, an ETL-stack 160 comprising a first electron transport layer 161 and a second electron transport layer 162, an optional n-type CGL 185, optional p-type CGL 186, an optional second hole transport layer 141, an optional second electron blocking layer 146, an optional second emission layer 151, an optional second hole blocking layer 156, an optional additional ETL-stack 160 comprising a fourth electron transport layer 164 and a third electron transport layer 163, optional an electron injection layer 180, a first cathode electrode layer 191 and an optional second cathode electrode layer 192 are formed, in that order or the other way around.

While not shown in FIG. 1, FIG. 2, FIG. 3, FIG. 4, FIG. 5, FIG. 6 and FIG. 7, a sealing layer may further be formed on the cathode electrodes 190, in order to seal the OLED 100. In addition, various other modifications may be applied thereto.

EXAMPLES

General Procedure
Bottom Emission Devices with an Evaporated Emission Layer

For bottom emission devices—Examples 1 to 10 and comparative examples 1 to 2, a 15 Ω/cm 2 glass substrate (available from Corning Co.) with 100 nm ITO was cut to a size of 50 mm×50 mm×0.7 mm, ultrasonically cleaned with isopropyl alcohol for 5 minutes and then with pure water for 5 minutes, and cleaned again with UV ozone for 30 minutes, to prepare a first electrode.

Then, 97 wt.-% of Biphenyl-4-yl(9,9-diphenyl-9H-fluoren-2-yl)-[4-(9-phenyl-9H-carbazol-3-yl)phenyl]-amine and 3 wt.-% of 2,2',2"-(cyclopropane-1,2,3-triylidene)tris(2-(p-cyanotetrafluorophenyl)acetonitrile) was vacuum deposited on the ITO electrode, to form a HIL having a thickness of 10 nm. Then Biphenyl-4-yl(9,9-diphenyl-9H-fluoren-2-yl)-[4-(9-phenyl-9H-carbazol-3-yl)phenyl]-amine was vacuum deposited on the HIL, to form a HTL having a thickness of 120 nm. 97 wt.-% of ABH113 (Sun Fine Chemicals) as a host and 3 wt.-% of NUBD370 (Sun Fine Chemicals) as a dopant were deposited on the HTL, to form a blue-emitting EML with a thickness of 20 nm.

Then, the first electron transport layer is formed by deposing a first organic aromatic matrix compound ETM1 according to examples 1 to 11 and comparative example 1 to 29 by deposing the compound from a first deposition source directly on the EML. Further, the thickness d (in nm) of the ETL1 can be taken from Table 7, 8 and 9.

Then, the second electron transport layer is formed by deposing a polar organic aromatic phosphine compound ETM2 according to example 1 to 11 and comparative examples 1 to 29 directly on the first electron transport layer. The composition and thickness of the second electron transport layer can be taken from Table 7, 8 and 9.

If present, the electron injection layer is formed by deposing LiQ or Yb directly on the second electron transport layer. The composition and thickness of the second electron transport layer can be taken from Table 7, 8 and 9.

The cathode electrode layer is evaporated at ultra-high vacuum of 10-7 bar. Therefore, a thermal single co-evaporation of one or several metals is performed with a rate of 0, 1 to 10 nm/s (0.01 to 1 Å/s) in order to generate a homogeneous cathode electrode with a thickness of 5 to 1000 nm.100 nm aluminium is used as cathode layer in examples 1 to 11 and comparative example 1 to 29.

The OLED stack is protected from ambient conditions by encapsulation of the device with a glass slide. Thereby, a cavity is formed, which includes a getter material for further protection.

Top Emission Devices

For top emission devices, the anode electrode was formed from 100 nm silver on glass which is prepared by the same methods as described above.

Then, 97 wt.-% of biphenyl-4-yl(9,9-diphenyl-9H-fluoren-2-yl)-[4-(9-phenyl-9H-carbazol-3-yl)phenyl]-amine (CAS 1242056-42-3) and 3 wt.-% of 2,2',2"-(cyclopropane- 1,2,3-triylidene)tris(2-(p-cyanotetrafluorophenyl)acetonitrile) is vacuum deposited on the ITO elec-trode, to form a HIL having a thickness of 10 nm. Then biphenyl-4-yl(9,9-diphenyl-9H-fluoren-2-yl)-[4-(9-phenyl-9H-carbazol-3-yl) phenyl]-amine (CAS 1242056-42-3) is vacuum deposited on the HIL, to form a HTL having a thickness of 125 nm. Then N,N-bis(4-(dibenzo[b,d]furan-4-yl)phenyl)-[1,1':4',1"-terphenyl]-4-amine is deposed directly on top of the HTL to form an EBL with a thickness of 5 nm.

97 wt.-% of 2-(10-phenyl-9-anthracenyl)-benzo[b]naphtho[2,3-d]furan as a host and 3 wt.-% of NUBD370 (Sun Fine Chemicals) as a dopant are deposited on the EBL, to form a blue-emitting EML with a thickness of 20 nm.

Then the first and second electron transport layer and optional electron injection layer are deposed on the EML as described for bottom emission devices above.

The cathode electrode layer is evaporated at ultra-high vacuum of 10-7 bar. Therefore, a thermal single co-evaporation of one or several metals is performed with a rate of 0, 1 to 10 nm/s (0.01 to 1 Å/s) in order to generate a homogeneous cathode electrode with a thickness of 5 to 1000 nm.

60 nm biphenyl-4-yl(9,9-diphenyl-9H-fluoren-2-yl)-[4-(9-phenyl-9H-carbazol-3-yl) pheny]-amine (CAS 1242056-42-3) is deposed directly on top of the second cathode electrode layer.

The OLED stack is protected from ambient conditions by encapsulation of the device with a glass slide. Thereby, a cavity is formed, which includes a getter material for further protection.

To assess the performance of the inventive examples compared to the prior art, the current efficiency is measured under ambient conditions (20° C.). Current voltage measurements are performed using a Keithley 2400 sourcemeter, and recorded in V. At 10 mA/cm$^2$ for bottom emission and 10 mA/cm$^2$ for top emission devices, a calibrated spectrometer CAS140 from Instrument Systems is used for measurement of CIE coordinates and brightness in Candela. Lifetime LT of bottom emission device is measured at ambient conditions (20° C.) and 10 mA/cm$^2$, using a Keithley 2400 sourcemeter, and recorded in hours. Lifetime LT of top emission device is measured at ambient conditions (20° C.) and 8 mA/cm$^2$. The brightness of the device is measured using a calibrated photo diode. The lifetime LT is defined as the time till the brightness of the device is reduced to 97% of its initial value.

In bottom emission devices, the emission is predominately Lambertian and quantified in percent external quantum efficiency (EQE). To determine the efficiency EQE in % the light output of the device is measured using a calibrated photodiode at 10 mA/cm$^2$.

In top emission devices, the emission is forward directed, non-Lambertian and also highly dependent on the mircocavity. Therefore, the efficiency EQE will be higher compared to bottom emission devices. To determine the efficiency EQE in % the light output of the de-vice is measured using a calibrated photodiode at 10 mA/cm$^2$.

Technical Effect of the Invention

The beneficial effect of the invention on the performance of bottom emission devices can be seen in Table 7, 8 and 9.

In Table 7, results are shown for fluorescent blue devices with a first electron transport layer comprising of a first organic aromatic matrix compound, a second electron transport layer comprising of a polar organic aromatic phosphine compound, and an electron injection layer comprising of lithium organic complex LiQ (comparative example 1 to 10 and example 1 to 4) or Yb (comparative example 11 to 13 and example 4).

In comparative example 1, the first and second electron transport layer comprise of polar organic aromatic phosphine oxide A26. The dipole moment of A26 is 2.68 eV, the reduction potential is −2.2 V and the LUMO is −2.64 eV. The operating voltage is 4.9 V and the external quantum efficiency EQE is 5.5%. The lifetime has not been measured as the efficiency is quite low. In comparative example 2, the first and second electron transport layers comprise a different polar phosphine oxide compound. A18 is used instead of A26. The dipole moment of A18 is 4.64 eV, the reduction potential is −2.62 V and the LUMO is −2.22 eV. The performance is even worse, as the operating voltage is slightly higher and the efficiency is reduced.

In comparative example 3, the first electron transport layer comprises polar organic aromatic phosphine compound A26 and the second electron transport layer comprises a mixture of polar organic aromatic phosphine compounds A26 and A18. No improvement in operating voltage or efficiency is observed.

In comparative example 4, the first electron transport layer comprises polar phenanthroline compound PHEN-1, see structure below. PHEN-1 has a dipole moment of approx. 3.6 Debye, a reduction potential of −2.29 V and a LUMO of −2.55 eV.

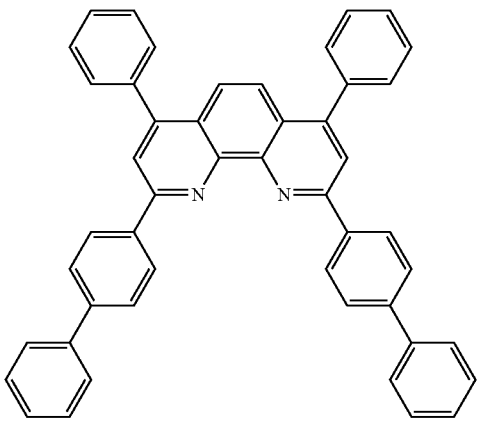

PHEN-1

The second electron transport layer comprises a mixture of polar phenanthroline compound PHEN-1 and polar organic aromatic phosphine compound A18. A small improvement in efficiency and reduction in operating voltage are observed.

In comparative example 5, the first and second electron transport layer comprise first organic aromatic matrix compound ETM1-1. The dipole moment of ETM1-1 is close to 0 Debye, the reduction potential is −2.45 V and the LUMO is −2.55 eV. The efficiency is low 4.6% and the operating voltage is high at 7.4 V.

In comparative example 6, the first electron transport layer comprises non-polar ETM1-1 and the second electron transport layer comprises polar phosphine compound A18. No improvement in efficiency or operating voltage is observed.

In example 1, the first electron transport layer comprises non-polar ETM1-1 and the second electron transport layer comprises a mixture of non-polar ETM1-1 and polar phosphine compound A18. The efficiency is improved substantially to 7.1% EQE and the operating voltage is very low at 4.3 V. The lifetime is dramatically improved to 119 hours, compared to 15 and 32 hours for comparative examples 3 and 4. In summary, a substantial benefit is observed for an electron transport layer stack according to the present invention.

In example 2, the first electron transport layer comprises non-polar triazine compound ETM1-32 and the second electron transport layer comprises polar phosphine compound A18. Triazine compound ETM1-32 has a dipole moment of 1.03 Debye, a reduction potential of −2.22 V and a LUMO of −2.62 V. Again the efficiency is very high at 7.2% EQE and the operating voltage is comparatively low at 4.5 V. The lifetime is good at 83 hours. All performance parameters are improved over comparative example 7 to 9 which do not contain a mixture of non-polar and polar matrix compound in the second electron transport layer.

In example 3, the first electron transport layer comprises non-polar dibenzo[c,h]acridine compound ETM1-15 and polar phosphine compound A18. Dibenzo[c,h]acridine compound ETM1-15 has a dipole moment of 1.8 Debye, a reduction potential of −2.26 V and a LUMO of −2.58 eV. Efficiency and operating voltage are improved over comparative example 10, which does not contain a mixture of matrix compounds in the second electron transport layer.

In example 4, the first electron transport layer comprises non-polar triazine compound ETM1-32 and the second electron transport layer comprises polar phosphine compound A18. The electron injection layer comprises 2 nm Yb. Again the efficiency is very high at 6.9% EQE and the operating voltage is comparatively low at 4.7 V. The lifetime is good at 59 hours. All performance parameters are improved over comparative example 11 to 13 which do not contain a mixture of non-polar and polar matrix compound in the second electron transport layer.

In Table 8, results are shown for fluorescent blue bottom emission devices with a first electron transport layer comprising a first organic aromatic matrix compound and a second electron transport layer comprising a first and second matrix compound and a non-emitter dopant selected from lithium organic complex Li-1. Comparative examples 14 to 18 and examples 5 and 6 do not contain an electron injection layer. Comparative examples 19 and 20 and example 7 contain an electron injection layer formed from 1.5 nm LiQ. Comparative examples 21 and 22 and example 8 contain an electron injection layer formed from 2 nm Yb.

In comparative example 14, the first electron transport layer comprises polar phenanthroline compound PHEN-1 and the second electron transport layer comprises a mixture of PHEN-1, polar phosphine compound A18 and lithium organic complex Li-1. The efficiency is 6.4% EQE and the operating voltage is 5 V. The lifetime is very short at 15 hours.

In comparative example 15, the first electron transport layer comprising non-polar dibenzo[c,h]acridine compound ETM1-15 and the second electron transport layer comprises ETM1-15 and Li-1. The efficiency is reduced to 5.7% EQE and the operating voltage is increased to 6.6 V.

In comparative example 16, the first electron transport layer comprising non-polar dibenzo[c,h]acridine compound ETM1-15 and the second electron transport layer comprises polar phosphine compound A18 and Li-1. The efficiency is increased to 6.3% EQE and the operating voltage is reduced to 3.7 V.

In example 5, the first electron transport layer comprising non-polar dibenzo[c,h]acridine compound ETM1-15 and the second electron transport layer comprises a mixture of ETM1-15, polar phosphine compound A18 and Li-1. The efficiency is increased to 7% EQE and the operating voltage is still low at 4 V. The lifetime is 30 hours. All performance parameters are improved over comparative examples 14 to 16.

In example 6, the first electron transport layer comprising non-polar triazine compound ETM1-32 and the second electron transport layer comprises a mixture of ETM1-32, polar phosphine compound A18 and Li-1. The efficiency is substantially increased to 9.9% EQE and the operating voltage is still low at 4.6 V. The lifetime is 21 hours. Efficiency and lifetime are improved over comparative examples 14 to 18.

In comparative example 19, the first and second electron transport layer comprise the same matrix non-polar triazine matrix compound ETM1-32. The second electron transport layer additionally comprises Li-1. LiQ is used as electron injection layer. The efficiency is still high at 7.3% EQE but the operating voltage is also high at 6.2 V.

In comparative example 20, the first electron transport layer comprises non-polar triazine compound ETM1-32 and the second electron transport layer comprises polar phosphine compound A18 and Li-1. The efficiency is still high at 7.6% EQE and the operating voltage is reduced compared to example 5, but this comes at the expense of having to deposit an additional layer compared to example 5.

In example 7, the same ETL-stack is used as in example 6 but additionally the devices contain an electron injection layer comprising LiQ. The efficiency remains very high at 10% EQE, while the operating voltage is reduced to 4.4 V, thereby demonstrating the beneficial effect of an EIL on the operating voltage.

In example 8, the same ETL-stack is used as in example 6 and 7 but additionally the devices contain an electron injection layer comprising Yb. The efficiency is still high at 9.7% EQE and the voltage is further improved to 4.3 V. The lifetime is unaffected. In particular, the efficiency is improved compared to comparative examples 14 to 22.

In summary, very high efficiency and good lifetime can be obtained with the ETL-stack according to the present invention. If a further reduction in operating voltage is desired, this can be achieved with an electron injection layer. However, even without electron injection layer the operating voltage is within the range suitable for mass production of devices.

In Table 9, results are shown for fluorescent blue bottom emission devices comprising a first electron transport layer comprising a first organic aromatic matrix compound and a second electron transport layer comprising a mixture of first organic aromatic matrix compound, polar organic aromatic phosphine compound and a non-emitter dopant selected from zero-valent ytterbium metal.

Comparative examples 23 to 25 and example 9 do not contain an electron injection layer. Comparative example 26 and 27 and example 10 contain an electron injection layer formed from 1.5 nm LiQ. Comparative examples 28 and 29 and example 11 contain an electron injection layer formed from 2 nm Yb.

In comparative example 23, the first electron transport layer comprises polar phenanthroline compound PHEN-2 and the second electron transport layer comprises a mixture of PHEN-2, polar phosphine compound A18 and 2.5 wt.-% Yb. The dipole moment of PHEN-2 is 2.53 Debye, the reduction potential is −2.45 V and the LUMO is −2.39 eV. The efficiency is 5.7% EQE and the operating voltage is 3.3 V.

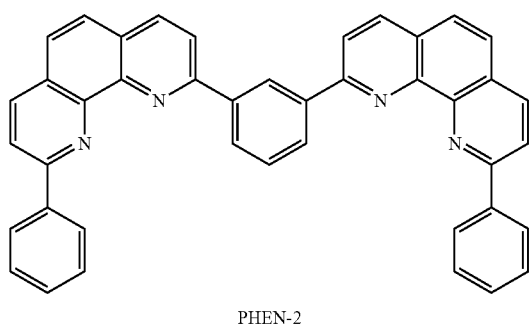 [SMILES: c1ccc(-c2ccc3ccc4ccc(-c5cccc(-c6ccc7ccc8ccc(-c9ccccc9)nc8c7n6)c5)nc4c3n2)cc1]

PHEN-2

In comparative example 24, the first and second electron transport layers comprise non-polar dibenzo[c,h]acridine compound ETM1-15. The second electron transport layer additionally comprises 5 wt.-% Yb. The efficiency is reduced compared to comparative example 23 and the operating voltage is dramatically increased.

In comparative example 25, the first electron transport layer comprises non-polar dibenzo[c,h]acridine compound ETM1-15 and the second electron transport layer comprises polar phosphine compound A18 and 5 wt.-% Yb. The efficiency is increased to 6.5% EQE and the operating voltage is very low at 3.4 V.

In example 9, the first electron transport layer comprises non-polar dibenzo[c,h]acridine compound ETM1-15 and the second electron transport layer comprises a mixture of ETM1-15, polar phosphine compound A18 and 2.5 wt.-% Yb. The efficiency is substantially increased to 8.5% EQE and the operating voltage is still very low at 3.6 V. The lifetime is 32 hours. In particular, the efficiency is improved over comparative examples 23 to 25.

In example 10, the ETL-stack is the same as in example 9 but the devices contain additionally an electron injection layer formed from 1.5 nm LiQ. Efficiency and operating voltage are unchanged compared to example 9. Performance is improved over comparative examples 26 and 27 which do not contain the mixture of matrix compounds in the second electron transport layer.

In example 11, the same ETL-stack is used as in example 9 and 10. Efficiency, operating voltage and lifetime are unchanged compared to example 9 and 10.

In summary, when the second electron transport layer comprises a non-emitter dopant selected from zero-valent metal, high performance can be achieved even without an electron injection layer.

A substantial time saving is achieved if no electron injection layer has to be deposited.

Another aspect is directed to an organic light-emitting diode (OLED) comprising more than one emission layer (EML) 150, for example two, three or four emission layers may be present. An organic light-emitting diode (OLED) comprising more than one emission layer is also described as a tandem OLED or stacked OLED.

Another aspect is directed to a device comprising at least one organic light-emitting diode (OLED). A device comprising organic light-emitting diodes (OLED) is for example a display or a lighting panel.

TABLE 7

Bottom emission device comprising an emission layer and an ETL-stack comprising a first and second electron transport layer and an electron injection layer

| | ETL1 | d (ETL1)/ nm | ETL2 | wt.-% ETM1 | wt.-% ETM2 | d (ETL2)/ nm | EIL | d (EIL)/ nm | U at 10 mA/cm$^2$/V | EQE*$^2$/% | LT/h |
|---|---|---|---|---|---|---|---|---|---|---|---|
| Comparative example 1 | A26 | 6 | A26 | 100 | 0 | 31 | LiQ | 1.5 | 4.9 | 5.5 | na |
| Comparative example 2 | A18 | 6 | A18 | 100 | 0 | 31 | LiQ | 1.5 | 5.1 | 5.3 | na |
| Comparative example 3 | A26 | 6 | A26:A18 | 80 | 20 | 31 | LiQ | 1.5 | 5.1 | 5.6 | 15 |
| Comparative example 4 | PHEN-1 | 4 | PHEN-1:A18 | 80 | 20 | 31 | LiQ | 1.5 | 4 | 6.4 | 32 |
| Comparative example 5 | ETM1-1 | 6 | ETM1-1 | 100 | 0 | 31 | LiQ | 1.5 | 7.4 | 4.6 | na |
| Comparative example 6 | ETM1-1 | 6 | A18 | 0 | 100 | 31 | LiQ | 1.5 | 5.6 | 5.2 | na |
| Example 1 | ETM1-1 | 6 | ETM1-1:A18 | 80 | 20 | 31 | LiQ | 1.5 | 4.3 | 7.1 | 119 |
| Comparative example 7 | A18 | 6 | A18 | 100 | 0 | 31 | LiQ | 1.5 | 5.5 | 4.3 | na |
| Comparative example 8 | ETM1-32 | 6 | ETM1-32 | 100 | 0 | 31 | LiQ | 1.5 | 6.8 | 6.6 | na |
| Comparative example 9 | ETM1-32 | 6 | A18 | 0 | 100 | 31 | LiQ | 1.5 | 5.9 | 5.3 | na |
| Example 2 | ETM1-32 | 6 | ETM1-32:A18 | 80 | 20 | 31 | LiQ | 1.5 | 4.5 | 7.2 | 83 |
| Comparative example 10 | ETM1-15 | 6 | A18 | 0 | 100 | 31 | LiQ | 1.5 | 5.5 | 4.3 | na |
| Example 3 | ETM1-15 | 6 | ETM1-15:A18 | 80 | 20 | 31 | LiQ | 1.5 | 4.3 | 6.6 | 45 |
| Comparative example 11 | A18 | 6 | A18 | 100 | 0 | 31 | Yb | 2 | 5.1 | 4.9 | na |
| Comparative example 12 | ETM1-32 | 6 | ETM1-32 | 100 | 0 | 31 | Yb | 2 | 7.9 | 6 | na |
| Comparative example 13 | ETM1-32 | 6 | A18 | 0 | 100 | 31 | Yb | 2 | 5.9 | 5.2 | na |
| Example 4 | ETM1-32 | 6 | ETM1-32:A18 | 80 | 20 | 31 | Yb | 2 | 4.7 | 6.9 | 59 |

TABLE 8

Bottom emission device comprising an emission layer and an ETL-stack comprising a first and second electron transport layer and an optional electron injection layer. The second electron transport layer comprises alkali organic complex Li-1

|  | ETL1 | d (ETL1)/ nm | ETL2 | wt.-% ETM1 | wt.-% ETM2 | wt.-% Li organic complex | d (ETL2)/ nm | EIL | d (EIL)/ nm | U at 10 mA/cm$^2$/V | EQE*$^2$/% | LT/h |
|---|---|---|---|---|---|---|---|---|---|---|---|---|
| Comparative example 14 | PHEN-1 | 4 | PHEN-1:A18:Li-1 | 50 | 35 | 15 | 31 | na | 0 | 5 | 6.4 | 15 |
| Comparative example 15 | ETM1-15 | 6 | ETM1-15:Li-1 | 70 | 0 | 30 | 31 | na | 0 | 6.6 | 5.7 | na |
| Comparative example 16 | ETM1-15 | 6 | A18:Li-1 | 0 | 70 | 30 | 31 | na | 0 | 3.7 | 6.3 | na |
| Example 5 | ETM1-15 | 6 | ETM1-15:A18:Li-1 | 50 | 20 | 30 | 31 | na | 0 | 4 | 7 | 30 |
| Comparative example 17 | ETM1-32 | 5 | ETM1-32:Li-1 | 70 | 0 | 30 | 31 | na | 0 | 8 | 5.9 | na |
| Comparative example 18 | ETM1-32 | 5 | A18:Li-1 | 0 | 70 | 30 | 31 | na | 0 | 3.8 | 7.5 | na |
| Example 6 | ETM1-32 | 5 | ETM1-32:A18:Li-1 | 50 | 20 | 30 | 31 | na | 0 | 4.6 | 9.9 | 21 |
| Comparative example 19 | ETM1-32 | 5 | ETM1-32:Li-1 | 70 | 0 | 30 | 31 | LiQ | 1.5 | 6.2 | 7.3 | na |
| Comparative example 20 | ETM1-32 | 5 | A18:Li-1 | 0 | 70 | 30 | 31 | LiQ | 1.5 | 3.75 | 7.6 | na |
| Example 7 | ETM1-32 | 5 | ETM1-32:A18:Li-1 | 50 | 20 | 30 | 31 | LiQ | 1.5 | 4.4 | 10 | na |
| Comparative example 21 | ETM1-32 | 5 | ETM1-32:Li-1 | 70 | 0 | 30 | 31 | Yb | 2 | 5.85 | 7.4 | na |
| Comparative example 22 | ETM1-32 | 5 | A18:Li-1 | 0 | 70 | 30 | 31 | Yb | 2 | 3.7 | 7.4 | na |
| Example 8 | ETM1-32 | 5 | ETM1-32:A18:Li-1 | 50 | 20 | 30 | 31 | Yb | 2 | 4.3 | 9.7 | 22 |

TABLE 9

Bottom emission device comprising an emission layer and an ETL-stack comprising a first and second electron transport layer and an optional electron injection layer. The second electron transport layer comprises a zero-valent metal

|  | ETL1 | d (ETL1)/ nm | ETL2 | wt.-% ETM1 | wt.-% ETM2 | wt.-% metal | d (ETL2)/ nm | EIL | d (EIL)/ nm | U at 10 mA/cm$^2$/V | EQE*$^2$/% | LT/h |
|---|---|---|---|---|---|---|---|---|---|---|---|---|
| Comparative example 23 | PHEN-2 | 5 | PHEN-2:A18:Yb | 50 | 47.5 | 2.5 | 29 | na | 0 | 3.3 | 5.7 | na |
| Comparative example 24 | ETM1-15 | 5 | ETM1-15:Yb | 95 | 0 | 5 | 31 | na | 0 | 7.1 | 4 | na |
| Comparative example 25 | ETM1-15 | 5 | A18:Yb | 0 | 95 | 5 | 31 | na | 0 | 3.4 | 6.5 | na |
| Example 9 | ETM1-15 | 5 | ETM1-15:A18:Yb | 50 | 47.5 | 2.5 | 31 | na | 0 | 3.6 | 8.5 | 32 |
| Comparative example 26 | ETM1-15 | 5 | ETM1-15:Yb | 95 | 0 | 5 | 31 | LiQ | 1.5 | 6.7 | 4.2 | na |
| Comparative example 27 | ETM1-15 | 5 | A18:Yb | 0 | 95 | 5 | 31 | LiQ | 1.5 | 3.4 | 6.5 | na |
| Example 10 | ETM1-15 | 5 | ETM1-15:A18:Yb | 50 | 47.5 | 2.5 | 31 | LiQ | 1.5 | 3.6 | 8.5 | na |
| Comparative example 28 | ETM1-15 | 5 | ETM1-15:Yb | 95 | 0 | 5 | 31 | Yb | 2 | 6.7 | 4.1 | na |
| Comparative example 29 | ETM1-15 | 5 | A18:Yb | 0 | 95 | 5 | 31 | Yb | 2 | 3.4 | 6.5 | na |
| Example 11 | ETM1-15 | 5 | ETM1-15:A18:Yb | 50 | 47.5 | 2.5 | 31 | Yb | 2 | 3.6 | 8.4 | 31 |

From the foregoing detailed description and examples, it will be evident that modifications and variations can be made to the compositions and methods of the invention without departing from the spirit and scope of the invention. Therefore, it is intended that all modifications made to the invention without departing from the spirit and scope of the invention come within the scope of the appended claims.

What is claimed is:

1. An organic light emitting diode (OLED) comprising:
   at least one anode electrode;
   at least one emission layer, wherein the emission layer comprises at least one emitter dopant that emits visible light at operation of the OLED;
   an electron transport layer stack of at least two electron transport layers, and wherein a) the first electron transport layer comprises i) a first organic aromatic matrix compound having a molar mass (MW) of about ≥400 to about ≤1000 and a dipole moment of about ≥0 Debye and about ≤2.5 Debye, wherein the first electron transport layer is free of a polar organic aromatic phosphine compound; and
   b) the second electron transport layer comprises two organic aromatic matrix compounds, which are a mixture of:
      i) the first organic aromatic matrix compound; and
      ii) a polar organic aromatic phosphine compound having a MW of about ≥400 to about ≤1000, and a dipole moment of about >2.5 Debye and about ≤10 Debye; and at least one cathode electrode layer; wherein
the electron transport layer stack is arranged between the emission layer and the cathode electrode layer, the first electron transport layer is in direct contact with the second electron transport layer, and wherein the first electron transport layer is arranged nearer to the emission layer and the second electron transport layer is arranged nearer to the cathode electrode layer;
the first organic aromatic matrix compound of the first electron transport layer and the first organic aromatic matrix compound of the second electron transport layer are selected the same compound.

2. The organic light emitting diode according to claim 1, wherein the electron transport layer stack is free of an emitter dopant which emits visible light at operation of the OLED.

3. The organic light emitting diode according to claim 1, wherein the first electron transport layer is free of a non-emitter dopant and the second electron transport layer comprises a non-emitter dopant, wherein the non-emitter dopant is a metal compound.

4. The organic light emitting diode according to claim 1, wherein the organic light emitting diode further comprises an electron injection layer, wherein the electron injection layer comprises a metal compound; and
wherein the electron injection layer is sandwiched between the electron transport layer stack and the cathode electrode layer.

5. The organic light emitting diode according to claim 3, wherein the zero-valent metal is selected from the group comprising alkali metal, alkaline earth metal, rare earth metal and/or a group 3 transition metal.

6. The organic light emitting diode according to claim 1, wherein the polar organic aromatic phosphine compound of the second electron transport layer having the Formula Ia:

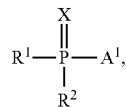

Formula (Ia)

wherein:
X is selected from O, S, or Se;
$R^1$ and $R^2$ are independently selected from $C_1$ to $C_{12}$ alkyl, substituted or unsubstituted $C_6$ to $C_{20}$ aryl or substituted or unsubstituted $C_5$ to $C_{20}$ heteroaryl; or $R^1$ and $R^2$ are bridged with an alkene-di-yl group forming with the P atom a substituted or unsubstituted five, six or seven membered ring; and
$A^1$ is phenyl or selected from Formula (II):

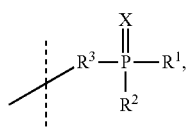

Formula (II)

wherein
$R^3$ is selected from $C_1$ to $C_8$ alkane-di-yl, substituted or unsubstituted $C_6$ to $C_{20}$ arylene, or substituted or unsubstituted $C_5$ to $C_{20}$ heteroarylene; or $A^1$ is selected from Formula (III)

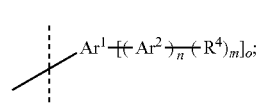

Formula (III)

wherein
n is selected from 0 or 1;
m is selected from 1 or 2;
o is selected from 1 or 2;
and m is 1 if o is 2;
$Ar^1$ is selected from substituted or unsubstituted $C_6$ to $C_{20}$ arylene and substituted or unsubstituted $C_5$ to $C_{20}$ heteroarylene;
$Ar^2$ is selected from substituted or unsubstituted $C_{18}$ to $C_{40}$ arylene and substituted or unsubstituted $C_{10}$ to $C_{40}$ heteroarylene;
$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl.

7. The organic light emitting diode according to claim 6, wherein
$Ar^1$ is selected from substituted $C_6$ to $C_{20}$ arylene, and/or substituted $C_5$ to $C_{20}$ heteroarylene, wherein the $C_6$ to $C_{20}$ arylene, and/or $C_5$ to $C_{20}$ heteroarylene is substituted with at least one $C_1$ to $C_{12}$ alkyl and/or at least one $C_1$ to $C_{12}$ heteroalkyl group;
$Ar^2$ is selected from substituted $C_{18}$ to $C_{40}$ arylene and/or substituted $C_{10}$ to $C_{40}$ heteroarylene, wherein the $C_{18}$ to $C_{40}$ arylene and/or $C_{10}$ to $C_{40}$ heteroarylene is substituted with at least one $C_1$ to $C_{12}$ alkyl and/or at least one $C_1$ to $C_{12}$ heteroalkyl group; and.

8. The organic light emitting diode according to claim 6, wherein
$R^1$ and $R^2$ are independently selected from substituted $C_6$ to $C_{20}$ aryl, or substituted $C_5$ to $C_{20}$ heteroaryl, wherein the $C_6$ to $C_{20}$ aryl, and/or $C_5$ to $C_{20}$ heteroaryl is substituted with at least one $C_1$ to $C_{12}$ alkyl and/or at least one $C_1$ to $C_{12}$ heteroalkyl group; and/or
$R^3$ is independently selected from substituted $C_6$ to $C_{20}$ arylene, or substituted $C_5$ to $C_{20}$ heteroarylene, wherein the $C_6$ to $C_{20}$ arylene, and/or $C_5$ to $C_{20}$ heteroarylene is substituted with at least one $C_1$ to $C_{12}$ alkyl and/or at least one $C_1$ to $C_{12}$ heteroalkyl group; and/or
$R^4$ is independently selected from substituted $C_6$ to $C_{20}$ aryl, or substituted $C_5$ to $C_{20}$ heteroaryl, wherein the $C_6$ to $C_{20}$ aryl, and/or $C_5$ to $C_{20}$ heteroaryl is substituted with at least one $C_1$ to $C_{12}$ alkyl and/or at least one $C_1$ to $C_{12}$ heteroalkyl group.

9. The organic light emitting diode according to claim 6, wherein for
o=2, the polar organic aromatic phosphine compound is a compound having the Formula Ib:

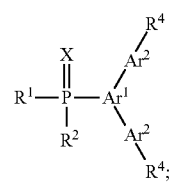

(Ib)

or
o=1, the polar organic aromatic phosphine compound is a compound having the Formula Ic, Id, Ie or If:

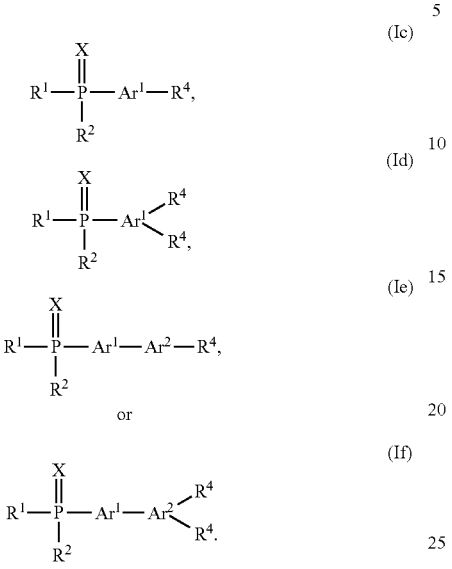

(Ic)

(Id)

(Ie)

or (If)

10. The organic light emitting diode according to claim 6, wherein
R$^1$ and R$^2$ is independently selected from C$_1$ to C$_4$ alkyl, unsubstituted or substituted C$_6$ to C$_{10}$ aryl, or unsubstituted or substituted C$_5$ to C$_{10}$ heteroaryl, wherein the C$_6$ to C$_{10}$ aryl, and/or C$_5$ to C$_{10}$ heteroaryl is substituted with at least one C$_1$ to C$_{12}$ alkyl and/or at least one C$_1$ to C$_{12}$ heteroalkyl group;
X is O or S;
R$^3$ is selected from C$_1$ to C$_6$ alkane-di-yl, unsubstituted or substituted C$_6$ to C$_{10}$ arylene or unsubstituted or substituted C$_5$ to C$_{10}$ heteroarylene;
R$^4$ is selected from H, phenyl, biphenyl, terphenyl, fluorenyl, naphthyl, anthranyl, phenanthryl, pyrenyl, carbazoyl, dibenzofuranyl, dinapthofuranyl;
n is 0, 1 or 2;
m is 1 or 2 and n is 0 or 1, or m is 2 and n is 2;
Ar$^1$ is selected from phenylene, biphenylene, terphenylene, naphthylene, fluorenylene, pyridylene, quinolinylene, and pyrimidinylene; and
Ar$^2$ is selected from fluorenylene, anthranylene, pyrenylene, phenanthrylene, carbazoylene, benzo[c]acridinylene, dibenzo[c,h]acridinylene, dibenzo[a,j]acridinylene.

11. The organic light emitting diode according to claim 6, wherein R$^1$, R$^2$, R$^3$, R$^4$, Ar$^1$ and/or Ar$^2$ are unsubstituted.

12. The organic light emitting diode according to claim 6, wherein Ar$^2$ is selected from a substituent according to Formula IVa to IVh:

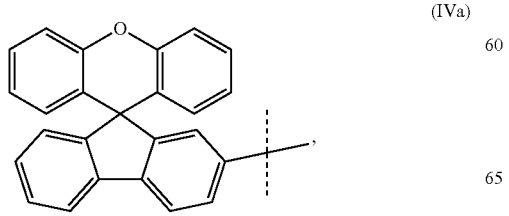

(IVa)

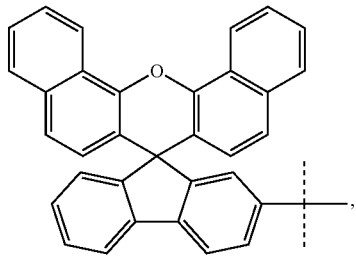

(IVb)

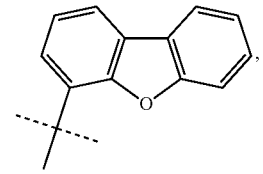

(IVc)

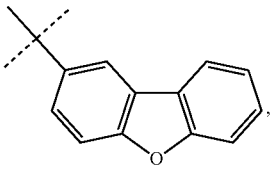

(IVd)

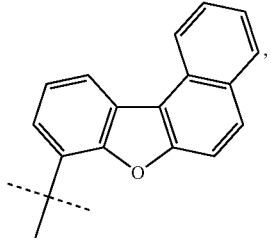

(IVe)

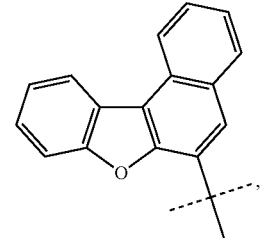

(IVf)

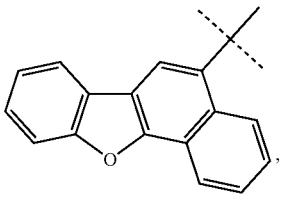

(IVg)

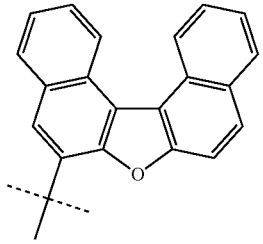

(IVh)

13. The organic light emitting diode according to claim 6, wherein the polar organic aromatic phosphine compound is selected from a compound according to Formula A1 to A27:
(A1)
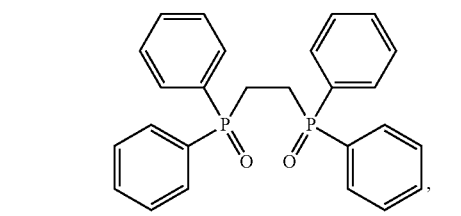
(A2)
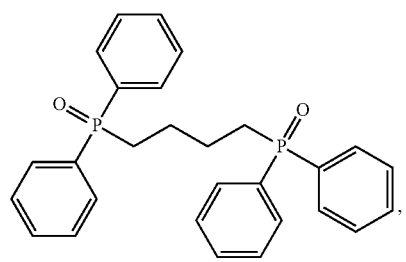
(A3)
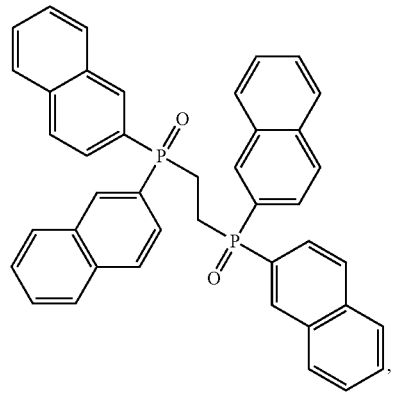
(A4)
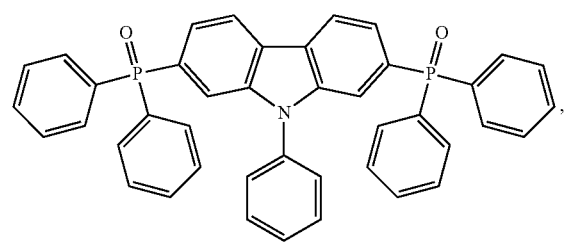
-continued
(A5)
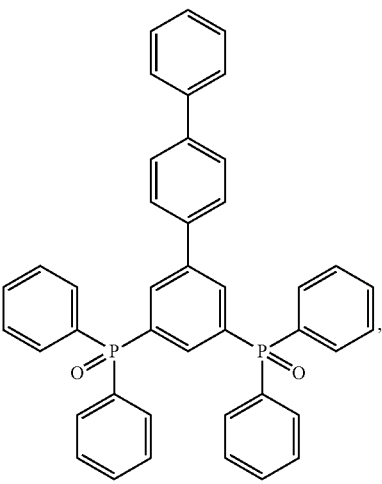
(A6)
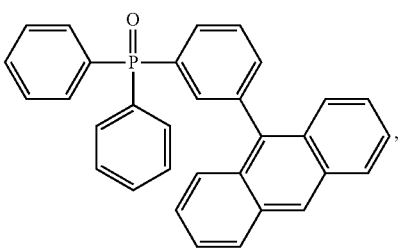
(A7)
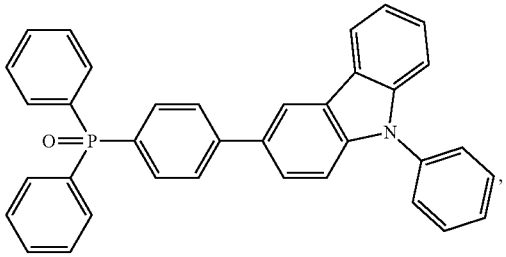
(A8)
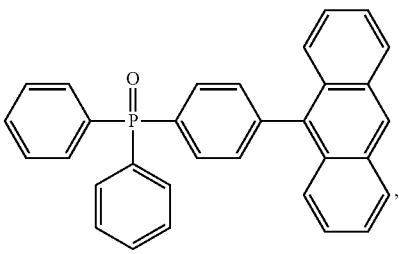
(A9)
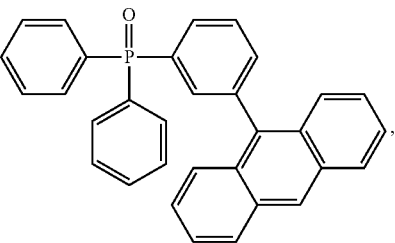

-continued
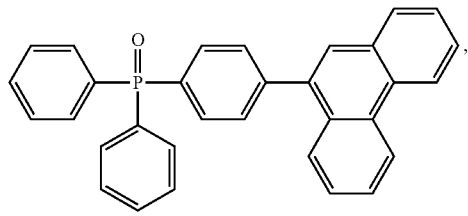
(A10)
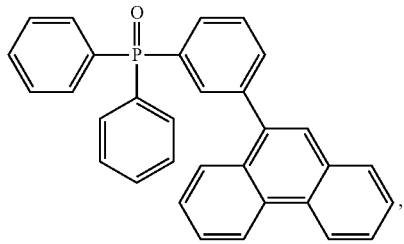
(A11)
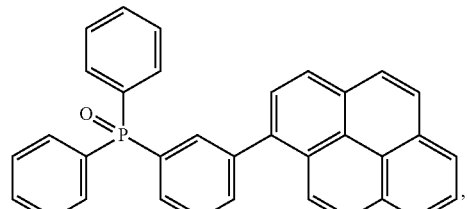
(A12)
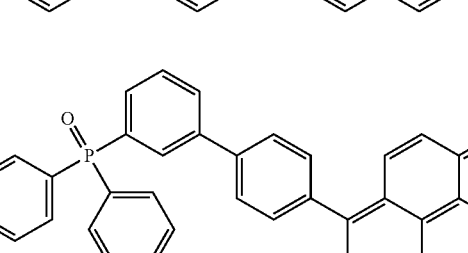
(A13)
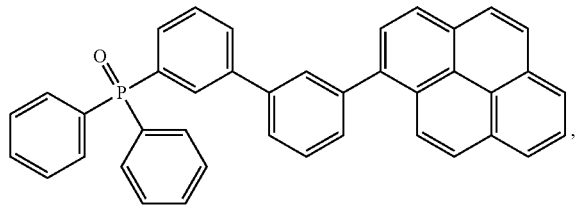
(A14)
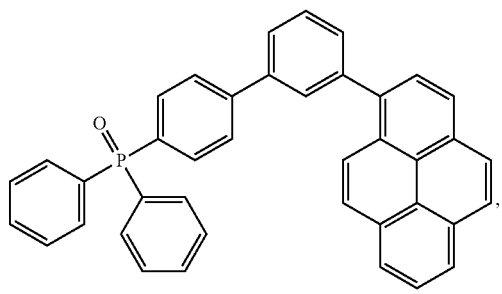
(A15)
-continued
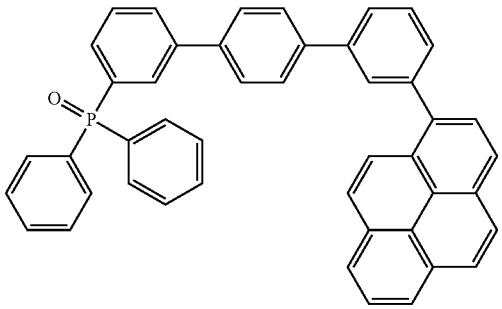
(A16)
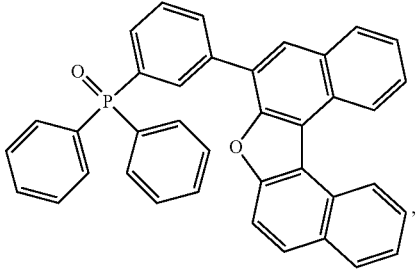
(A17)
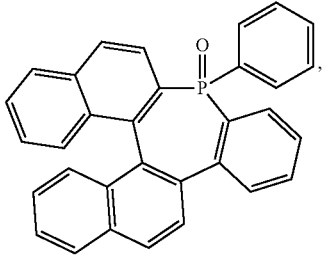
(A18)
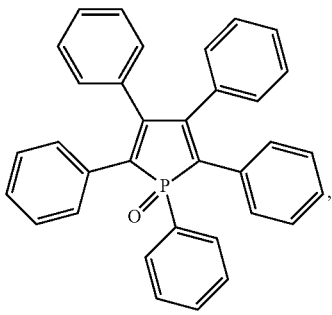
(A19)
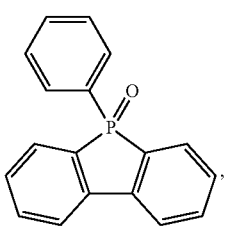
(A20)

-continued
(A21)
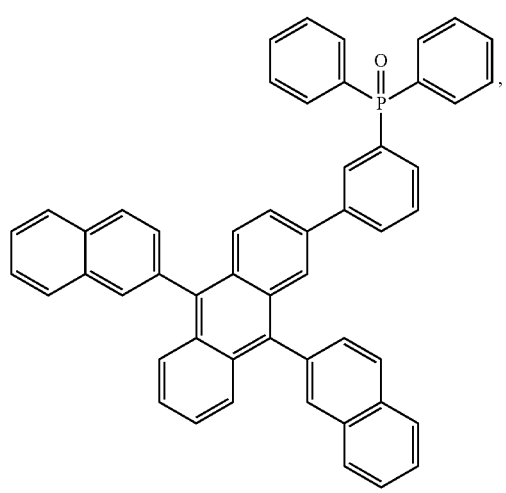
(A22)
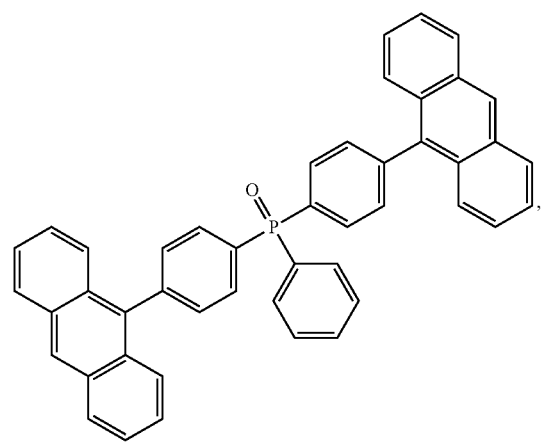
(A23)
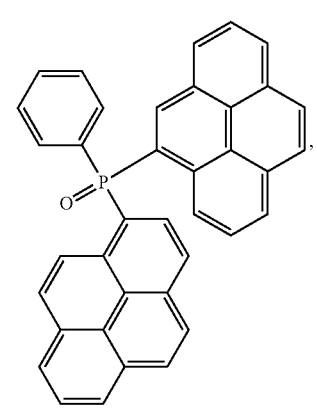
-continued
(A24)
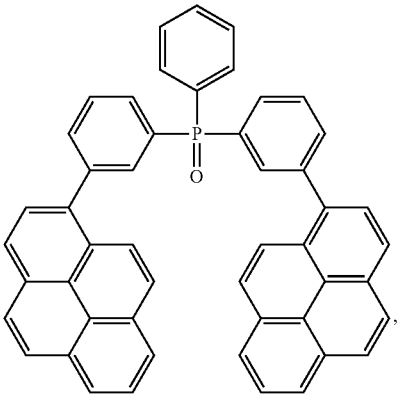
(A25)
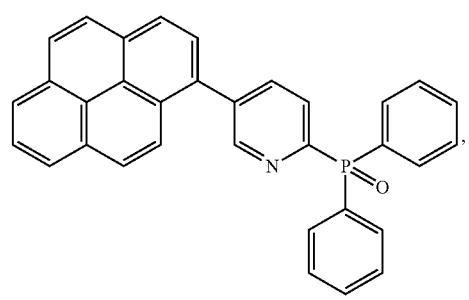
(A26)
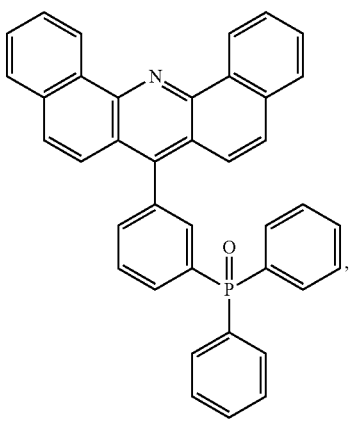
(A27)
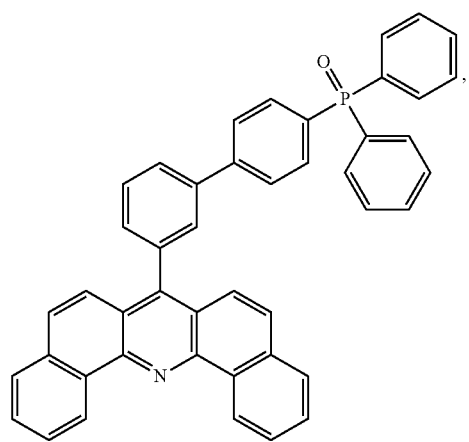

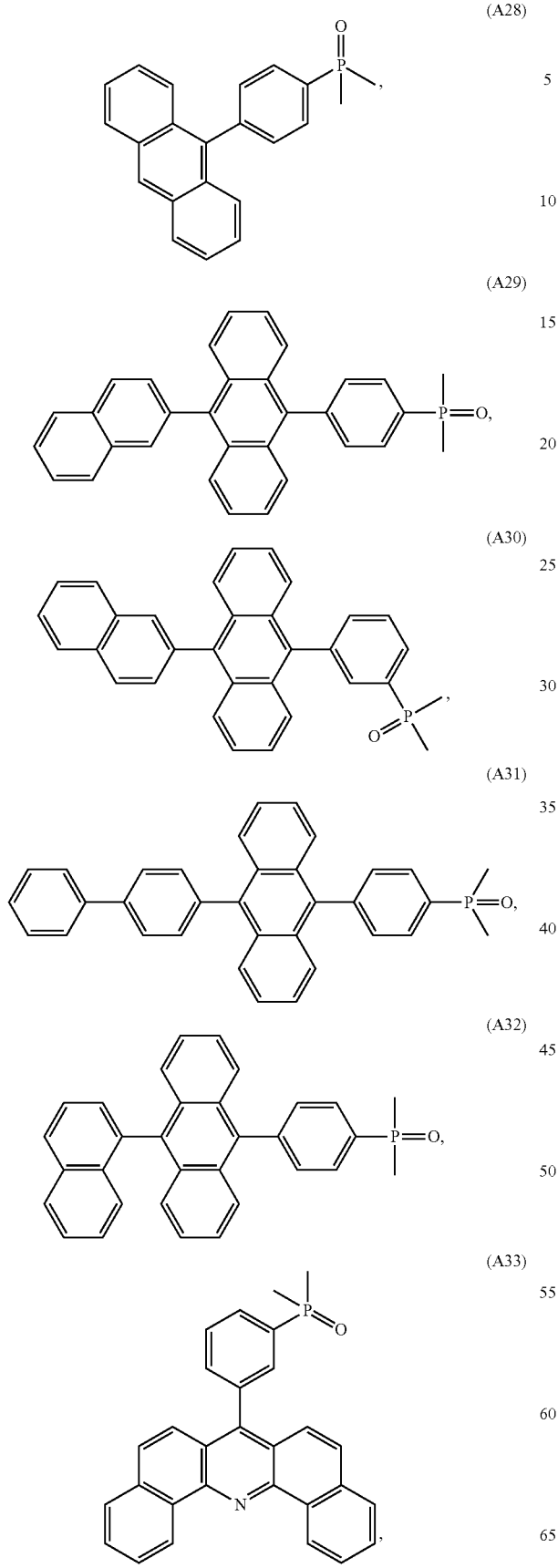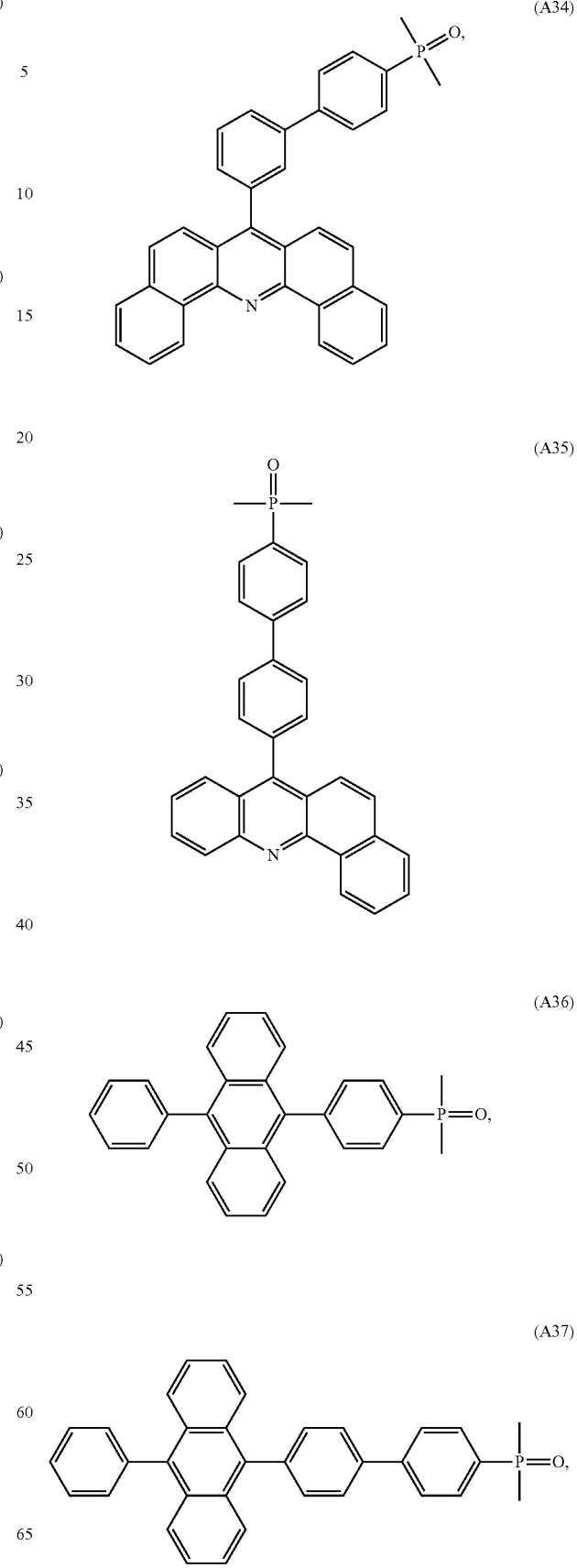

-continued (A38)
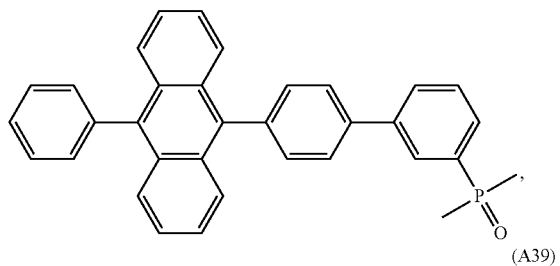

(A39)
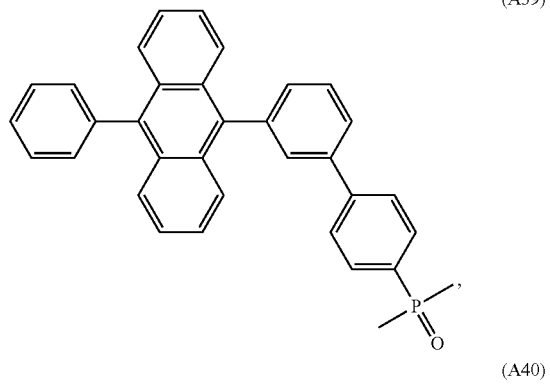

(A40)
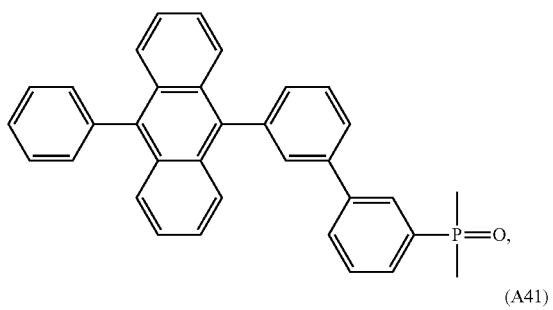

(A41)
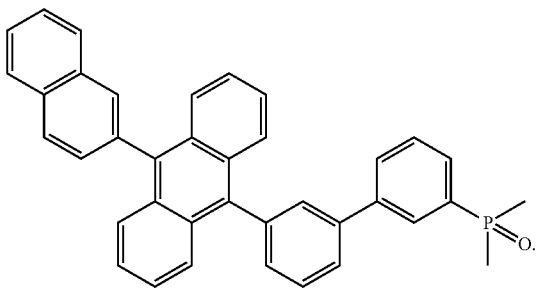

14. A method of manufacturing an organic light emitting diode, according to claim 1, wherein
on a substrate an anode electrode is deposited and on the anode electrode a hole injection layer, a hole transport layer, optional an electron blocking layer, emission layer, optional a hole blocking layer, an electron transport layer stack comprising at least a first electron transport layer and a second electron transport layer, optional an electron injection layer, and a cathode electrode layer, are deposited in that order; or
the layers are deposited in a reverse order, starting with the cathode electrode layer.

15. An electronic device comprising at least one organic light emitting diode, according to claim 1.

16. The organic light emitting diode according to claim 3, wherein the metal compound is selected from the group consisting of a metal halide, a metal organic complex, and a zero-valent metal.

17. The organic light emitting diode according to claim 3, wherein the metal organic complex has the formula VII:

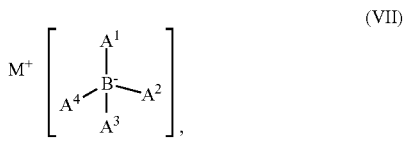

(VII)

wherein M is an alkali metal ion, each of $A^1$-$A^4$ is independently selected from substituted or unsubstituted $C_6$-$C_{20}$ aryl or substituted or unsubstituted $C_2$-$C_{20}$ heteroaryl.

18. The organic light emitting diode according to claim 4, wherein the electron injection layer is arranged in direct contact to the cathode electrode layer.

19. The organic light emitting diode according to claim 5, wherein the zero-valent metal is selected from the group consisting of Li, Na, K, Rb, Cs, Mg, Ca, Sr, Ba, Yb, Sm, Eu, Nd, Tb, Gd, Ce, La, Sc, and Y.

20. The organic light emitting diode according to claim 7, wherein—
$Ar^1$=substituted $C_6$ to $C_{20}$ arylene and/or substituted $C_5$ to $C_{20}$ heteroarylene, wherein the $C_6$ to $C_{20}$ arylene and/or $C_5$ to $C_{20}$ heteroarylene is substituted with at least one $C_1$ to $C_6$ alkyl and/or $C_1$ to $C_6$ heteroalkyl group; and
$Ar^2$=substituted $C_{18}$ to $C_{40}$ arylene and/or substituted $C_{10}$ to $C_{40}$ heteroarylene, wherein the $C_{18}$ to $C_{40}$ arylene and/or $C_{10}$ to $C_{40}$ heteroarylene is substituted with at least one $C_1$ to $C_6$ alkyl and/or $C_1$ to $C_6$ heteroalkyl group.

\* \* \* \* \*

UNITED STATES PATENT AND TRADEMARK OFFICE
CERTIFICATE OF CORRECTION

| | |
|---|---|
| PATENT NO. | : 12,161,044 B2 |
| APPLICATION NO. | : 17/398835 |
| DATED | : December 3, 2024 |
| INVENTOR(S) | : Jerome Ganier, Carsten Rothe and Volodymyr Senkovskyy |

Page 1 of 1

It is certified that error appears in the above-identified patent and that said Letters Patent is hereby corrected as shown below:

In the Claims

Claim 17, Line 1, "claim 3" should be changed to -- claim 16 --.

Signed and Sealed this
Thirty-first Day of December, 2024

Derrick Brent
*Acting Director of the United States Patent and Trademark Office*